US006902862B2

(12) United States Patent
Takahashi et al.

(10) Patent No.: US 6,902,862 B2
(45) Date of Patent: Jun. 7, 2005

(54) RESIST COMPOSITION

(75) Inventors: Hyou Takahashi, Shizuoka (JP);
Kazuyoshi Mizutani, Shizuoka (JP);
Shoichiro Yasunami, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/654,942

(22) Filed: Sep. 5, 2003

(65) Prior Publication Data

US 2004/0058272 A1 Mar. 25, 2004

(30) Foreign Application Priority Data

Sep. 6, 2002 (JP) .......................... 2002-261401

(51) Int. Cl.⁷ .............................. G03F 7/004; G03C 5/00

(52) U.S. Cl. .................... 430/270.1; 430/325; 430/326; 430/914

(58) Field of Search .............................. 430/270.1, 921, 430/914, 325, 326

(56) References Cited

U.S. PATENT DOCUMENTS 5,089,374 A * 2/1992 Saeva ...................... 430/271.1
6,558,871 B1 * 5/2003 Takahashi et al. ....... 430/270.1

FOREIGN PATENT DOCUMENTS

| JP | 10-039500 A | 2/1998 |
| JP | 2968055 B2 | 8/1999 |
| JP | 2001-142200 A | 5/2001 |

* cited by examiner

*Primary Examiner*—Rosemary Ashton
(74) *Attorney, Agent, or Firm*—Sughrue Mion, PLLC

(57) ABSTRACT

A negative type resist composition comprising:

(A1) a compound generating a sulfonic acid upon irradiation with actinic rays or a radiation and having the specific formula, (A2) a compound generating a sulfonic acid upon irradiation with actinic rays or a radiation and having the specific structure, (B) an alkali-soluble resin, and (C) a crosslinking agent capable of carrying out an addition reaction with the alkali-soluble resin which is the component (B) by the action of an acid.

20 Claims, No Drawings

RESIST COMPOSITION

FIELD OF THE INVENTION

The present invention relates to resist compositions suitable for use in ultramicrolithography processes such as the production of ULSIs or high-capacity microchips and in other fabrication processes. More particularly, the invention relates to resist compositions capable of forming a high-resolution pattern especially with electron beams, X-rays, or EUV ray.

BACKGROUND OF THE INVENTION

In processes heretofore in use for producing semiconductor devices such as ICs and LSIs, microfabrication by lithography using a resist composition is being conducted. Recently, with progress in the degree of integration in integrated circuits, formation of ultrafine patterns in the submicron or quarter-micron region has come to be required. With this trend, the exposure light wavelengths also tend to become shorter, i.e., the exposure light is shifting from g-line to i-line and further to KrF excimer laser light. Currently, lithographic techniques employing electron beams, X-rays, or EUV ray besides excimer laser lights are being developed.

In particular, electron-beam lithography is regarded as a next-generation or next-to-next-generation technology for pattern formation, and there is a desire for a resist having high sensitivity and high resolution.

From the standpoint of sensitivity enhancement, chemical amplification type resists mainly utilizing an acid-catalyzed reaction are used as resists suitable for such electron-beam or X-ray lithographic processes.

Various investigations have hitherto been made in order to improve the performance of chemical amplification type resists. Especially from the standpoint of acid generators, the following investigations have been made. For example, patent document 1 (Japanese Patent No. 2,968,055) discloses a trifluoromethanesulfonate compound having a phenolic hydroxy group, patent document 2 (JP-A-2001-142200) discloses a specific benzenesulfonate compound having a phenolic hydroxy group, and patent document 3 (JP-A-10-39500) discloses a polyvalent arylsulfonium compound.

However, none of these techniques of the related art simultaneously satisfies beam shape reproducibility, resolution, and line-and-space pattern profile rectangularity. Beam shape reproducibility is an important property for forming a desired pattern shape. In particular, the ability to reproduce the pattern shape of bent parts in drawing a bent line pattern is important from the standpoint of later processing (ultramicrofabrication of the substrate).

[Patent Document 1]
Japanese Patent No. 2,968,055
[Patent Document 2]
JP-A-2001-142200
[Patent Document 3]
JP-A-10-39500

SUMMARY OF THE INVENTION

An object of the invention is to provide resist compositions which satisfy all of satisfactory beam shape reproducibility, resolution, and line-and-space pattern profile rectangularity in microfabrication for semiconductor device production using actinic rays or a radiation, in particular, electron beams, X-rays, or EUV ray.

The present inventors made intensive investigations in order to accomplish that object and, as a result, have achieved the invention. The invention has the following constitutions.

(1) A negative type resist composition comprising:

(A1) a compound generating a sulfonic acid upon irradiation with actinic rays or a radiation and having a partial structure represented by the following formula (1) and a counter anion, (A2) a compound generating a sulfonic acid upon irradiation with actinic rays or a radiation and having a partial structure represented by the following formula (I), (II), or (III) and a counter anion, (B) an alkali-soluble resin, and (C) a crosslinking agent capable of carrying out an addition reaction with the alkali-soluble resin which is the component (B) by the action of an acid, wherein the counter anion in the component (A1) differs from the counter anion in the component (A2):

$$\left[ (R_{1a})_{\overline{l}} \overset{\oplus}{\underset{R_{2a}}{X}} \left\{ \overbrace{A} \overset{(R_{1a})_l}{\underset{\oplus}{X}} \right\}_m \overbrace{B} \right]_n \quad (1)$$

wherein X represents a sulfur atom or an iodine atom, provided that the X's may be the same or different, $R_{1a}$ and $R_{2a}$ each independently represents an alkyl group or an aryl group, provided that when two or more $R_{1a}$'s are present, they may be the same or different, that when two or more $R_{2a}$'s are present, they may be the same or different, $R_{1a}$ and $R_{2a}$, $R_{1a}$ and A, $R_{1a}$ and B, $R_{2a}$ and A, or $R_{2a}$ and B may be bonded to each other to form a ring, A and B each independently represents a hydrocarbon structure connecting $X^+$'s, provided that at least one pair of $X^+$'s connected by A or B has a structure in which the X's connected are present in the same conjugated system, and that when two or more A's a represent, they may be the same or different, l represents 0 or 1, provided that when X is a sulfur atom, l represents 1, and that when X is an iodine atom, l represents 0, m represents an integer of 0 to 10 and n represents an integer of 1 to 6, provided that when m is 0, n represents an integer of 2 or larger:

$$\text{(I)}$$

(structure showing a diphenyl sulfonium cation with substituents $R_1$ through $R_{15}$ on two phenyl rings connected via $S^+$)

-continued

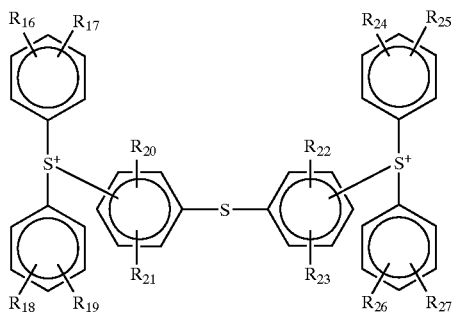

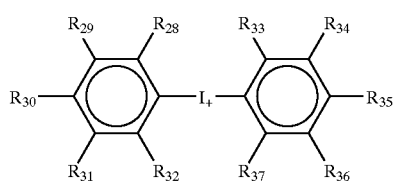

wherein $R_1$ to $R_{37}$ each independently represents a hydrogen atom, an alkyl group, an alkoxy group, a hydroxyl group, a halogen atom, or an —S—$R_{38}$ group, wherein $R_{38}$ represents an alkyl group or an aryl group, provided that two or more of $R_1$ to $R_{15}$, two or more of $R_{16}$ to $R_{27}$, or two or more of $R_{28}$ to $R_{37}$ may be bonded to each other to form a ring containing one or more members selected from a single bond, a carbon atom, an oxygen atom, a sulfur atom, and a nitrogen atom.

(2) The composition according to the above (1), further comprising (D) a nitrogen-containing basic compound.

(3) A positive type resist composition comprising:

(A1) a compound generating a sulfonic acid upon irradiation with actinic rays or a radiation and having a partial structure represented by the following formula (1) and a counter anion, (A2) a compound generating a sulfonic acid upon irradiation with actinic rays or a radiation and having a partial structure represented by the following formula (I), (II), or (III) and a counter anion, and (E) a resin increasing the solubility in an alkaline developing solution by the action of an acid, wherein the counter anion in the component (A1) differs from the counter anion in the component (A2):

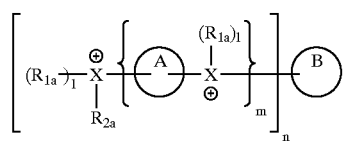

wherein X represents a sulfur atom or an iodine atom, provided that the X's may be the same or different, $R_{1a}$ and $R_{2a}$ each independently represents an alkyl group or an aryl group, provided that when two or more $R_{1a}$'s are present, they may be the same or different, that when two or more $R_{2a}$'s are present, they may be the same or different, $R_{1a}$ and $R_{2a}$, $R_{1a}$ and A, $R_{1a}$ and B, $R_{2a}$ and A, or $R_{2a}$ and B may be bonded to each other to form a ring, A and B each independently represents a hydrocarbon structure connecting $X^+$'s, provided that at least one pair of $X^+$'s connected by A or B has a structure in which the X's connected are present in the same conjugated system, and that when two or more A's are present, they may be the same or different, l represents 0 or 1, provided that when X is a sulfur atom, l represents 1, and that when X is an iodine atom, l represents 0, m represents an integer of 0 to 10 and n represents an integer of 1 to 6, provided that when m is 0, n represents an integer of 2 or larger:

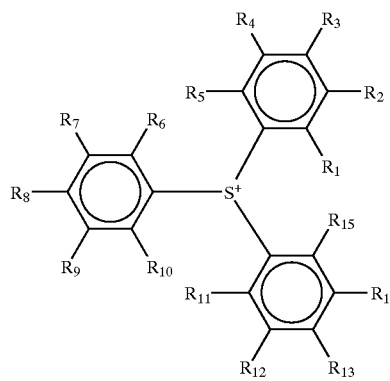

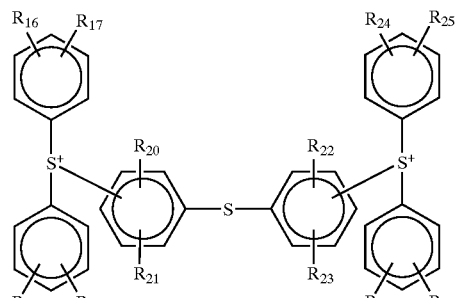

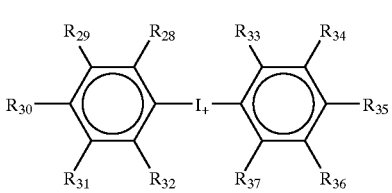

wherein $R_1$ to $R_{37}$ each independently represents a hydrogen atom, an alkyl group, an alkoxy group, a hydroxyl group, a halogen atom, or an —S—$R_{38}$ group, wherein $R_{38}$ represents an alkyl group or an aryl group, provided that two or more of $R_1$ to $R_{15}$, two or more of $R_{16}$ to $R_{27}$, or two or more of $R_{28}$ to $R_{37}$ may be bonded to each other to form a ring containing one or more members selected from a single bond, a carbon atom, an oxygen atom, a sulfur atom, and a nitrogen atom.

(4) The composition according to the above (3), further comprising a nitrogen-containing basic compound.

(5) The composition according to the above (1), wherein the counter anion in the component (A1) has a benzene ring.

(6) The composition according to the above (3), wherein the counter anion in the component (A1) has a benzene ring.

(7) The composition according to the above (1), wherein the counter anion in the component (A2) has a fluorine atom.

(8) The composition according to the above (3), wherein the counter anion in the component (A2) has a fluorine atom.

(9) The composition according to the above (1), wherein the hydrocarbon structure connecting $X^+$'s which is represented by A or B preferably is a hydrocarbon structure having 4 to 16 carbon atoms and having conjugated bonds comprising single bonds and double or triple bonds.

(10) The composition according to the above (9), wherein the hydrocarbon structure has an oxygen atom or sulfur atom.

(11) The composition according to the above (3), wherein the hydrocarbon structure connecting $X^+$'s which is represented by A or B preferably is a hydrocarbon structure having 4 to 16 carbon atoms and having conjugated bonds comprising single bonds and double or triple bonds.

(12) The composition according to the above (11), wherein the hydrocarbon structure has an oxygen atom or sulfur atom.

(13) The composition according to the above (1), wherein the molar proportion of the component (A1) to the component (A2), (A1)/(A2), is from 98/2 to 1/99.

(14) The composition according to the above (3), wherein the molar proportion of the component (A1) to the component (A2), (A1)/(A2), is from 98/2 to 1/99.

(15) The composition according to the above (1), further comprising a fluorine-based and/or silicon-based surfactant.

(16) The composition according to the above (3), further comprising a fluorine-based and/or silicon-based surfactant.

(17) The composition according to the above (1), wherein the actinic rays or radiation is electron beams, X-rays, or EUV ray.

(18) The composition according to the above (3), wherein the actinic rays or radiation is electron beams, X-rays, or EUV ray.

(19) A method for forming a pattern, which comprises forming a resist film comprising the composition described in the above (1), exposing the resist film upon irradiation with the actinic rays or a radiation, and subsequently developing the resist film.

(20) A method for forming a pattern, which comprises forming a resist film comprising the composition described in the above (3), exposing the resist film upon irradiation with the actinic rays or a radiation, and subsequently developing the resist film.

DETAILED DESCRIPTION OF THE INVENTION

The invention will be explained below in detail.

The resist compositions of the invention are characterized by containing (A1) a compound generating a sulfonic acid upon irradiation with actinic rays or a radiation and having a partial structure represented by formula (1) and a counter anion and (A2) a compound generating a sulfonic acid upon irradiation with actinic rays or a radiation and having a partial structure represented by formula (I), (II), or (III) and a counter anion, wherein the counter anion in the component (A1) differs from the counter anion in the component (A2).

The resist compositions of the invention may be either the negative type or the positive type.

The negative type resist composition of the invention comprises (A1) a compound generating a sulfonic acid upon irradiation with actinic rays or a radiation and having a partial structure represented by formula (1) and a counter anion, (A2) a compound generating a sulfonic acid upon irradiation with actinic rays or a radiation and having a partial structure represented by formula (I), (II), or (III) and a counter anion, an alkali-soluble resin, and a crosslinking agent undergoing an addition reaction with the alkali-soluble resin by the action of an acid, wherein the counter anion in the component (A1) differs from the counter anion in the component (A2).

The positive type resist compositions of the invention comprises (A1) a compound generating a sulfonic acid upon irradiation with actinic rays or a radiation and having a partial structure represented by formula (1) and a counter anion, (A2) a compound generating a sulfonic acid upon irradiation with actinic rays or a radiation and having a partial structure represented by formula (I), (II), or (III) and a counter anion, and a resin increasing the solubility in an alkaline developing solution by the action of an acid, wherein the counter anion in ingredient (A1) differs from the counter anion in ingredient (A2). Alternatively, the positive type resist composition comprises (A1) a compound generating a sulfonic acid upon irradiation with actinic rays or a radiation and having a partial structure represented by formula (1) and a counter anion, (A2) a compound generating a sulfonic acid upon irradiation with actinic rays or a radiation and having a partial structure represented by formula (I), (II), or (III) and a counter anion, an alkali-soluble resin, and a dissolution inhibitive compound increasing the solubility in an alkaline developing solution by the action of an acid, wherein the counter anion in the component (A1) differs from the counter anion in the component (A2).

[1] (A1) Compound Generating Sulfonic Acid Upon Irradiation with Actinic Rays or Radiation and Having Partial Structure Represented by Formula (1) and Counter Anion The resist compositions of the invention contain a compound generating a sulfonic acid upon irradiation with actinic rays or a radiation and having a partial structure represented by formula (1) and a counter anion (hereinafter, this compound is referred to also as "component (A1)" or "acid generator (A1)").

In formula (1), X represents a sulfur atom or an iodine atom, provided that the X's may be the same or different. $R_{1a}$ and $R_{2a}$ each independently represents an alkyl group or an aryl group. When two or more $R_{1a}$'s are present, they may be the same or different. When two or more $R_{2a}$'s are present, they may be the same or different. Furthermore, $R_{1a}$ and $R_{2a}$, $R_{1a}$ and A, $R_{1a}$ and B, $R_{2a}$ and A, or $R_{2a}$ and B may be bonded to each other to form a ring. A and B each independently represents a hydrocarbon structure connecting $X^+$'s, provided that at least one pair of $X^+$'s connected by A or B has a structure in which the X's connected are present in the same conjugated system. When two or more A's are present, they may be the same or different. Symbol l represents 0 or 1, provided that when X is a sulfur atom, l represents 1, and that when X is an iodine atom, l represents 0. Symbol m represents an integer of 0 to 10. Symbol n represents an integer of 1 to 6, provided that when m is 0, n represents an integer of 2 or larger.

The alkyl groups represented by $R_{1a}$ and $R_{2a}$ preferably are alkyl groups having 1 to 15 carbon atoms. They may be any of linear alkyl groups, branched alkyl groups, and cycloalkyl groups. Examples thereof include methyl group, ethyl group, propyl group, isopropyl group, butyl group, isobutyl group, t-butyl group, pentyl group, neopentyl group, hexyl group, heptyl group, octyl group, cyclopropyl group, cyclobutyl group, cyclopentyl group, cyclohexyl group, norbornyl group, and adamantly group.

The aryl groups represented by $R_{1a}$ and $R_{2a}$ preferably are aryl groups having 6 to 16 carbon atoms. Examples thereof include phenyl group, naphthyl group, anthranyl group, phenanthrenyl group, and pyrenyl group.

The hydrocarbon structure connecting $X^+$'s which is represented by A or B preferably is a hydrocarbon structure having 4 to 16 carbon atoms and having conjugated bonds comprising single bonds and double or triple bonds. It may have an oxygen atom or sulfur atom. Preferred examples of such hydrocarbon structure include a benzene ring, naphthalene ring, thiophene ring, furan ring, and the following hydrocarbon structures, which each have conjugated bonds.

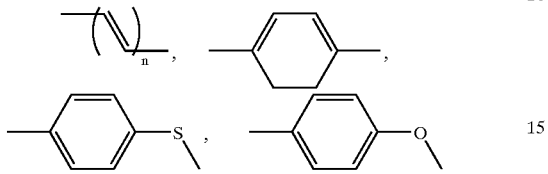

The alkyl groups or aryl groups represented by $R_{1a}$ and $R_{2a}$ and the hydrocarbon structures represented by A and B each may have no substituent or have one or more substituents. Examples of the substituents which may be possessed by the alkyl groups or aryl groups represented by $R_{1a}$ and $R_{2a}$ and the hydrocarbon structures represented by A and B include a fluorine atom, chlorine atom, bromine atom, iodine atom, linear or branched alkyl groups having 1 to 5 carbon atoms, cycloalkyl groups having 3 to 8 carbon atoms, linear or branched, fluorinated alkyl groups having 1 to 3 carbon atoms, hydroxyl group, thiol group, alkyloxy groups having 1 to 5 carbon atoms, nitro group, cyano group, formyl group, phenyl group, naphthyl group, phenylthio group, and phenoxy group.

In the acid generator (A1), at least one pair of X's connected by A or B has a structure in which the X's connected are present in the same conjugated system.

Examples of the structure in which the X's connected are present in the same conjugated system include the following structures.

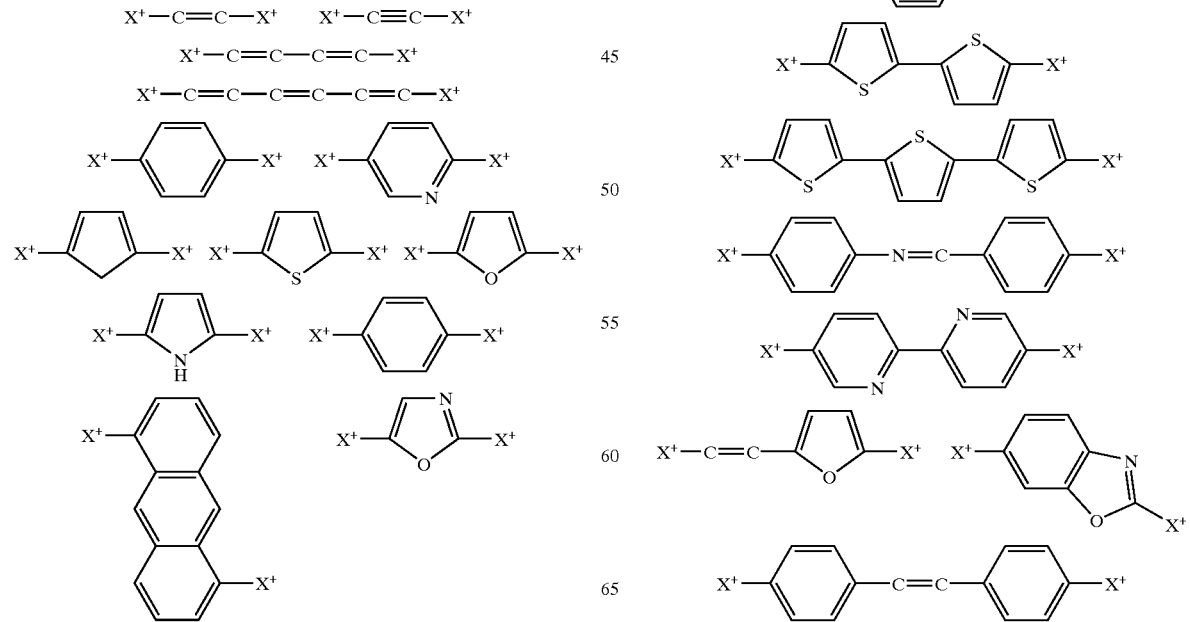

-continued

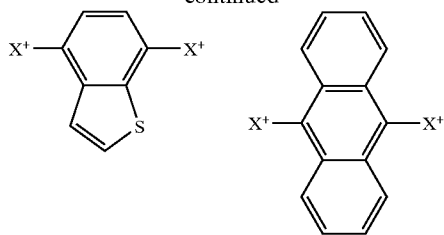

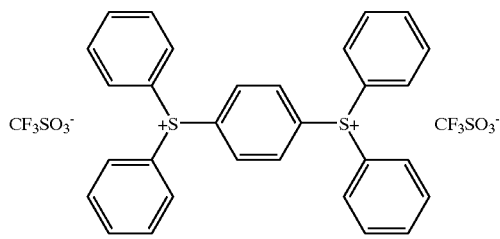

A-2

The compound having a partial structure represented by formula (1) and generating a sulfonic acid upon irradiation with actinic rays or a radiation has a counter anion together with the partial structure.

Examples of the counter anion include aliphatic sulfonic acid anions and aromatic sulfonic acid anions. Preferred are aromatic sulfonic acid anions.

The aliphatic groups in the aliphatic sulfonic acid anions preferably are aliphatic groups having 1 to 30 carbon atoms. Examples thereof include methyl group, ethyl group, propyl group, isopropyl group, n-butyl group, isobutyl group, sec-butyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, eicosyl group, cyclopropyl group, cyclopentyl group, cyclohexyl group, adamantly group, norbornyl group, and bornyl group.

The aromatic groups in the aromatic sulfonic acid anions preferably are aromatic groups having 6 to 30 carbon atoms. Examples thereof include phenyl group, tolyl group, and naphthyl group.

Those aliphatic sulfonic acid anions and aromatic sulfonic acid anions each may have no substituent or have one or more substituents.

Examples of the substituents which may be possessed by the aliphatic sulfonic acid anions and aromatic sulfonic acid anions include halogen atoms such as fluorine, alkyl groups, alkoxy groups, and alkylthio groups.

The aliphatic sulfonic acid anions and aromatic sulfonic acid anions preferably have fluorine atoms as substituents.

The acid generator (A1) preferably is one in which $R_{1a}$ and $R_{2a}$ each are an aryl group and A and B each is an aromatic ring. More preferably, the acid generator (A1) is one in which $R_{1a}$ and $R_{2a}$ each is phenyl, B is a benzene ring, n=2, and m=0.

Specific examples of the compound having a partial structure represented by formula (1) and generating an acid upon irradiation with actinic rays or a radiation are shown below. However, this compound to be used in the invention should not be construed as being limited to the following examples.

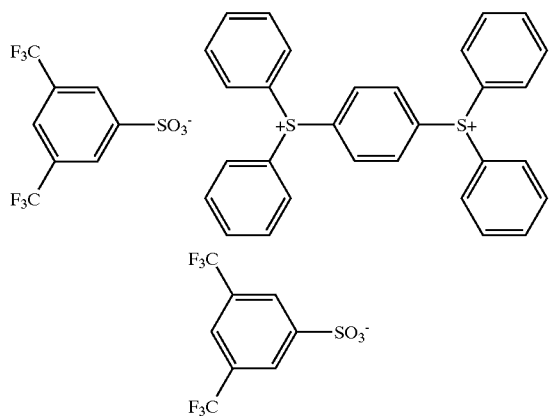

A-3

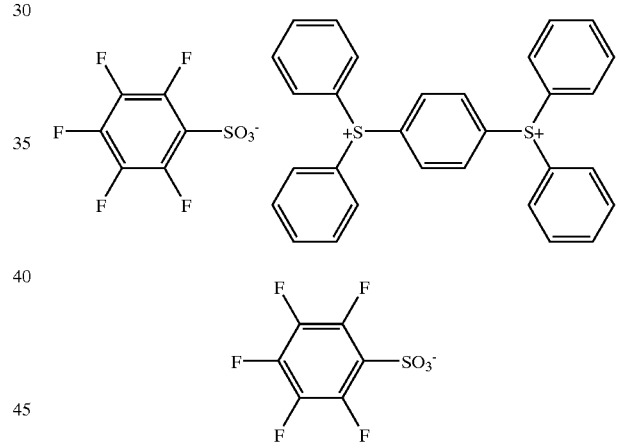

A-4

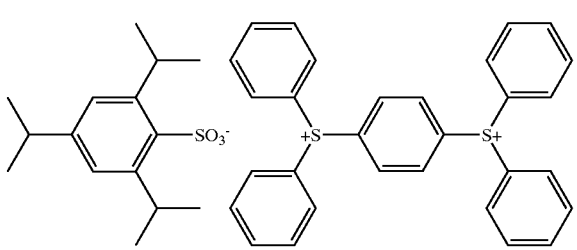

A-5

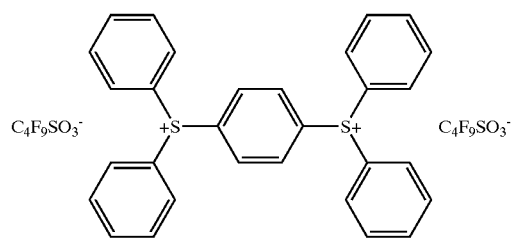

A-1

-continued
A-6
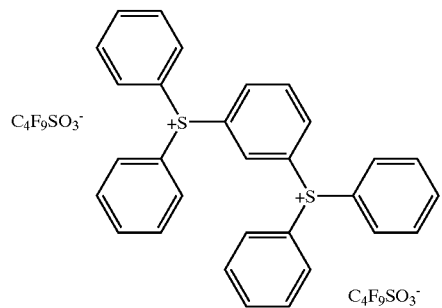
A-7
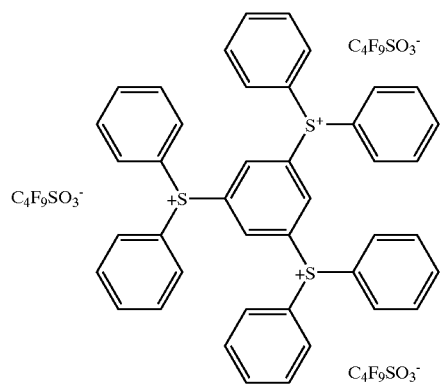
A-8
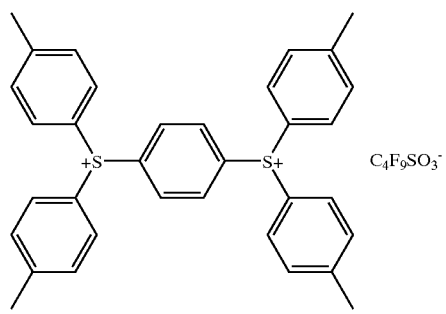
A-9
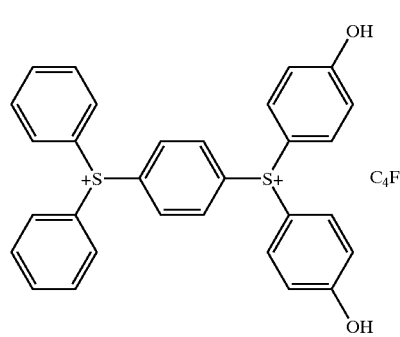
A-10
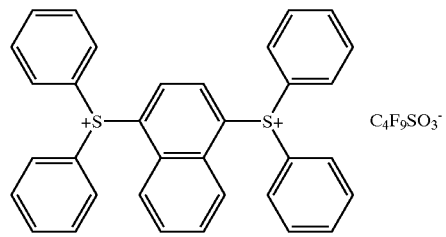
A-12
A-13
A-14
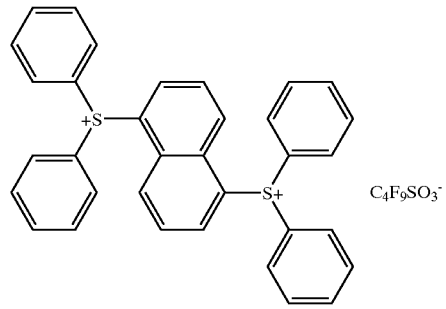
A-15
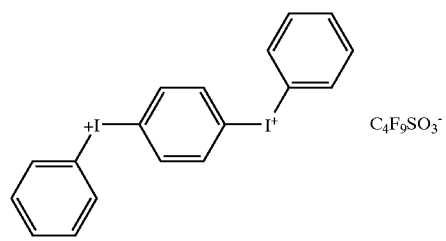

-continued
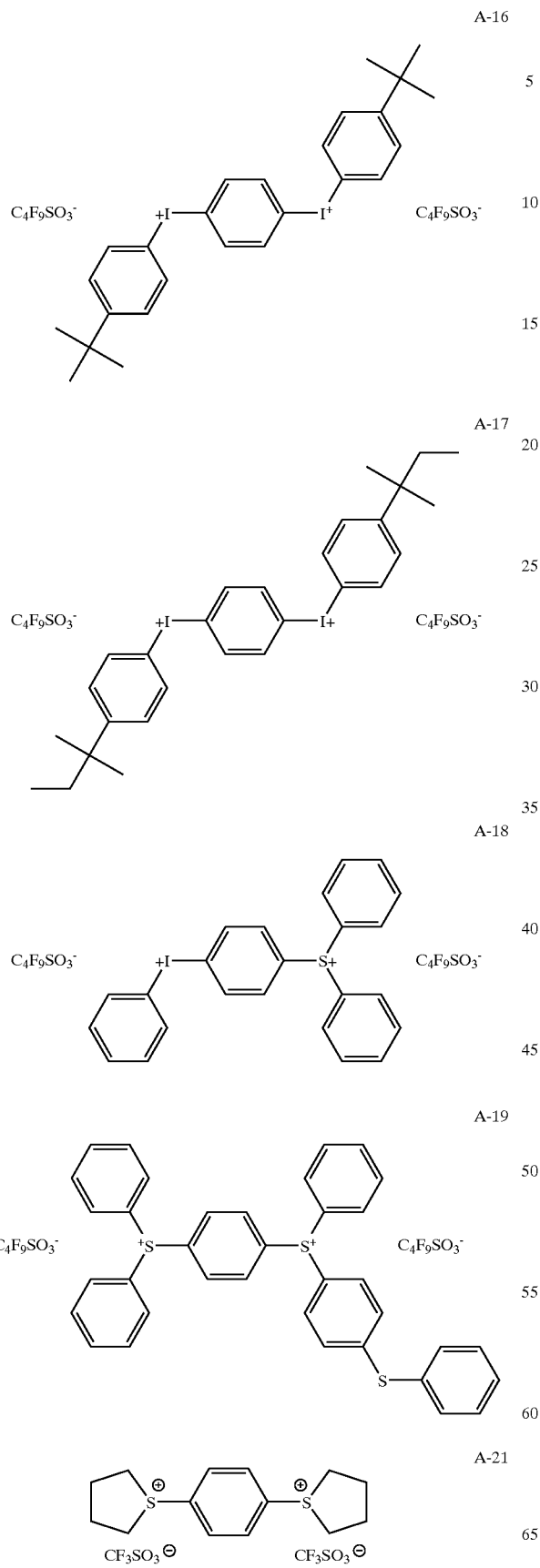
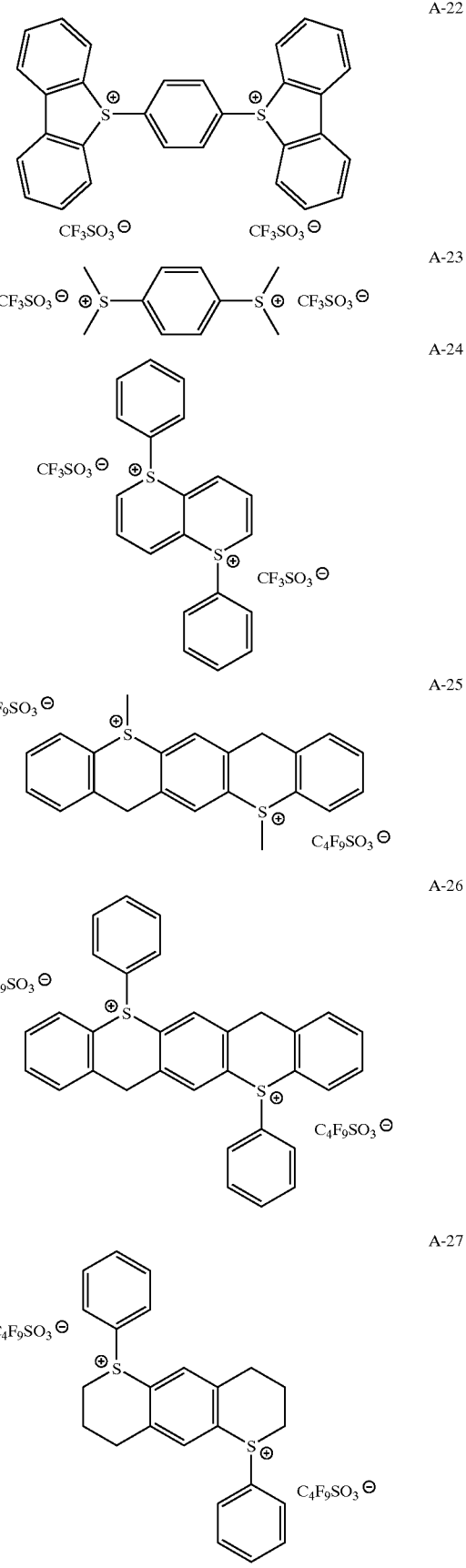

The acid generator (A1) may consist of a single compound or a combination of two or more compounds.

The content of the acid generator (A1) in each resist composition is preferably from 0.1 to 20% by weight, more preferably from 0.5 to 15% by weight, most preferably from 3.6 to 15% by weight, based on the solid components of the composition. When the content of the acid generator (A1) is regulated to 3.6% by weight or higher, the composition can be prevented from having reduced sensitivity and tending to give a line pattern profile having tails. On the other hand, when the content thereof is regulated to 15% by weight or lower, the composition can be prevented from giving an increased number of development defects and tending to give a line pattern profile of a reversely tapered shape.

[2] (A2) Compound Generating Sulfonic Acid Upon Irradiation with Actinic Rays or Radiation and having Partial Structure Represented by Formula (I), (II), or (III) and Counter Anion The resist compositions of the invention contain a compound generating a sulfonic acid upon irradiation with actinic rays or a radiation and having a partial structure represented by formula (I), (II), or (III) and a counter anion (hereinafter, this compound is referred to also as "component (A2)" or "acid generator (A2)").

In formulae (I) to (III), $R_1$ to $R_{37}$ each independently represent a hydrogen atom, an alkyl group, an alkoxy group, a hydroxyl group, a halogen atom, or an —S—$R_{38}$ group, wherein $R_{38}$ represents an alkyl group or an aryl group. Two or more of $R_1$ to $R_{15}$, two or more of $R_{16}$ to $R_{27}$, or two or more of $R_{28}$ to $R_{37}$ may be bonded to each other to form a ring containing one or more members selected from a single bond, carbon atom, oxygen atom, sulfur atom, and nitrogen atom.

Examples of the alkyl groups represented by $R_1$ to $R_{38}$ in formulae (I) to (III) include linear, branched, and cyclic alkyl groups. Examples of the linear and branched alkyl groups include optionally substituted ones having 1 to 4 carbon atoms, such as methyl group, ethyl group, propyl group, n-butyl group, sec-butyl group, and t-butyl group. Examples of the cyclic alkyl groups include optionally substituted ones having 3 to 8 carbon atoms, such as cyclopropyl group, cyclopentyl group, and cyclohexyl group.

Examples of the alkoxy groups represented by $R_1$ to $R_{37}$ include linear, branched, and cyclic alkoxy groups. Examples of the linear and branched alkoxy groups include ones having 1 to 4 carbon atoms, such as methoxy group, ethoxy group, hydroxyethoxy group, propoxy group, n-butoxy group, isobutoxy group, sec-butoxy group, and t-butoxy group. Examples of the cyclic alkoxy groups include cyclopentyloxy group and cyclohexyloxy group.

Examples of the halogen atoms represented by $R_1$ to $R_{37}$ include fluorine atom, chlorine atom, bromine atom, and iodine atom.

Examples of the aryl group represented by $R_{38}$ include optionally substituted ones having 6 to 14 carbon atoms, such as phenyl group, tolyl group, methoxyphenyl group, and naphthyl group.

Preferred examples of those substituents include alkoxy groups having 1 to 4 carbon atoms, halogen atoms (fluorine atom, chlorine atom, and iodine atom), aryl groups having 6 to 10 carbon atoms, alkenyl groups having 2 to 6 carbon atoms, cyano group, hydroxy group, carboxy group, alkoxycarbonyl group, and nitro group.

Examples of the ring formed by the bonding of two or more of $R_1$ to $R_{15}$, two or more of $R_{16}$ to $R_{27}$, or two or more of $R_{28}$ to $R_{37}$ and containing one or more members selected from a single bond, carbon, oxygen, sulfur, and nitrogen include a furan ring, dihydrofuran ring, pyran ring, trihydropyran ring, thiophene ring, and pyrrole ring.

The compound having a partial structure represented by formula (I), (II), or (III) and generating a sulfonic acid upon irradiation with actinic rays or a radiation has a counter anion together with the partial structure.

Examples of the counter anion include the same counter anions as those enumerated above with regard to the acid generator (A1).

Specific examples of the acid generator (A2) are shown below, but this acid generator to be used in the invention should not be construed as being limited to the following examples.

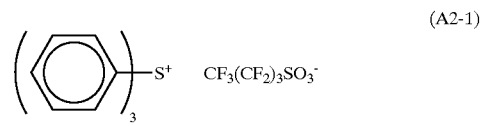
(A2-1)

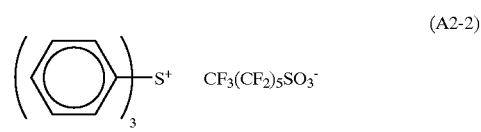
(A2-2)

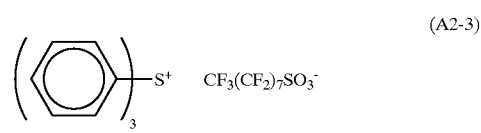
(A2-3)

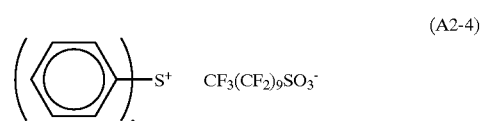
(A2-4)

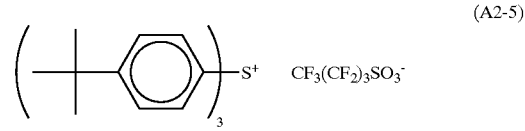
(A2-5)

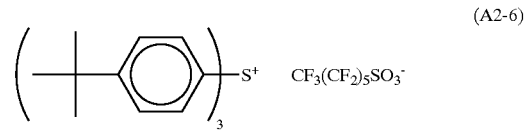
(A2-6)

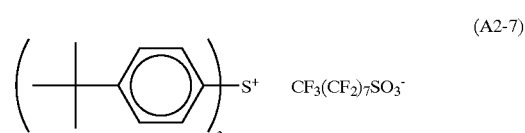
(A2-7)

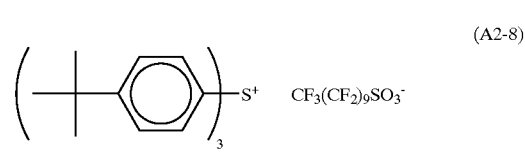
(A2-8)

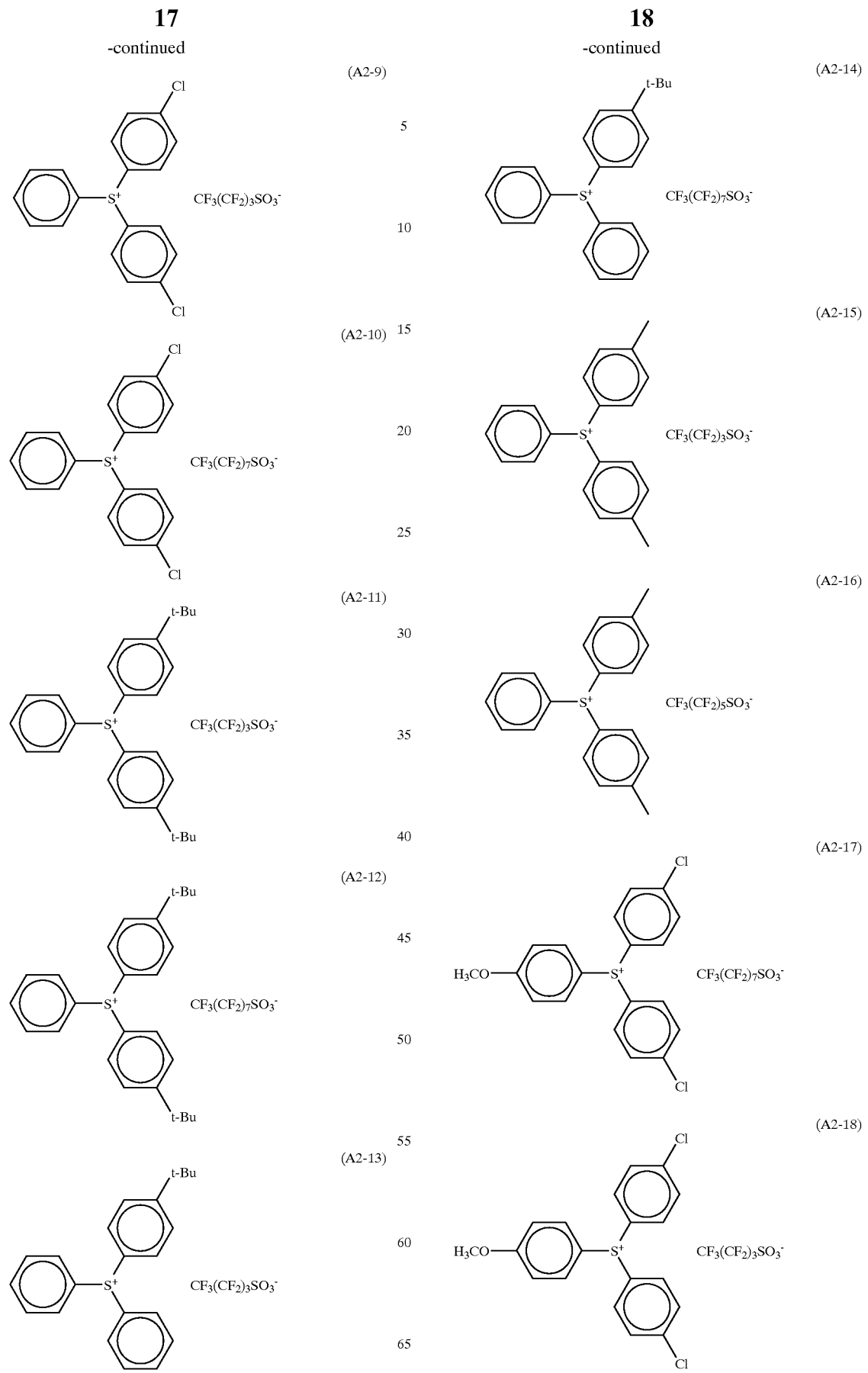

(A2-19)
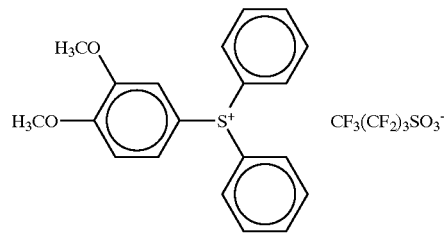
CF₃(CF₂)₃SO₃⁻
(A2-20)
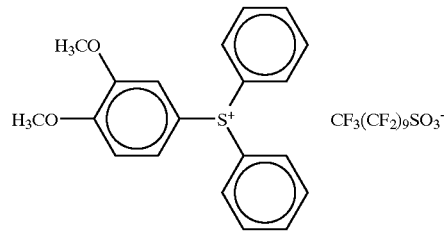
CF₃(CF₂)₉SO₃⁻
(A2-21)
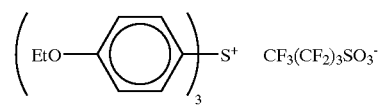
CF₃(CF₂)₃SO₃⁻
(A2-22)
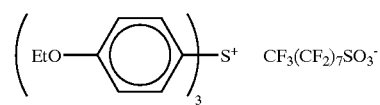
CF₃(CF₂)₇SO₃⁻
(A2-23)
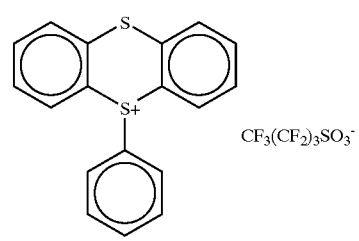
CF₃(CF₂)₃SO₃⁻
(A2-24)
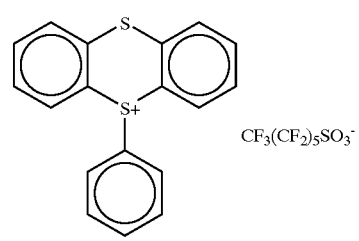
CF₃(CF₂)₅SO₃⁻
(A2-25)
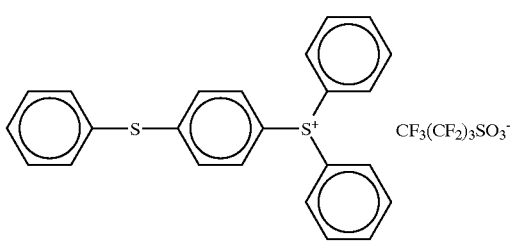
CF₃(CF₂)₃SO₃⁻
(A2-26)
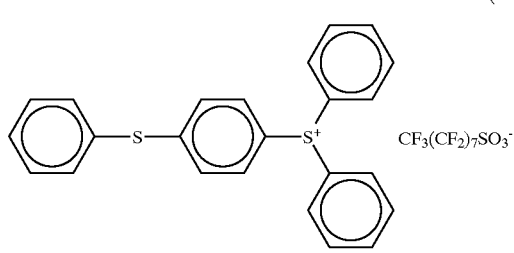
CF₃(CF₂)₇SO₃⁻
(A2-27)
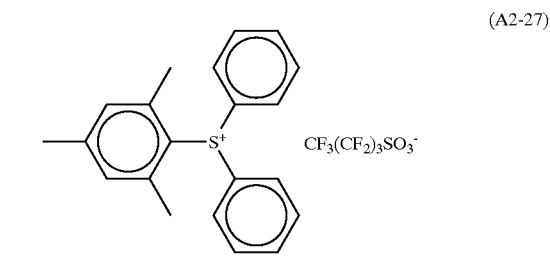
CF₃(CF₂)₃SO₃⁻
(A2-28)
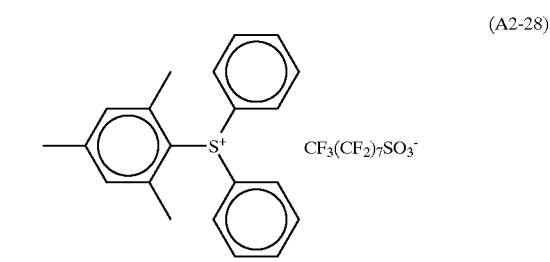
CF₃(CF₂)₇SO₃⁻
(A2-29)
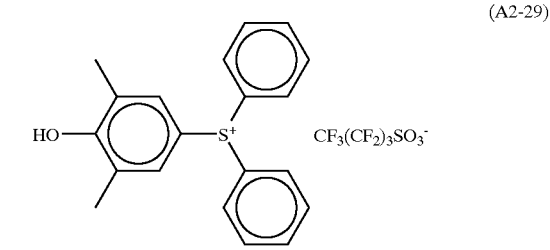
CF₃(CF₂)₃SO₃⁻
(A2-30)
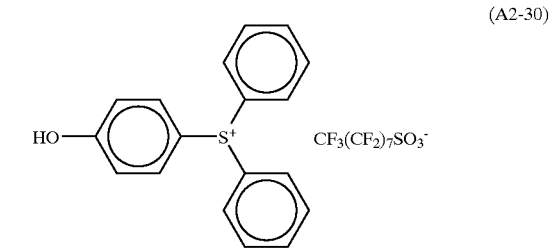
CF₃(CF₂)₇SO₃⁻
(A2-31)
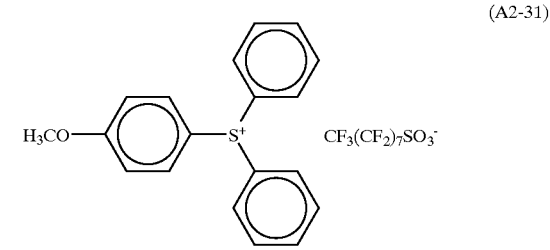
CF₃(CF₂)₇SO₃⁻

(A2-32)
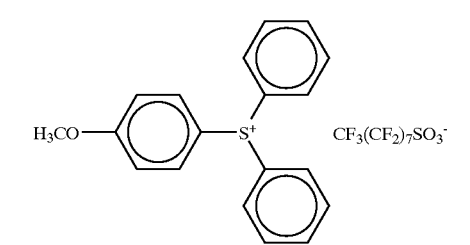
(A2-33)
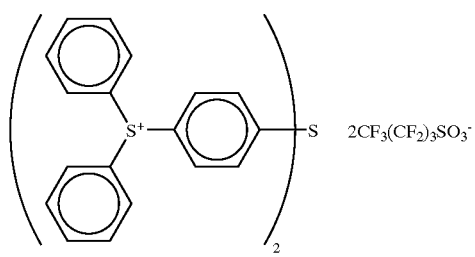
(A2-34)
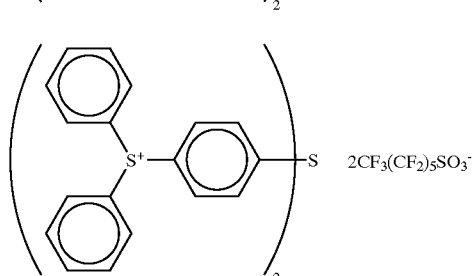
(A2-35)
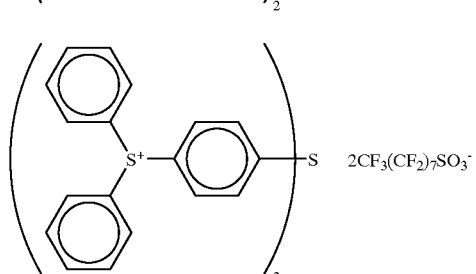
(A2-36)
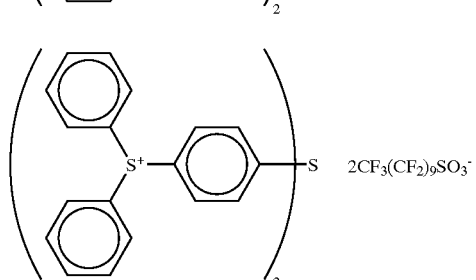
(A2-37)
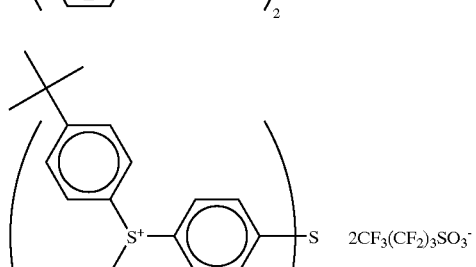
(A2-38)
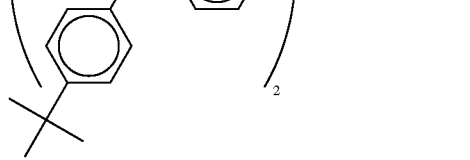
(A2-39)
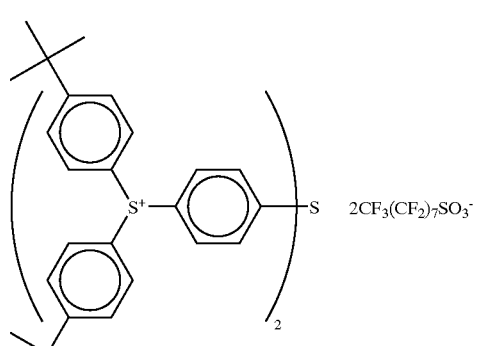
(A2-40)
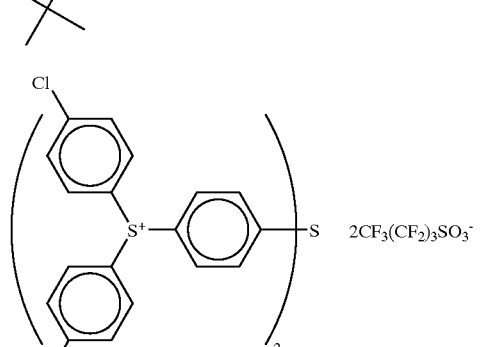
(A2-41)
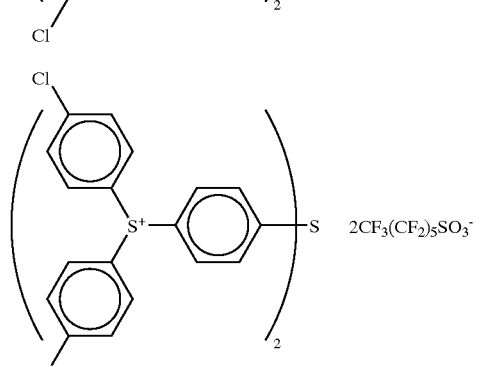
(A2-42)
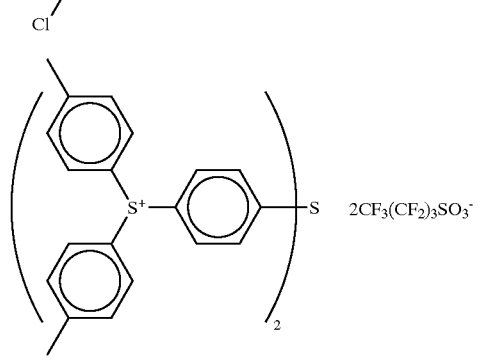

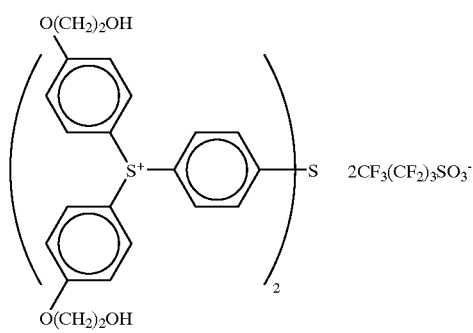
(A2-43)
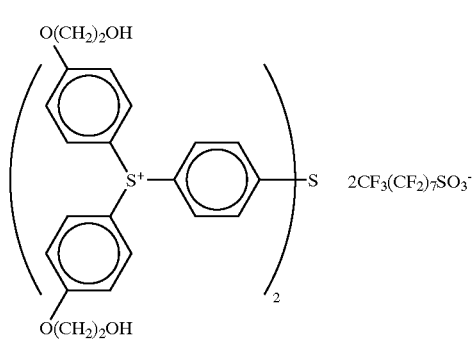
(A2-44)
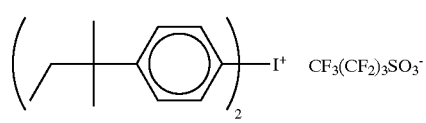
(A2-45)
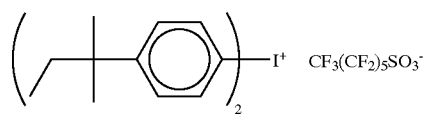
(A2-46)
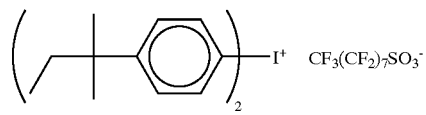
(A2-47)
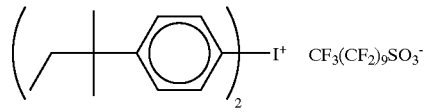
(A2-48)
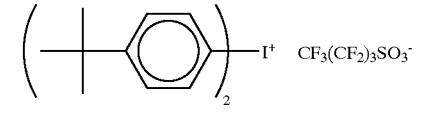
(A2-49)
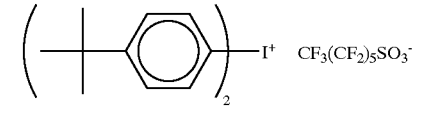
(A2-50)
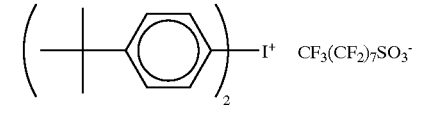
(A2-51)
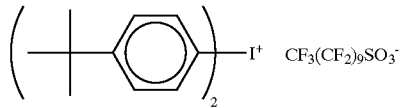
(A2-52)
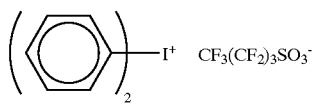
(A2-53)
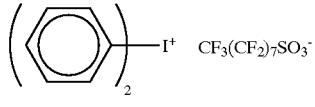
(A2-54)
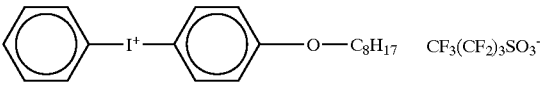
(A2-55)
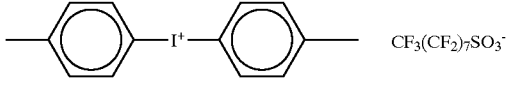
(A2-56)
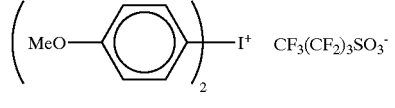
(A2-57)
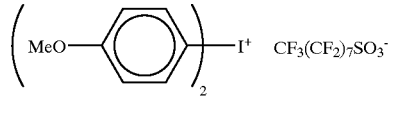
(A2-58)
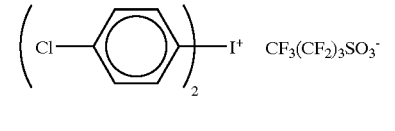
(A2-59)
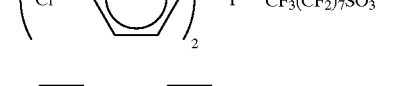
(A2-60)
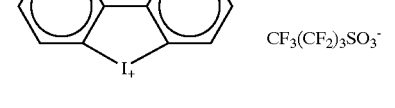
(A2-61)
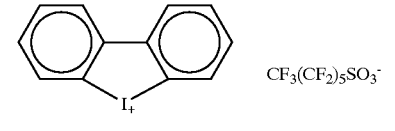
(A2-62)
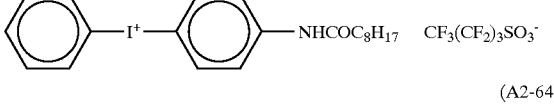
(A2-63)
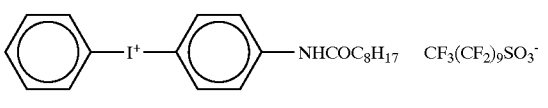
(A2-64)

(PAG3-1)
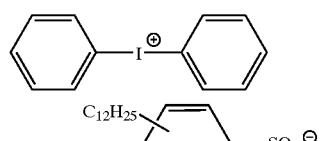
(PAG3-2)
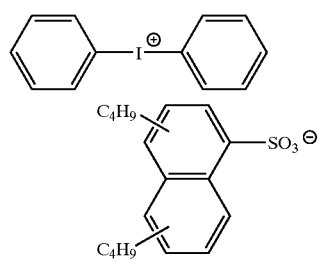
(PAG3-4)
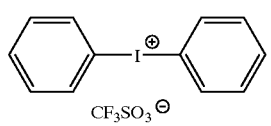
(PAG3-5)
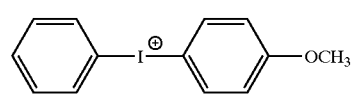
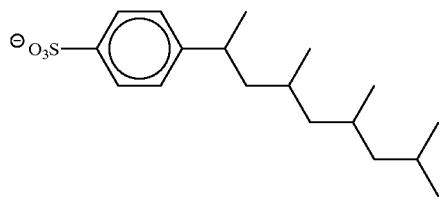
(PAG3-7)
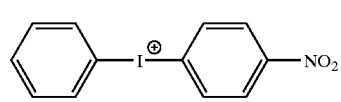
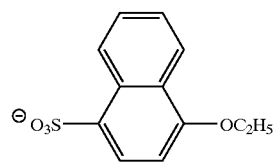
(PAG3-9)
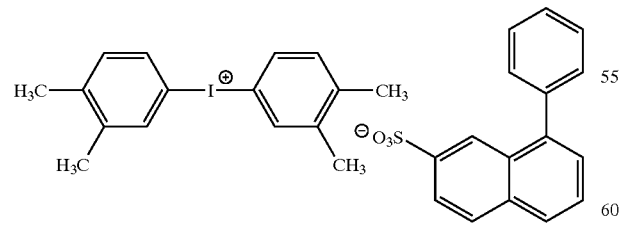
(PAG3-10)
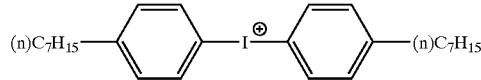
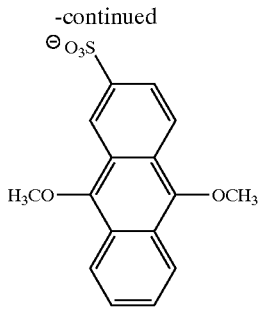
(PAG3-11)
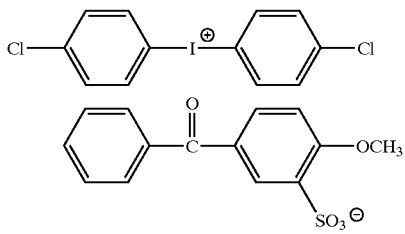
(PAG3-12)
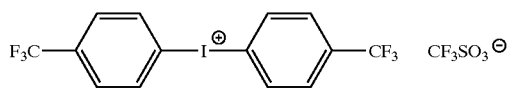
(PAG3-13)
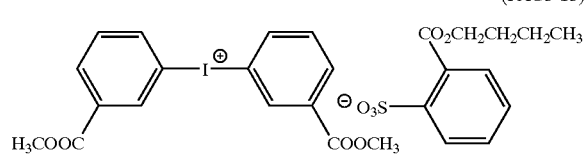
(PAG3-14)
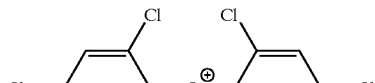
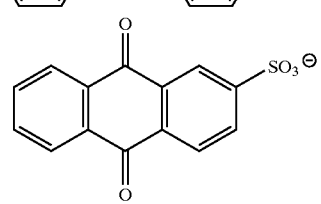
(PAG3-15)
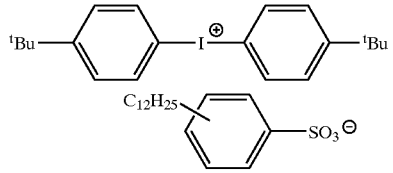
(PAG3-16)
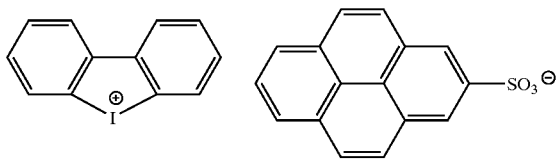
(PAG3-17)
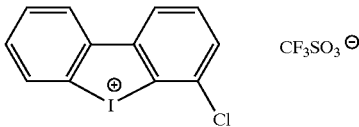

-continued
(PAG3-18)
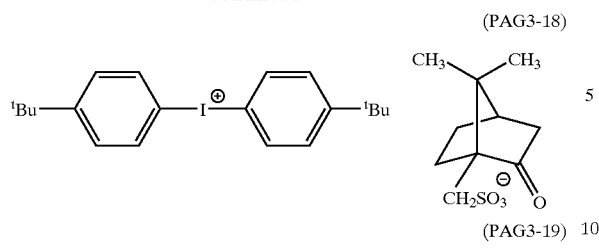
(PAG3-19)
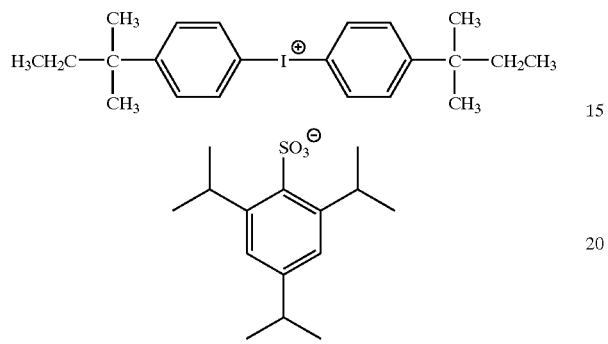
(PAG3-20)
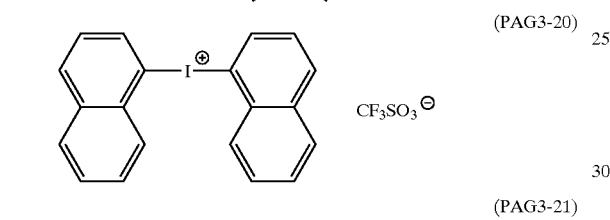
(PAG3-21)
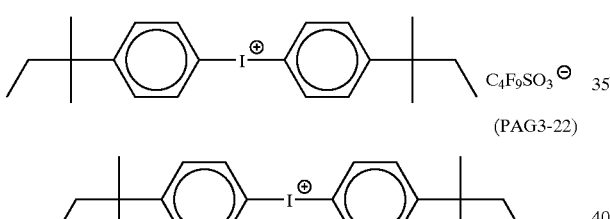
(PAG3-22)
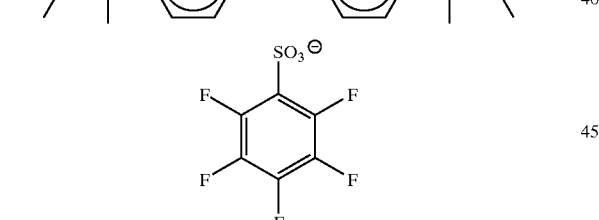
(PAG3-23)
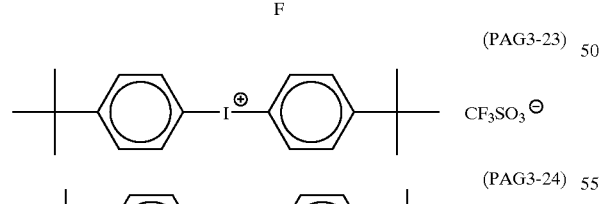
(PAG3-24)
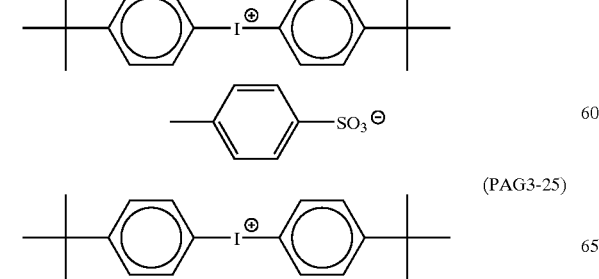
(PAG3-25)
-continued
(PAG3-26)
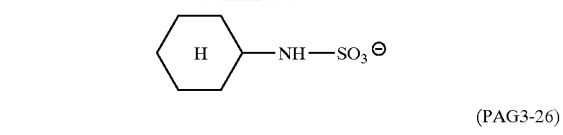
(PAG4-1)
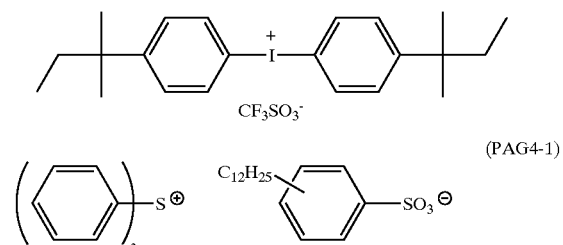
(PAG4-2)
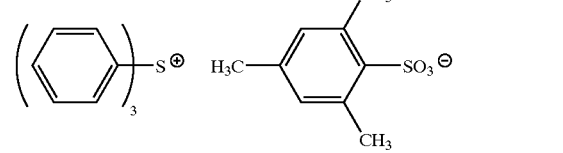
(PAG4-4)
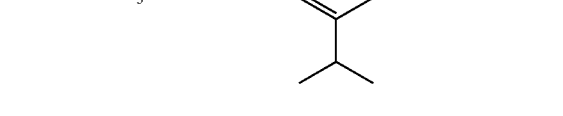
(PAG4-5)
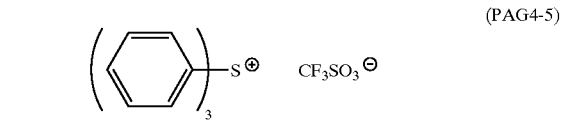
(PAG4-6)
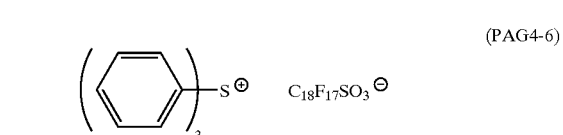
(PAG4-7)
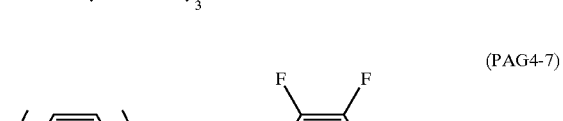
(PAG4-8)
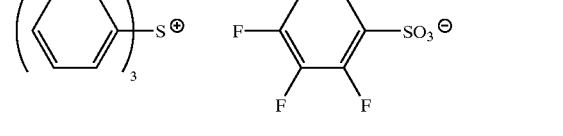
(PAG4-9)
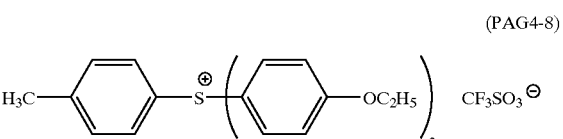

(PAG4-17)
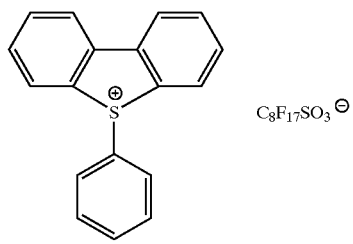
(PAG4-20)
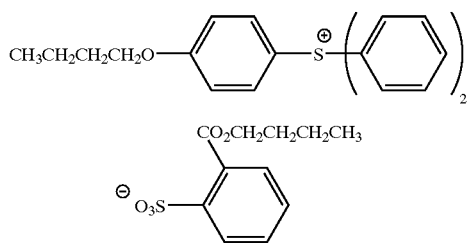
(PAG4-24)
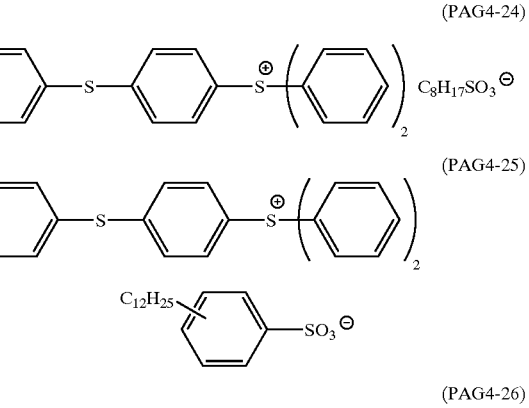
(PAG4-25)
(PAG4-26)
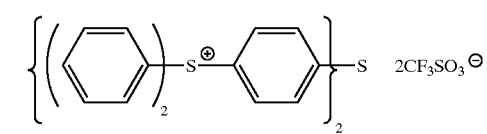
(PAG4-27)
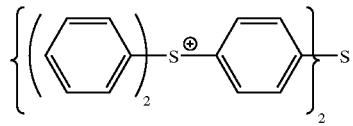
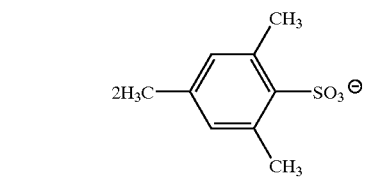
(PAG4-28)
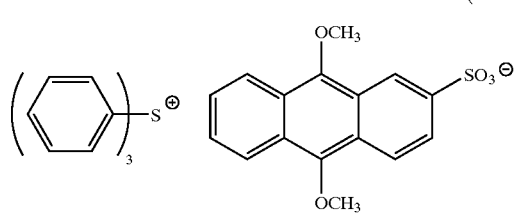
(PAG4-29)
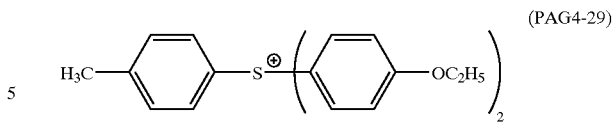
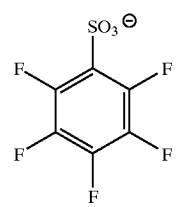
(PAG4-32)
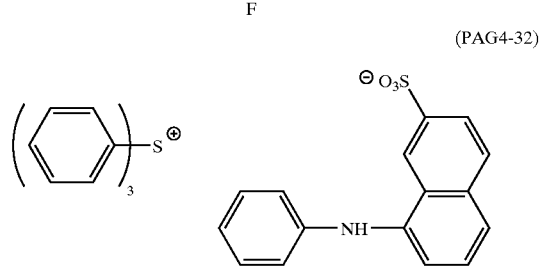
(PAG4-33)
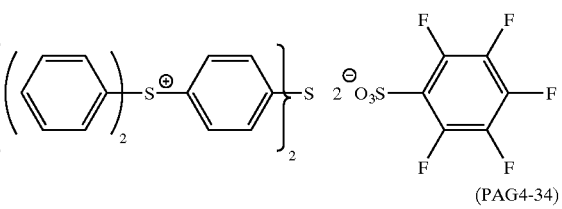
(PAG4-34)
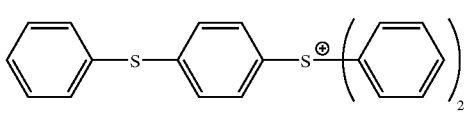
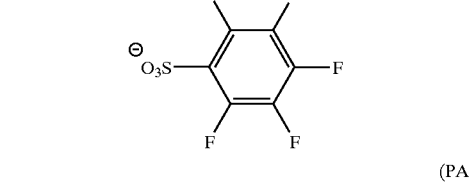
(PAG4-35)
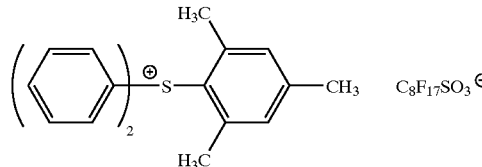
(PAG4-36)
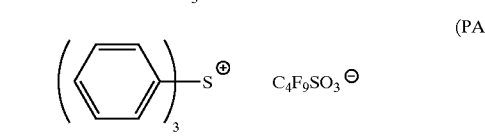
(PAG4-37)
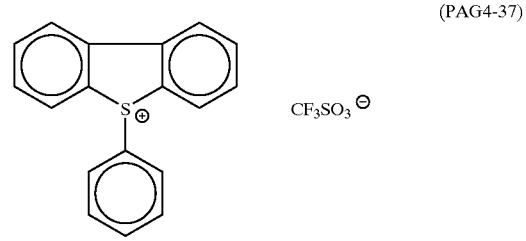

-continued (PAG4-38)
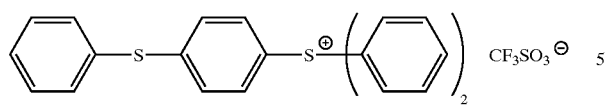

(PAG4-39)
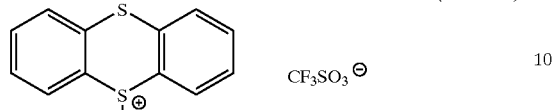

(PAG4-40)
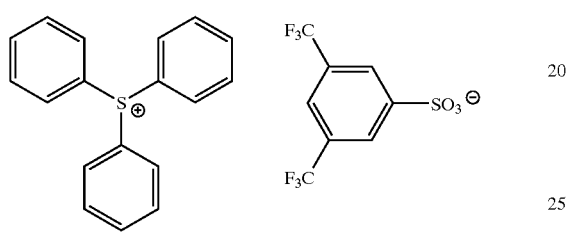

In the invention, ingredient (A1) and ingredient (A2) which differ in counter anion are used.

In the invention, the counter anions are classified in the following groups.

(1) containing one or more benzene rings (2) containing one or more fluorine atoms (3) containing no benzene ring and no fluorine atom (4) containing one or more benzene rings and one or more fluorine atoms Specific examples of the counter anions are shown below, wherein P-1 to P-25 are classified under (1), P-20 to P-35 are classified under (2), P-36 to P-47 are classified under (3), and P-20 to P-25 are classified under (4).

P-1
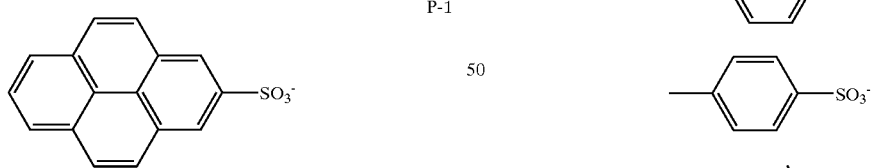

P-2
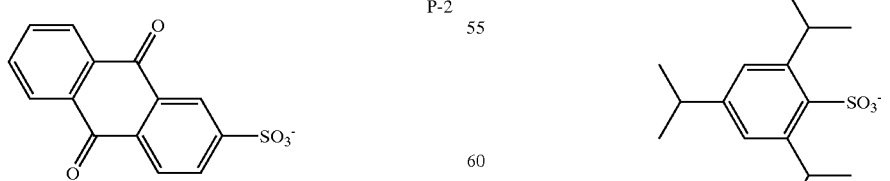

P-3

P-4
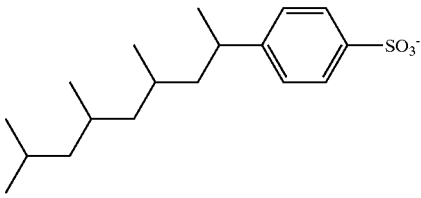

P-5
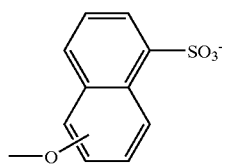

P-6
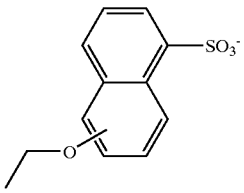

P-7
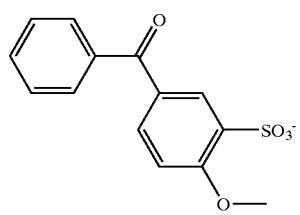

P-8
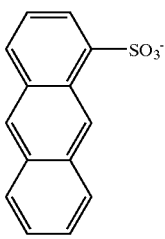

P-9
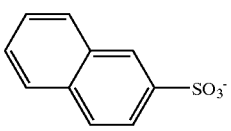

P-10
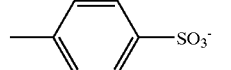

P-11
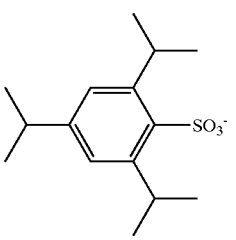

P-12
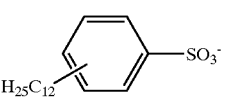

-continued
P-13 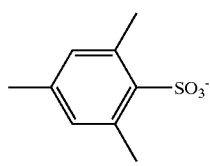
P-14 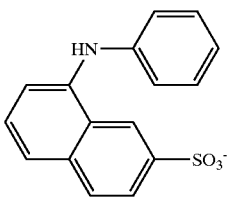
P-15 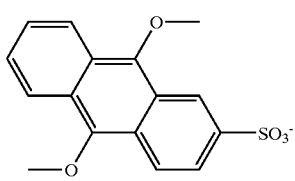
P-16 
P-17 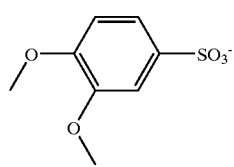
P-18 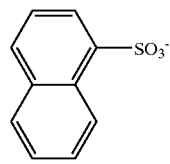
P-19 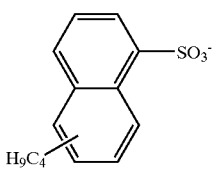
P-20 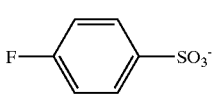
P-21 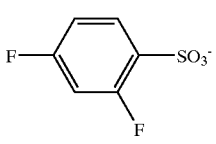
P-22 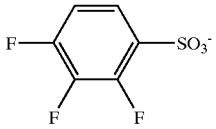
P-23 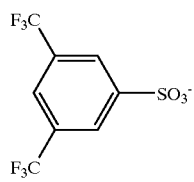
P-24 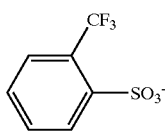
P-25 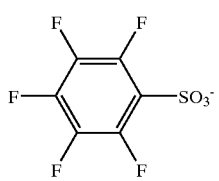
P-26 $CF_3SO_3^-$
P-27 $C_3F_7SO_3^-$
P-28 $C_4F_9SO_3^-$
P-29 $C_8F_{17}SO_3^-$
P-30 $C_{10}F_{21}SO_3^-$
P-31 $C_{11}F_{23}SO_3^-$
P-32 $C_{12}F_{23}SO_3^-$
P-33 $C_{16}F_{33}SO_3^-$
P-36 $CH_3SO_3^-$
P-37 $C_3H_7SO_3^-$
P-38 $C_4H_9SO_3^-$
P-39 $C_8H_{17}SO_3^-$
P-40 $C_{10}H_{21}SO_3^-$
P-41 $C_{11}H_{23}SO_3^-$
P-42 $C_{12}H_{23}SO_3^-$
P-43 $C_{16}H_{33}SO_3^-$
P-34 $C_4F_9OC_4F_8SO_3^-$
P-35 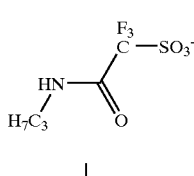
P-44 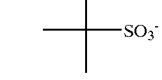

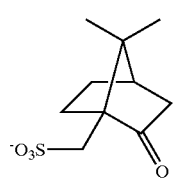

P-45

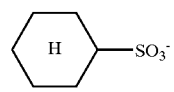

P-46

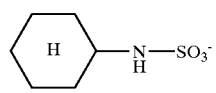

P-47

Counter anions (1) to counter anions (4) respectively have the following effects and features. Counter anions (1) improve beam shape reproducibility; counter anions (2) improve resolution and heighten sensitivity; and counter anions (3) improve resolution and lower sensitivity. Counter anions (4) are effective in improving beam shape reproducibility and resolution and heightening sensitivity when added in a small amount, but impair pattern profiles when added in a large amount.

The counter cations in the component (A1) and the component (A2) also have the following features. The counter cation in the component (A1) is exceedingly effective in reducing alkali solubility, while the counter cation in the component (A2) is moderately effective in reducing alkali solubility.

In the invention, the counter anions to be used respectively in ingredient (A1) and the component (A2) each is selected from (1) to (4), whereby the properties of these counter anions can be utilized in combination. In addition, the properties of the counter cations can also be utilized. Consequently, the use of the components (A1) and (A2) is effective in improving beam shape reproducibility, resolution, and pattern profiles. Furthermore, since the counter anion used in the component (A1) differs from that used in the component (A2), beam shape reproducibility and pattern profiles can be further improved.

Preferred combinations of the counter anion in ingredient (A1) and the counter anion in ingredient (A2) are as follows: [ingredient (A1)]×[ingredient (A2)]=(2)×(2), (1)×(1), (1)×(2), (2)×(1), and (2)×(3). More preferred are (1)×(2) and (2)×(2). Most preferred is (1)×(2).

The content of the acid generator (A2) in the resist composition is preferably from 0.1 to 20% by weight, more preferably from 0.2 to 15% by weight, most preferably from 0.3 to 15% by weight, based on the solid components of the composition.

The molar proportion of the acid generator (A1) to the acid generator (A2), (A1)/(A2), is generally from 98/2 to 1/99, preferably from 90/10 to 5/95, more preferably from 80/20 to 5/95.

[3] (A3) Acid Generator Usable Besides Acid Generators (A1) and (A2)

Besides the acid generators (A1) and (A2), one or more compounds which generate an acid upon irradiation with actinic rays or a radiation (hereinafter referred to also as "component (A3)" or "acid generator (A3)") may be used in the invention.

The acid generator (A3), capable of being used in combination with the acid generators (A1) and (A2), may be used in such an amount that the molar proportion of the acid generators (A1) and (A2) to the acid generator (A3) is generally from 100/0 to 20/80, preferably from 100/0 to 40/60, more preferably from 100/0 to 50/50.

The acid generator (A3) to be optionally used can be suitably selected from photoinitiators for cationic photopolymerization, photoinitiators for radical photopolymerization, photodecolorants or optical color changers for dyes, known compounds which generate an acid upon irradiation with actinic rays or a radiation and are used in microresists or the like, and mixture of two or more thereof.

Examples thereof include diazonium salts, phosphonium salts, sulfonium salts, iodonium salts, imidesulfonates, oximesulfonates, diazodisulfones, disulfones, and o-nitrobenzyl sulfonates.

Use may also be made of compounds obtained by incorporating any of those groups or compounds generating an acid upon irradiation with actinic rays or a radiation into the main chain or side chains of a polymer. Examples of such acid generator compounds are given in, e.g., U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Furthermore, the compounds generating an acid by the action of light which are described in, e.g., U.S. Pat. No. 3,779,778 and European Patent 126,712 can be used.

Especially preferred examples of the acid generator (A3), which may be optionally used, are shown below.

-continued

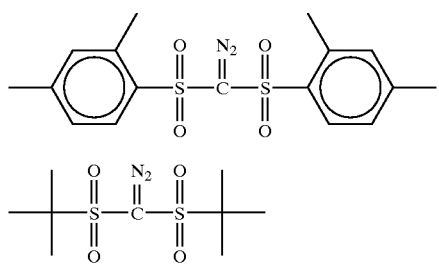 (z25)

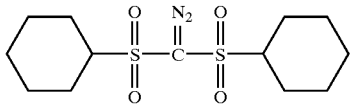 (z26)

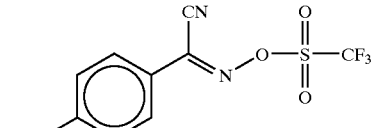 (z28)

(z27)

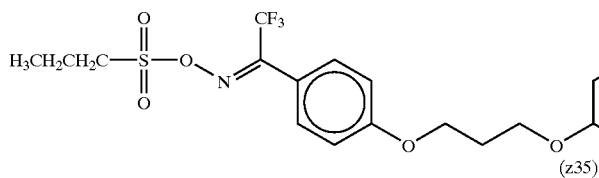 (z29)

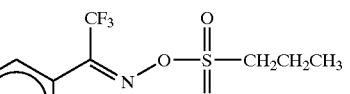

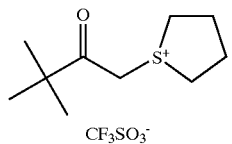 (z35)

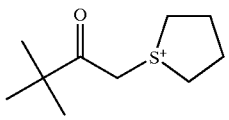 (z36)

 (z37)

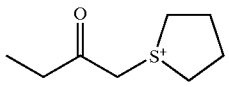 (z38)

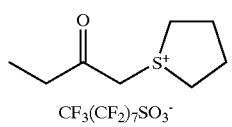 (z39)

[4] (B) Alkali-Soluble Resin

The alkali-soluble resin to be used in the invention can be selected from a wide range of polymers having a phenol framework which have been disclosed for use in resists. Examples thereof include phenolic novolac resins, polyvinylphenol resins, copolymers having structural units derived from vinylphenol, and resins obtained by partly protecting or modifying polyvinylphenol resins. Preferred examples thereof include phenolic resins having repeating units represented by the following formula (b).

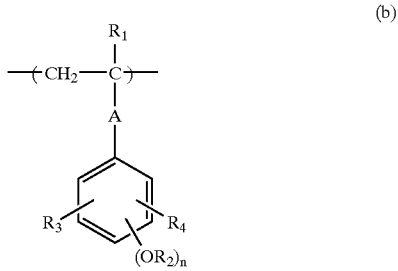 (b)

In formula (b), $R_1$ represents a hydrogen atom, halogen atom, cyano group, or alkyl group which may have one or more substituents.

$R_2$ represents a hydrogen atom or an alkyl, cycloalkyl, aryl, aralkyl, or acyl group, which may have one or more substituents.

$R_3$ and $R_4$ may be the same or different, and each represent a hydrogen atom, halogen atom, cyano, or alkyl, cycloalkyl, alkenyl, aralkyl, or aryl group which may have one or more substituents. In the case where $R_3$ and $R_4$ each are a hydrogen atom, this means that $R_3$ and $R_4$ constitute no substituent on the benzene ring in formula (b).

Symbol A represents a single bond or an alkylene, alkenylene, cycloalkylene, or arylene group which may have one or more substituents, or represents —O—, —SO$_2$—, —O—CO—$R_5$—, —CO—O—$R_6$—, or —CO—N($R_7$)—$R_8$—.

$R_5$, $R_6$, and $R_8$ each represent a single bond or an alkylene, alkenylene, cycloalkylene, or arylene group, which may have one or more substituents, or represent a bivalent group made up of at least one of these groups and at least one member selected from the group consisting of an ether structure, ester structure, amide structure, urethane structure, and ureido structure.

$R_7$ represents a hydrogen atom or an alkyl group, cycloalkyl group, aralkyl group, or aryl group, which may have one or more substituents.

Symbol n represents an integer of 1 to 3. $R_2$'s may be bonded to each other to form a ring, or $R_2$ may be bonded to $R_3$ or $R_4$ to form a ring.

Examples of the alkyl groups represented by $R_1$ to $R_4$ and $R_7$ include alkyl groups having 1 to 8 carbon atoms. Preferred examples thereof include methyl group, ethyl group, propyl group, n-butyl group, sec-butyl group, hexyl group, 2-ethylhexyl group, and octyl group.

The cycloalkyl groups represented by $R_2$ to $R_4$ and $R_7$ may be monocyclic or polycyclic. Preferred examples of the monocyclic alkyl groups include ones having 3 to 8 carbon atoms, such as cyclopropyl group, cyclopentyl group, and cyclohexyl group. Preferred examples of the polycyclic alkyl groups include adamantly group, norbornyl group, isobornyl group, dicyclopentyl group, α-pinel group, and tricyclodecanyl group.

Examples of the alkenyl groups represented by $R_3$ and $R_4$ include alkenyl groups having 2 to 8 carbon atoms. Preferred examples thereof include vinyl group, allyl group, butenyl group, and cyclohexenyl group.

Examples of the aryl groups represented by $R_2$ to $R_4$ and $R_7$ include aryl groups having 6 to 15 carbon atoms. Preferred examples thereof include phenyl group, tolyl group, dimethylphenyl group, 2,4,6-trimethylphenyl group, naphthyl group, and anthryl group.

Examples of the aralkyl groups represented by $R_2$ to $R_4$ and $R_7$ include aralkyl groups having 7 to 12 carbon atoms. Preferred examples thereof include benzyl group, phenethyl group, and naphthylmethyl group.

Examples of the acyl group represented by $R_2$ include acyl groups having 1 to 8 carbon atoms. Preferred examples thereof include formyl group, acetyl group, propanoyl group, butanoyl group, pivaloyl group, and benzoyl group.

Preferred examples of the alkylene groups represented by $A, R_5, R_6$, and $R_8$ include optionally substituted ones having 1 to 8 carbon atoms, such as methylene, ethylene, propylene, butylene, hexylene, and octylene.

Preferred examples of the alkenylene groups represented by $A, R_5, R_6$, and $R_8$ include optionally substituted ones having 2 to 6 carbon atoms, such as ethenylene, propenylene, and butenylene.

Preferred examples of the cycloalkylene groups represented by $A, R_5, R_6$, and $R_8$ include optionally substituted ones having 5 to 8 carbon atoms, such as cyclopentylene and cyclohexylene.

Preferred examples of the arylene groups represented by $A, R_5, R_6$, and $R_8$ include ones having 6 to 12 carbon atoms, such as phenylene, tolylene, and naphthylene.

The alkyl, cycloalkyl, aryl, aralkyl, acyl, alkenyl, alkylene, alkenylene, cycloalkylene, arylene, and other groups described above may have substituents.

Examples of the substituents which may be possessed by those groups include ones having active hydrogen, such as amino group, amide group, ureido group, urethane group, hydroxyl group, and carboxyl group, halogen atoms (fluorine atom, chlorine atom, bromine atom, and iodine atom), alkoxy groups (e.g., methoxy group, ethoxy group, propoxy group, and butoxy group), thioether groups, acyl groups (e.g., acetyl group, propanoyl group, and benzoyl group), acyloxy groups (e.g., acetoxy group, propanoyloxy group, and benzoyloxy group), alkoxycarbonyl groups (e.g., methoxycarbonyl group, ethoxycarbonyl group, and propoxycarbonyl group), cyano group, and nitro group. Especially preferred are substituents having active hydrogen, such as amino group, hydroxyl group, and carboxyl group.

Examples of the ring formed by the bonding of $R_2$'s to each other or of $R_2$ to $R_3$ or $R_4$ include four- to seven-membered rings having one or more oxygen atoms, such as a benzofuran ring, benzodioxonol ring, and benzopyran ring.

The alkali-soluble resin may be a resin consisting only of repeating units represented by formula (b). However, one or more other polymerizable monomers may be copolymerized for the purpose of further improving resist performance.

Usable copolymerizable monomers include compounds having one addition-polymerizable unsaturated bond which are selected, for example, from acrylic esters, acrylamide and derivatives thereof, methacrylic esters, methacrylamide and derivatives thereof, allyl compounds, vinyl ethers, vinyl esters, styrene and derivatives thereof, crotonic esters, and the like.

Preferred comonomers among those are monomers having a carboxyl group, such as carboxystyrene, N-(carboxyphenyl)acrylamide, and N-(carboxyphenyl)methacrylamide, and monomers serving to improve alkali solubility, such as maleimide.

In the resin to be used in the invention, the content of units derived from such optional monomer(s) is preferably up to 50% by mole, more preferably up to 30% by mole, based on all repeating units.

Specific examples of the alkali-soluble resin having repeating units represented by formula (b) are shown below, but the alkali-soluble resin in the invention should not be construed as being limited to the following examples.

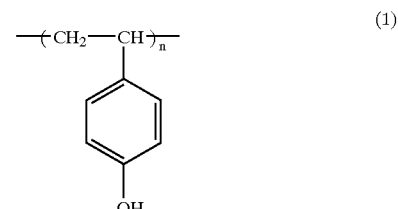

(1)

(2)

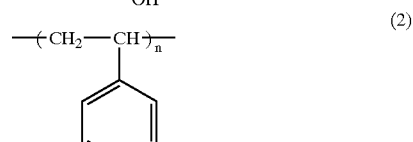

(3)

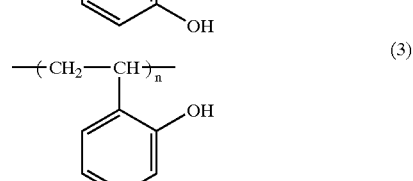

(4)

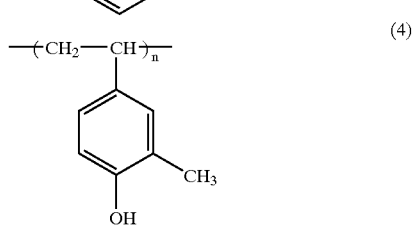

(5)

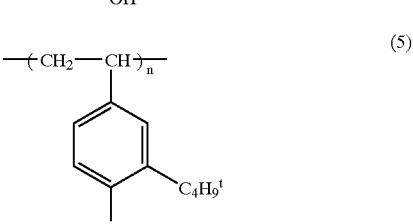

(6)

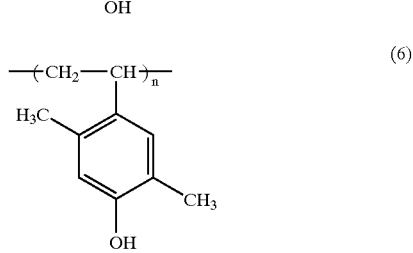

-continued
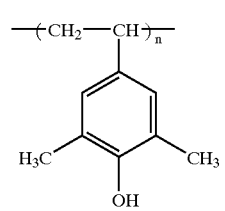 (7)
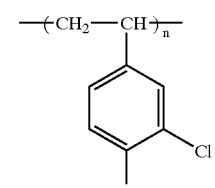 (8)
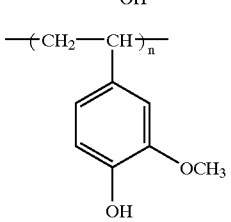 (9)
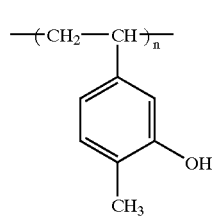 (10)
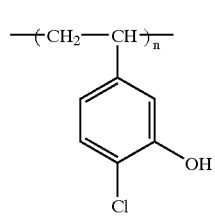 (11)
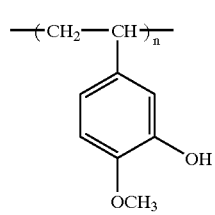 (12)
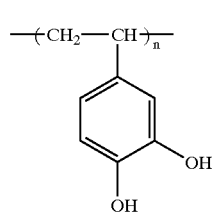 (13)
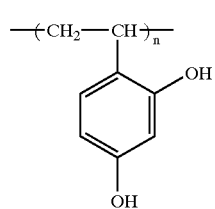 (14)
-continued
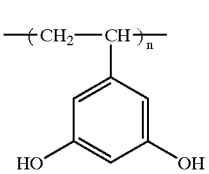 (15)
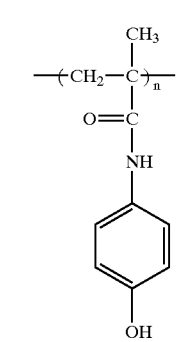 (16)
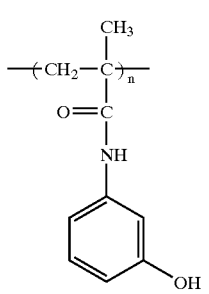 (17)
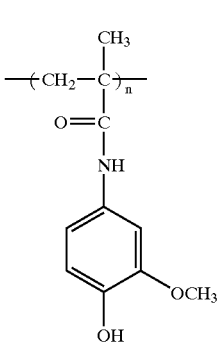 (18)
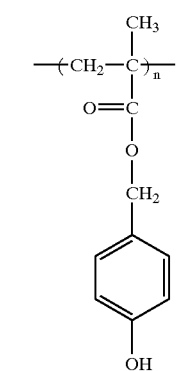 (19)

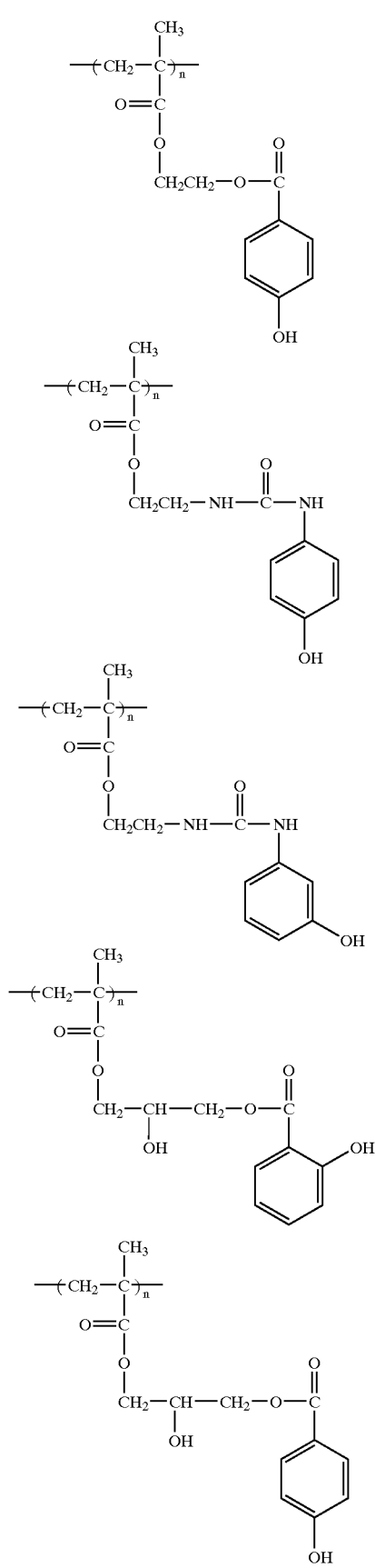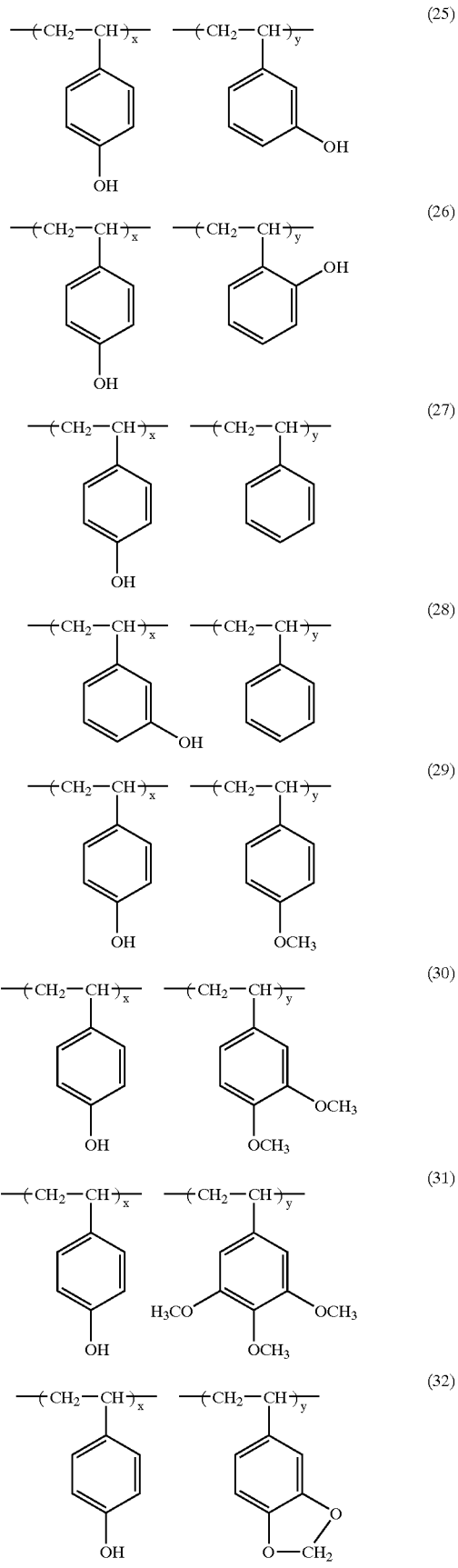

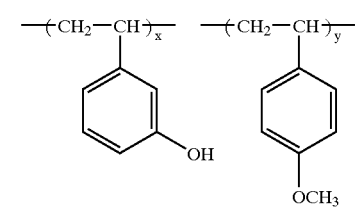
(33)
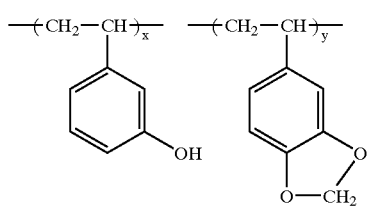
(34)
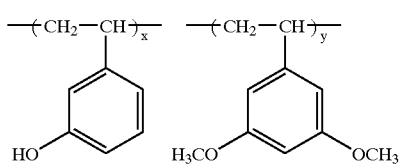
(35)
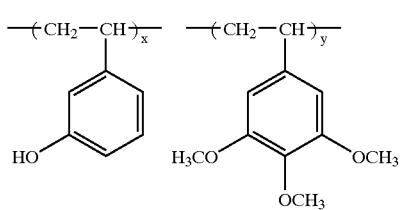
(36)
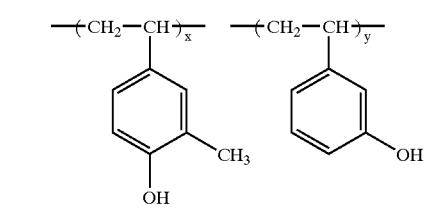
(37)
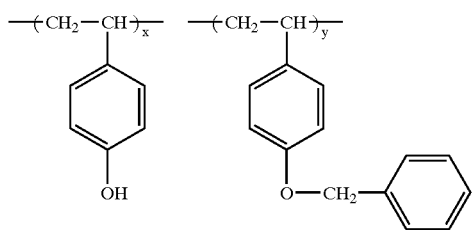
(38)
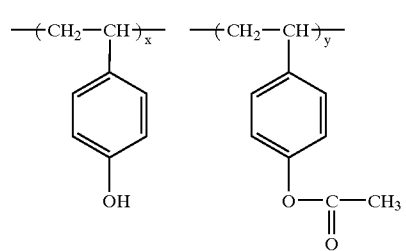
(39)
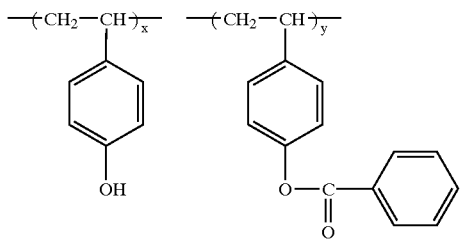
(40)
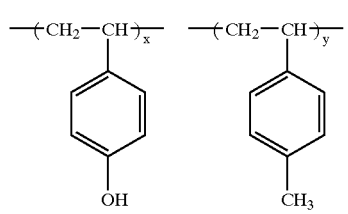
(41)
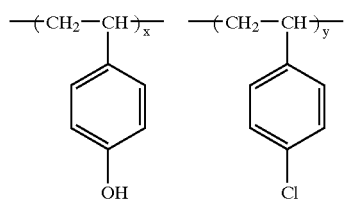
(42)
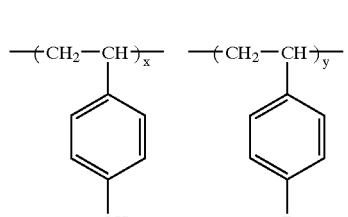
(43)
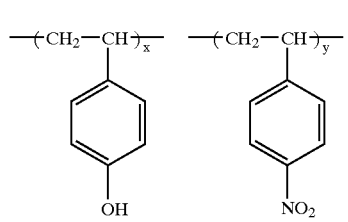
(44)
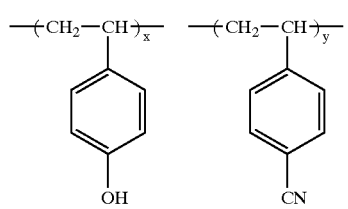
(45)
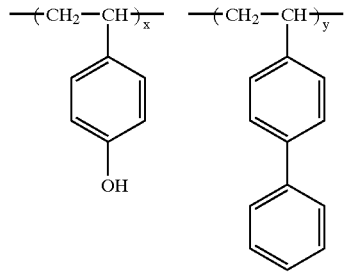
(46)

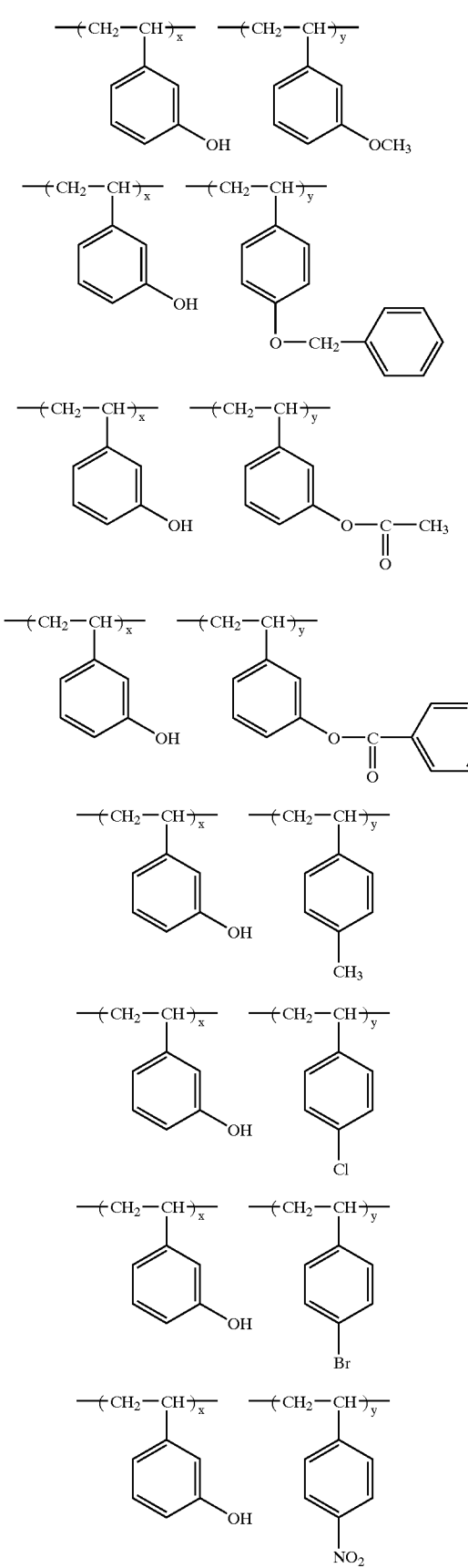
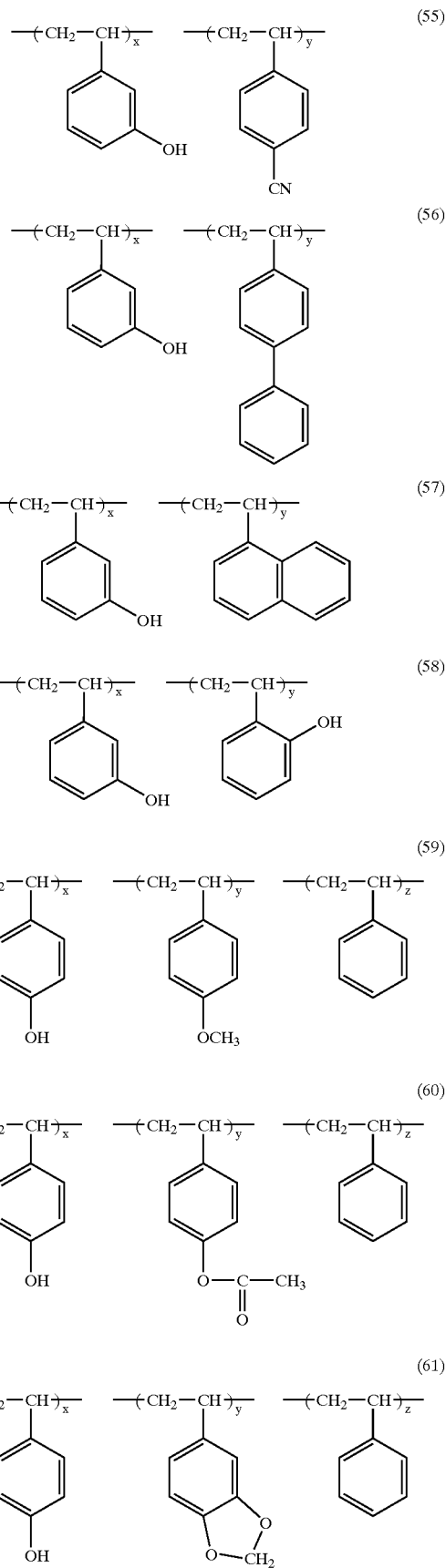

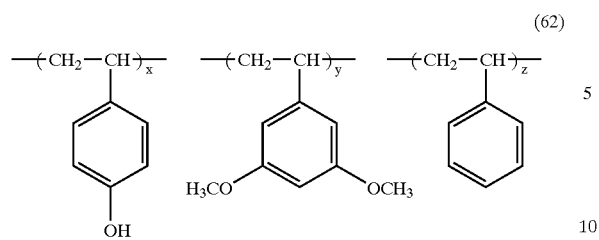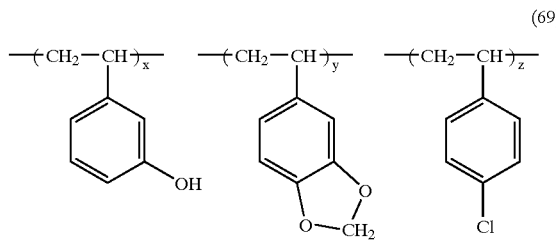

(76) 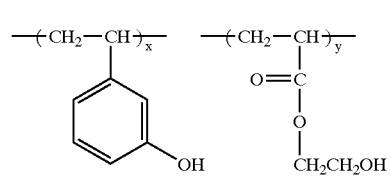
(82) 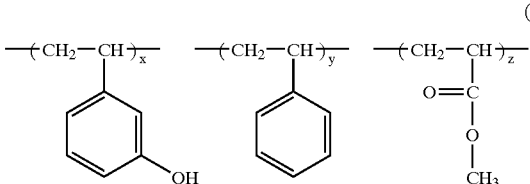
(77) 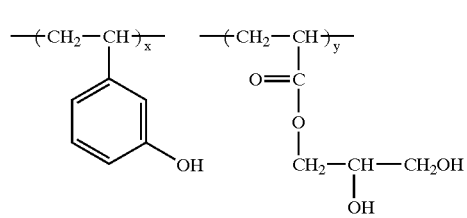
(83) 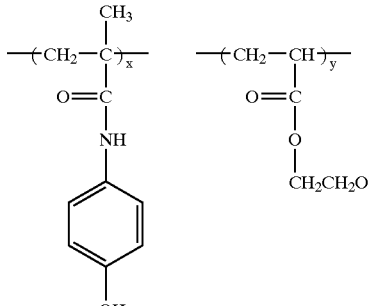
(78) 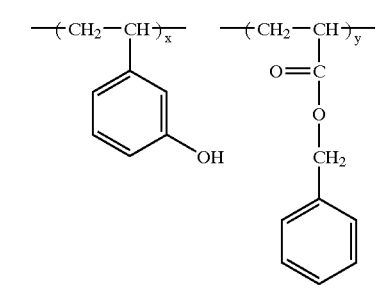
(84) 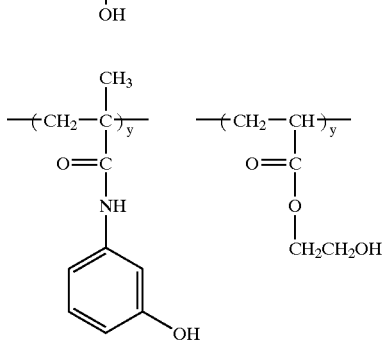
(79) 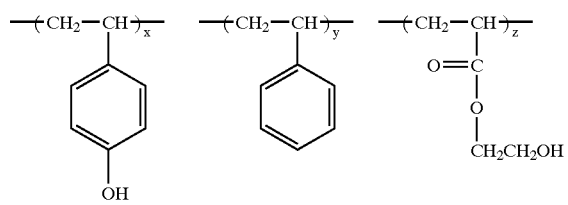
(85) 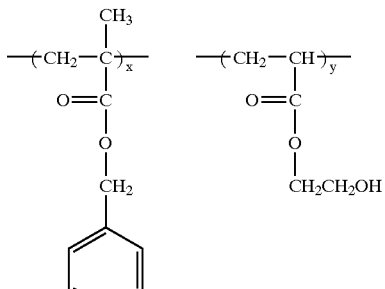
(80) 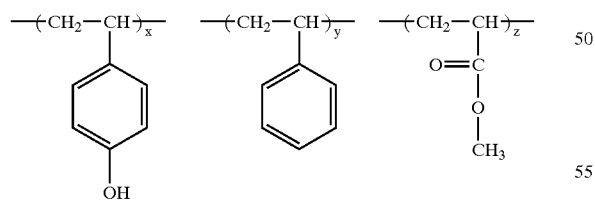
(86) 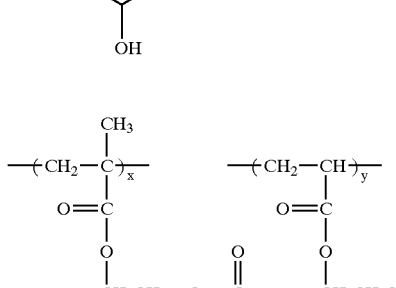
(81) 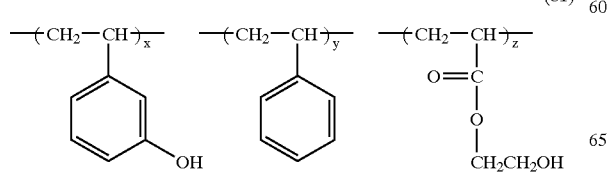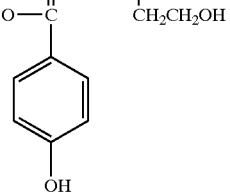

-continued

(87) 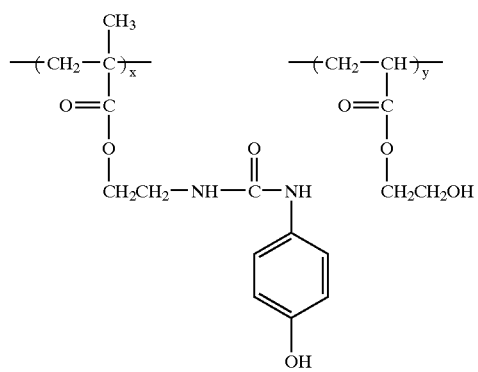

(88) 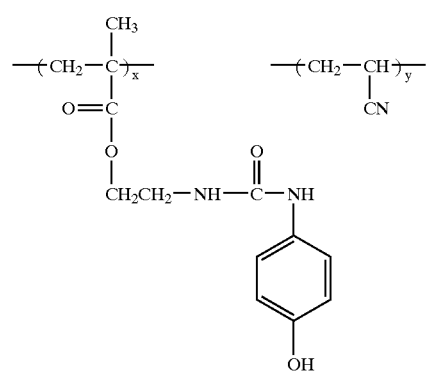

(89) 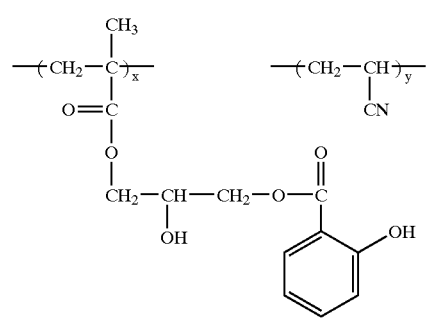

(90) 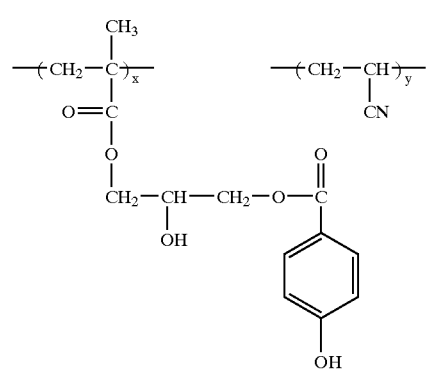

-continued

(91) 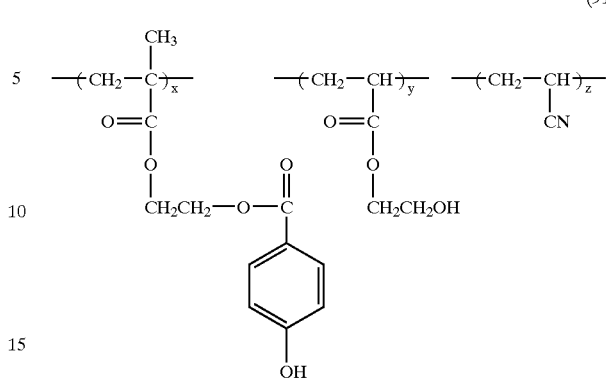

(92) 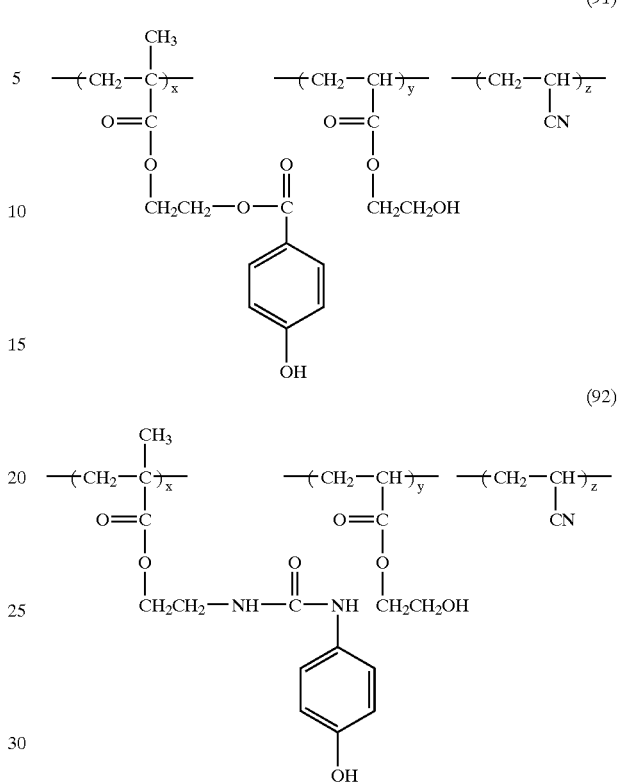

In the resin examples shown above, n represents a positive integer, and x, y, and z indicate the molar proportions of the respective units constituting the resin. In the resins made up of two kinds of units, x=10–95 and y=5–90, preferably x=40–90 and y=10–60. In the resins made up of three kinds of units, x=10–90, y=5–85, and z=5–85, preferably x=40–80, y=10–50, and z=10–50.

The content of the repeating units represented by formula (b) is generally from 5 to 100% by mole, preferably from 10 to 90% by mole, based on the whole resin.

Other preferred examples of the alkali-soluble resin to be used in the invention are ones having repeating units represented by the following formula (b-2) or (b-3).

(b-2) 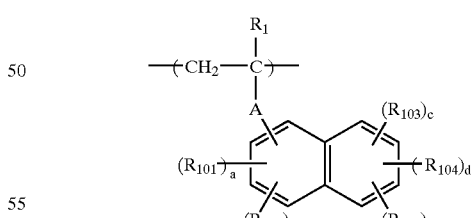

(b-3) 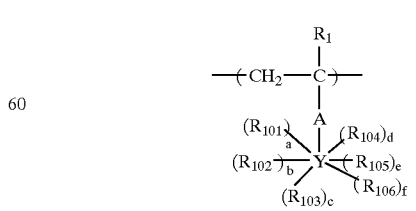

In formulae (b-2) and (b-3), $R_1$ and A have the same meanings as the $R_1$ and A in formula (b). $R_{101}$ to $R_{106}$ each independently represents a hydroxy group, a carboxy group, an amino group, or an alkyl group, a cycloalkyl group, an alkoxy group, an alkylcarbonyloxy group, an alkylsulfonyloxy group, an alkenyl group, an aryl group, an aralkyl group, N-alkylamino group, or N-dialkylamino group, which may have one or more substituents. Symbols a to f each independently represents an integer of 0 to 3.

Y represents one member selected from the following fused polycyclic aromatic structures.

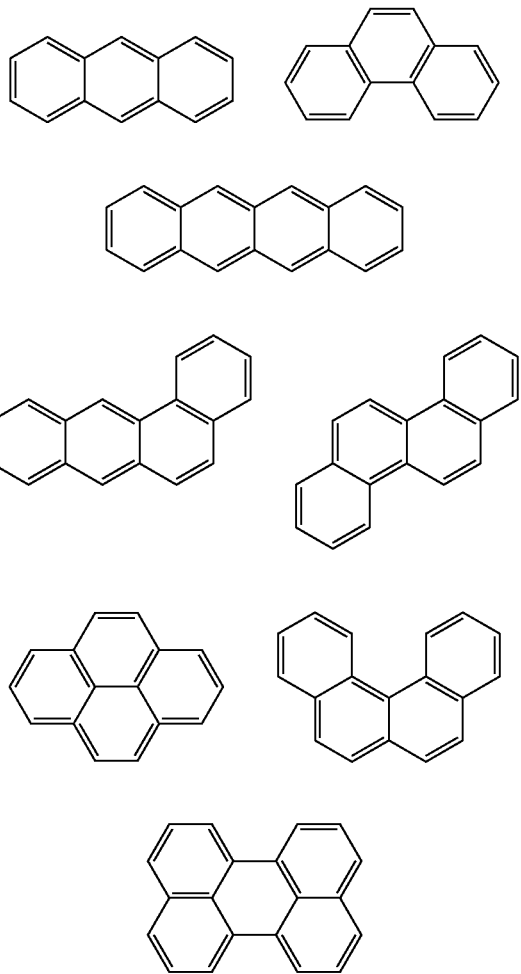

The alkyl groups represented by $R_{101}$ to $R_{106}$ and the alkyl groups in the alkoxy group, alkylcarbonyloxy group, alkylsulfonyloxy group, N-alkylamino group, and N-dialkylamino group represented by $R_{101}$ to $R_{106}$ preferably are alkyl groups having 1 to 12 carbon atoms and may be either linear alkyl groups or branched alkyl groups. Examples thereof include methyl group, ethyl group, propyl group, n-butyl group, sec-butyl group, hexyl group, 2-ethylhexyl group, and octyl group.

The cycloalkyl groups represented by $R_{101}$ to $R_{106}$ preferably are cycloalkyl groups having 3 to 30 carbon atoms and may be either monocyclic or polycyclic. Examples of the monocyclic groups include cyclopropyl group, cyclopentyl group, and cyclohexyl group. Examples of the polycyclic groups include adamantly group, norbornyl group, isobornyl group, dicyclopentyl group, α-pinel group, and tricyclodecanyl group.

The alkenyl groups represented by $R_{101}$ to $R_{106}$ preferably are alkenyl groups having 2 to 6 carbon atoms. Examples thereof include vinyl group, allyl group, butenyl group, and cyclohexenyl group.

The aryl groups represented by $R_{101}$ to $R_{106}$ preferably are aryl groups having 6 to 10 carbon atoms. Examples thereof include phenyl group, tolyl group, dimethylphenyl group, 2,4,6-trimethylphenyl group, naphthyl group, and anthryl group.

The aralkyl groups represented by $R_{101}$ to $R_{106}$ preferably are aralkyl groups having 7 to 12 carbon atoms. Examples thereof include benzyl group, phenethyl group, and naphthylmethyl group.

$R_{101}$ to $R_{106}$ may have substituents.

Examples of the substituents which may be possessed by $R_{101}$ to $R_{106}$ include ones having active hydrogen, such as amino group, amide group, ureido group, urethane group, hydroxyl group, and carboxyl group, halogen atoms (fluorine atom, chlorine atom, bromine atom, and iodine atom), alkoxy groups (e.g., methoxy group, ethoxy group, propoxy group, and butoxy group), thioether groups, acyl groups (e.g., acetyl group, propanoyl group, and benzoyl group), acyloxy groups (e.g., acetoxy group, propanoyloxy group, and benzoyloxy group), alkoxycarbonyl groups (e.g., methoxycarbonyl group, ethoxycarbonyl group, and propoxycarbonyl group), cyano group, and nitro group.

Preferred examples of $R_{101}$ to $R_{106}$ are hydroxy group, linear or branched alkyl groups having 1 to 6 carbon atoms, alkoxy groups having 1 to 6 carbon atoms, alkylcarbonyloxy groups having 1 to 6 carbon atoms, and phenyl group. More preferred examples thereof are hydroxy group, linear or branched alkyl groups having 1 to 4 carbon atoms (e.g., methyl group, ethyl group, n-propyl group, n-butyl group, and t-butyl group), alkoxy groups having 1 to 3 carbon atoms (e.g., methoxy group and ethoxy group), and phenyl group. Symbols a to f each preferably is an integer of 0 to 2.

In the fused polycyclic aromatic structure represented by Y, the bond linked to the main chain or the bond linked to each substituent may be located at any position in the fused polycyclic aromatic structure.

The alkali-soluble resin in the invention more preferably is a copolymer comprising repeating units having a monocyclic aromatic structure and repeating units having a polycyclic aromatic structure.

The content of the repeating units represented by formula (b-2) and/or (b-3) is preferably from 3 to 50% by mole, more preferably from 5 to 40% by mole, based on all repeating units.

Examples of the alkali-soluble resin having a fused polycyclic aromatic structure to be used in the invention are shown below, but the resin in the invention should not be construed as being limited to the following examples.

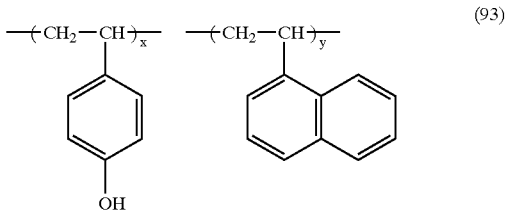
(93)

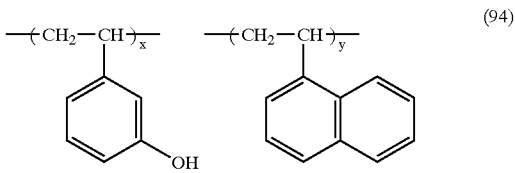
(94)

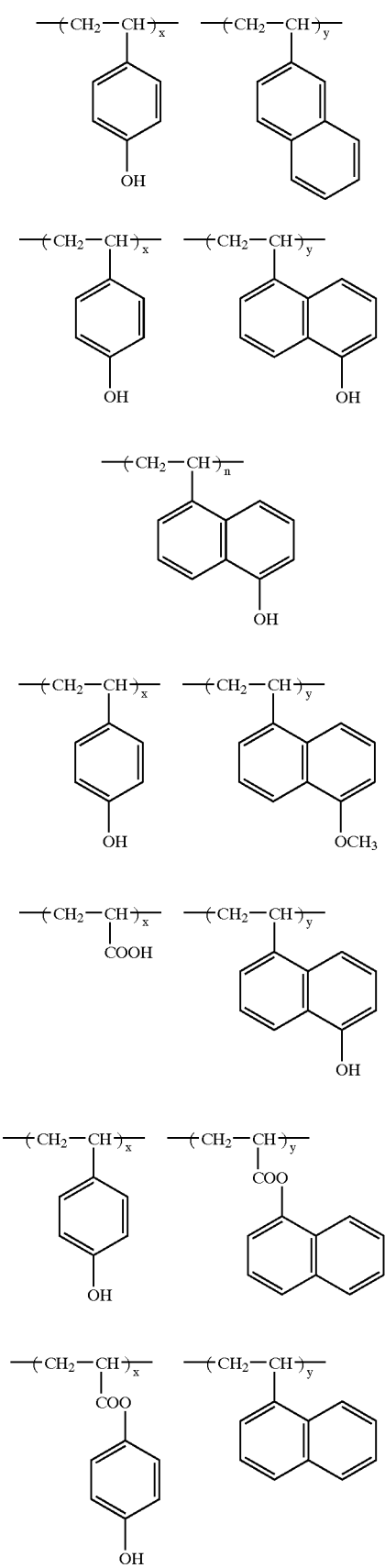
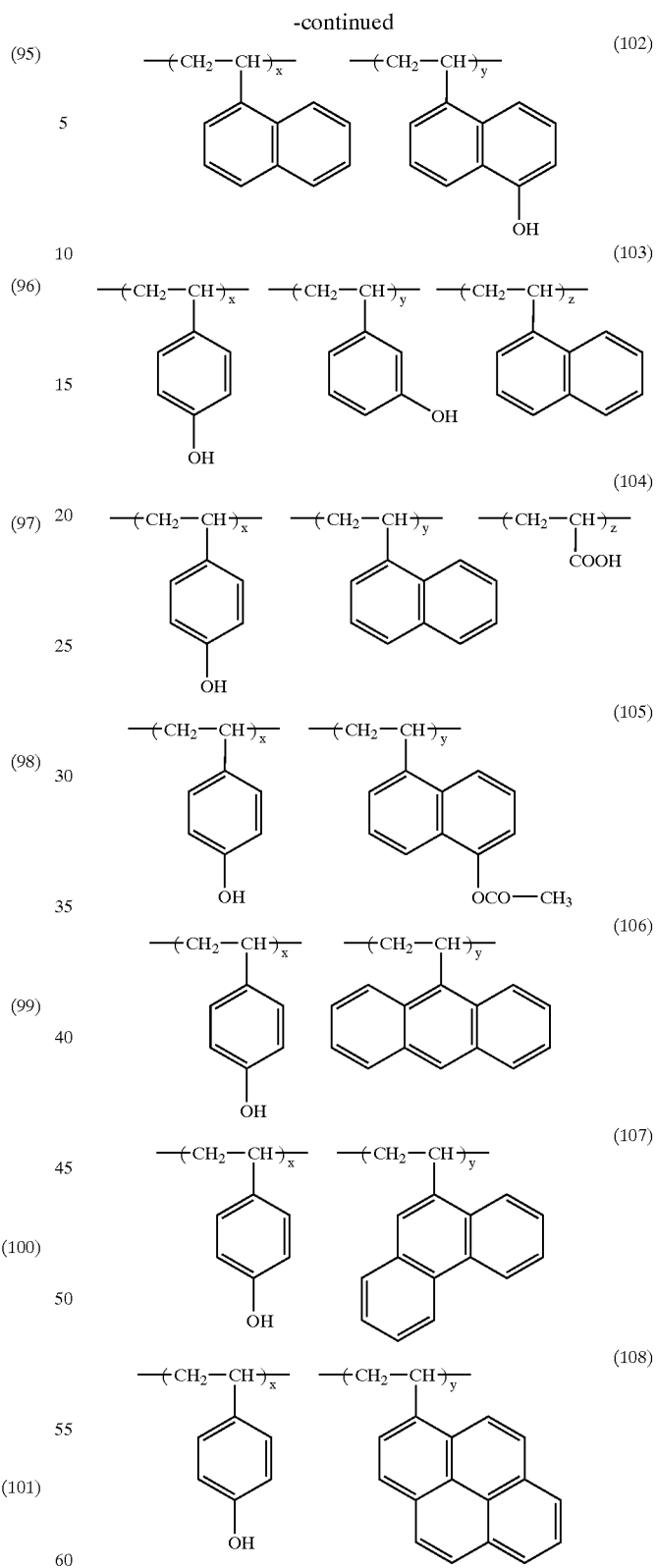
The molecular weight of the alkali-soluble resin to be used is in the range of preferably from 1,000 to 200,000, more preferably from 3,000 to 50,000, in terms of weight-average molecular weight. Values of weight-average molecular weight herein mean ones obtained through measurement by gel permeation chromatography and calculation for standard polystyrene.

The molecular weight distribution of the alkali-soluble resin to be used is generally from 1 to 10, preferably from 1 to 3, more preferably from 1 to 1.5. The narrower the molecular weight distribution of the alkali-soluble resin, the more the resist composition is satisfactory in resolution, resist pattern profile, and smoothness of resist pattern side walls, i.e., non-roughness properties.

The alkali-soluble resin can be synthesized by the methods described in *Macromolecules* (1995), 28(11), 3787–3789, *Polym. Bull.* (Berlin)(1990), 24(4), 385–389, and JP-A-8-286375. Namely, the target alkali-soluble resin can be obtained by radical polymerization or anionic living polymerization.

One alkali-soluble resin may be used alone or a mixture of two or more alkali-soluble resins may be used.

The rate of alkali dissolution of the alkali-soluble resin to be used is preferably 20 Å/sec or higher, especially preferably 200 Å/sec or higher, as measured with 0.261 N tetramethylammonium hydroxide (TMAH) (23° C.).

Although the alkali-soluble resin described above may be used as the only alkali-soluble resin, it can be used in combination with one or more other alkali-soluble resins. The optional alkali-soluble resins can be used in an amount of up to 100 parts by weight per 100 parts by weight of the alkali-soluble resin described above. Examples of the optionally usable alkali-soluble resins are shown below.

Examples thereof include novolac resins, hydrogenated novolac resins, acetone-pyrogallol resins, styrene/maleic anhydride copolymers, carboxyl-containing methacrylic resins, and derivatives of these. However, the optional alkali-soluble resins should not be construed as being limited to these examples.

The alkali-soluble resins are used in an amount of generally from 30 to 95% by weight, preferably from 40 to 90% by weight, more preferably from 50 to 80% by weight, based on all solid components of the composition.

[5] (E) Resin Increasing the Solubility in Alkaline Developing Solution by the Action of Acid The resin increasing the solubility in an alkaline developing solution by the action of an acid and is used in the positive type resist composition of the invention is a resin which has groups dissociable with an acid (hereinafter referred to also as "acid-dissociable groups") in the main chain or side chains of the resin or in both the main chain and side chains of the resin (hereinafter, this resin is referred to also as "acid-decomposable resin"). More preferred of such resins is a resin having acid-dissociable groups in side chains.

The group dissociable with an acid preferably are groups formed by replacing the hydrogen atoms of —COOH or —OH groups with groups eliminable with an acid. Such groups dissociate by the action of an acid to form —COOH or —OH groups and thereby enhance the solubility of the acid-decomposable resin in an alkaline developing solution.

Preferred examples of the acid-dissociable groups include silyl ether groups, cumyl ester groups, acetal groups, tetrahydropyranyl ether groups, enol ether groups, enol ester groups, tertiaryalkyl ether groups, tertiaryalkyl ester groups, and tertiary alkyl carbonate groups. More preferred are tertiary alkyl ester groups, tertiary alkyl carbonate groups, cumyl ester groups, acetal groups, and tetrahydropyranyl ether groups.

The base resin into which such acid-dissociable groups are to be incorporated as side chains may be an alkali-soluble resin having —OH or —COOH groups as side chains. Examples thereof include the alkali-soluble resins shown later.

Such alkali-soluble resins preferably have an alkali-dissolution rate of 170 Å/sec or higher as measured with 0.261 N tetramethylammonium hydroxide (TMAH) (23° C.). Especially preferred is an alkali-soluble resin having an alkali-dissolution rate of 330 Å/sec or higher.

From that standpoint, especially preferred alkali-soluble resins are alkali-soluble resins having hydroxystyrene structural units, such as poly(o-, m-, or p-hydroxystyrene) and copolymers of two or more of these hydroxystyrenes, hydrogenated poly (hydroxystyrene) s, halogen- or alkyl-substituted poly(hydroxystyrene)s, partly O-alkylated or O-acylated poly(hydroxystyrene)s, styrene/hydroxystyrene copolymers, α-methylstyrene/hydroxystyrene copolymers, and hydrogenated novolac resins.

Examples of preferred repeating units having an acid-dissociable group in the invention include t-butoxycarbonyloxystyrene, 1-alkoxyethoxystyrenes, and tertiary alkyl esters of (meth)acrylic acid.

Acid-decomposable resins can be obtained by reacting an alkali-soluble resin with a precursor for an acid-dissociable group or by copolymerizing a monomer for alkali-soluble resins which has an acid-dissociable group bonded thereto with various monomers, as disclosed, e.g., in European Patent 254,853, JP-A-2-25850, JP-A-3-223860, and JP-A-4-251259.

Specific examples of the acid-decomposable resin are shown below, but the resin should not be construed as being limited thereto:

p-t-butoxystyrene/p-hydroxystyrene copolymers,
p-(t-butoxycarbonyloxy)styrene/p-hydroxystyrene copolymers,
p-(t-butoxycarbonylmethyloxy)styrene/p-hydroxystyrene copolymers,
4-(t-butoxycarbonylmethyloxy)-3-methylstyrene/4-hydroxy-3-m ethylstyrene copolymers,
p-(t-butoxycarbonylmethyloxy)styrene/p-hydroxystyrene (10% hydrogenated) copolymers,
m-(t-butoxycarbonylmethyloxy)styrene/m-hydroxystyrene copolymers,
o-(t-butoxycarbonylmethyloxy)styrene/o-hydroxystyrene copolymers,
p-(cumyloxycarbonylmethyloxy)styrene/p-hydroxystyrene copolymers,
cumyl methacrylate/methyl methacrylate copolymers,
4-t-butoxycarbonylstyrene/dimethyl maleate copolymers,
benzyl methacrylate/tetrahydropyranyl methacrylate copolymers,
p-(t-butoxycarbonylmethyloxy)styrene/p-hydroxystyrene/styrene copolymers,
p-t-butoxystyrene/p-hydroxystyrene/fumaronitrile copolymers,
t-butoxystyrene/hydroxyethyl methacrylate copolymers,
styrene/N-(4-hydroxyphenyl)maleimide/N-(4-t-butoxycarbonylo xyphenyl)maleimide copolymers,
p-hydroxystyrene/t-butyl methacrylate copolymers,
styrene/p-hydroxystyrene/t-butylmethacrylate copolymers,
p-hydroxystyrene/t-butyl acrylate copolymers,
styrene/p-hydroxystyrene/t-butyl acrylate copolymers,
p-(t-butoxycarbonylmethyloxy)styrene/p-hydroxystyrene/N-met hylmaleimide copolymers,
t-butyl methacrylate/1-adamantylmethyl methacrylate copolymers,
p-hydroxystyrene/t-butyl acrylate/p-acetoxystyrene copolymers,
p-hydroxystyrene/t-butyl acrylate/p-(t-butoxycarbonyloxy)styrene copolymers,
p-hydroxystyrene/t-butyl acrylate/p-(t-butoxycarbonylmethyloxy)styrene copolymers, and
the following polymers.

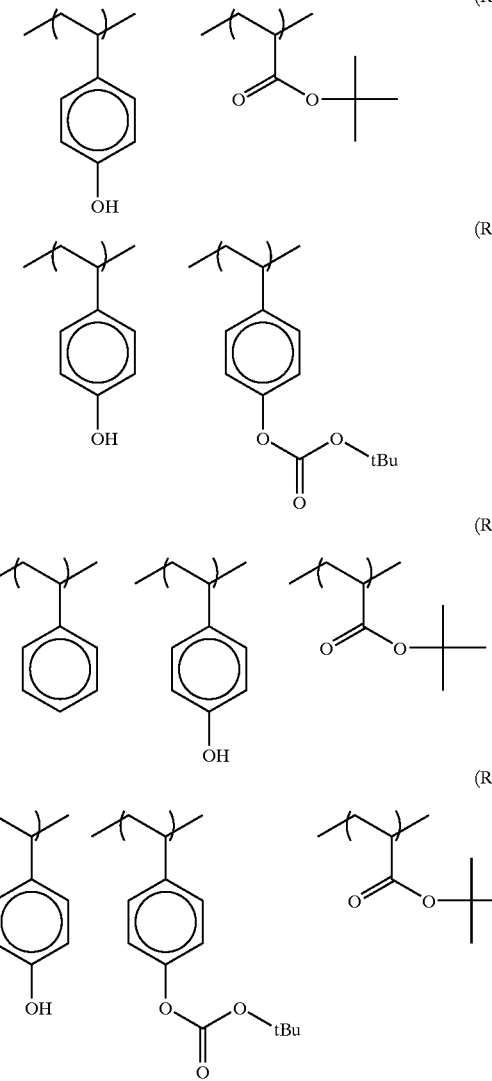

In the examples shown above, tBu represents t-butyl.

The acid-decomposable resin preferably is a resin (R) having repeating units represented by the following formula (IV) and repeating units represented by the following formula (V). The resin (R) having repeating units represented by formula (IV) and repeating units represented by formula (V) is preferred because it improves resolution and sensitivity.

(IV)

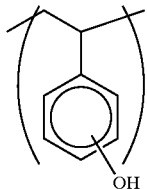

(V)

In formula (IV), L represents a hydrogen atom, an optionally substituted, linear, branched, or cyclic alkyl group, or an optionally substituted aralkyl group. Z represents an optionally substituted, linear, branched, or cyclic alkyl group or an optionally substituted aralkyl group. Z and L may be bonded to each other to form a five- or six-membered ring.

Examples of the alkyl groups represented by L and Z in formula (IV) include linear, branched, or cyclic ones having 1 to 20 carbon atoms, such as methyl group, ethyl group, propyl group, isopropyl group, n-butyl group, isobutyl group, t-butyl group, pentyl group, cyclopentyl group, hexyl group, cyclohexyl group, octyl group, and dodecyl group.

Preferred examples of substituents which may be possessed by the alkyl groups represented by L and Z include alkyl groups, alkoxy groups, hydroxyl group, halogen atoms, nitro group, acyl groups, acyloxy groups, acylamino groups, sulfonylamino groups, alkylthio groups, arylthio groups, aralkylthio groups, thiophenecarbonyloxy group, thiophenemethylcarbonyloxy group, and heterocycle residues such as a pyrrolidone residue. Such substituents preferably have up to 12 carbon atoms.

Examples of the alkyl groups having one or more substituents include cyclohexylethyl, alkylcarbonyloxymethyl groups, alkylcarbonyloxyethyl groups, arylcarbonyloxyethyl groups, aralkylcarbonyloxyethyl groups, alkyloxymethyl groups, aryloxymethyl groups, aralkyloxymethyl groups, alkyloxyethyl groups, aryloxyethyl groups, aralkyloxyethyl groups, alkylthiomethyl groups, arylthiomethyl groups, aralkylthiomethyl groups, alkylthioethyl groups, arylthioethyl groups, and aralkylthioethyl groups.

The alkyl groups in those groups are not particularly limited, and may be any of chain, cyclic, and branched ones. They may have substituents such as, e.g., any of the alkyl and alkoxy groups enumerated above.

Examples of the alkylcarbonyloxyethyl groups include cyclohexylcarbonyloxyethyl, t-butylcyclohexylcarbonyloxyethyl, and n-butylcyclohexylcarbonyloxyethyl.

The aryl groups also are not particularly limited. However, examples thereof generally include aryl groups having 6 to 14 carbon atoms, such as phenyl group, xylyl group, toluyl group, cumenyl group, naphthyl group, and anthranyl group. The aryl groups may have substituents such as, e.g., any of the alkyl and alkoxy groups enumerated above.

Examples of the aryloxyethyl groups include phenyloxyethyl group and cyclohexylphenyloxyethyl group.

The aralkyl groups also are not particularly limited. However, examples thereof include benzyl group.

Examples of the aralkylcarbonyloxyethyl groups include benzylcarbonyloxyethyl group.

Examples of the aralkyl groups represented by L and Z in formula (IV) include ones having 7 to 15 carbon atoms, such as substituted or unsubstituted benzyl and substituted or unsubstituted phenethyl.

Preferred examples of substituents which may be possessed by the aralkyl groups include alkoxy groups, hydroxyl, halogen atoms, nitro group, acyl groups, acylamino groups, sulfonylamino groups, alkylthio groups, arylthio groups, and aralkylthio groups. Examples of the aralkyl groups having one or more substituents include alkoxybenzyl groups, hydroxybenzyl, and phenylthiophenethyl. Each substituent which may be possessed by the aralkyl group represented by L or Z preferably has up to 12 carbon atoms.

As described above, the substituted alkyl group or substituted aralkyl group may have at the end a bulky group, such as phenyl or cyclohexyl. The incorporation of such bulky groups contributes to diminution of edge roughness.

Examples of the five- or six-membered ring formed by L and Z bonded to each other include a tetrahydropyran ring and tetrahydrofuran ring.

In the resin described above, the proportion of the repeating units represented by formula (IV) to the repeating units represented by formula (V) is preferably from 1/99 to 60/40, more preferably from 5/95 to 50/50, most preferably from 10/90 to 40/60.

The acid-decomposable resin (R) having repeating units represented by formula (IV) and repeating units represented by formula (V) may have repeating units derived from one or more other monomers.

Examples of the optional monomers include hydrogenated hydroxystyrene, halogen-, alkoxy-, or alkyl-substituted hydroxystyrenes, styrene, halogen-, alkoxy-, acyloxy-, or alkyl-substituted styrenes, maleic anhydride, acrylic acid derivatives, methacrylic acid derivatives, and N-substituted maleimides. However, the optional monomers should not be construed as being limited to these examples.

The proportion of the repeating units represented by formulae (IV) and (V) to the repeating units derived from other monomer(s) is such that the [(IV)+(V)]/[units of other monomer(s)] molar ratio is generally from 100/0 to 50/50, preferably from 100/0 to 60/40, more preferably from 100/0 to 70/30.

Specific examples of the acid-decomposable resin (R) having repeating units represented by formula (IV) and repeating units represented by formula (V) are shown below. However, the acid-decomposable resin to be used in the invention should not be construed as being limited to the following examples.

(R-1)

(R-2)

-continued

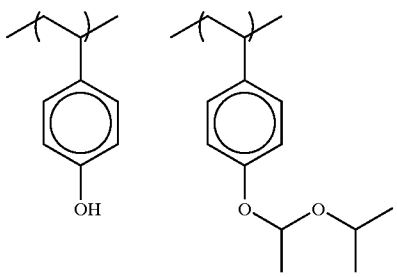
(R-3)

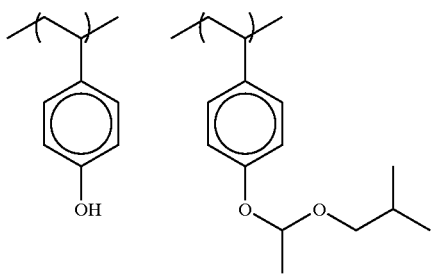
(R-4)

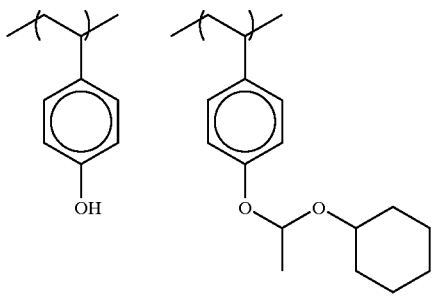
(R-5)

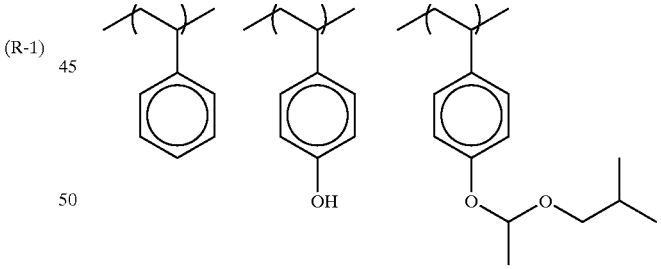
(R-6)

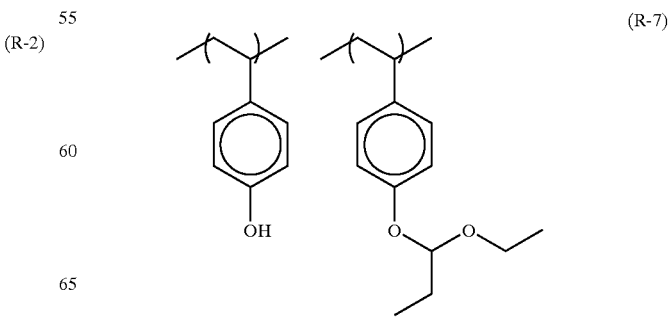
(R-7)

(R-8)
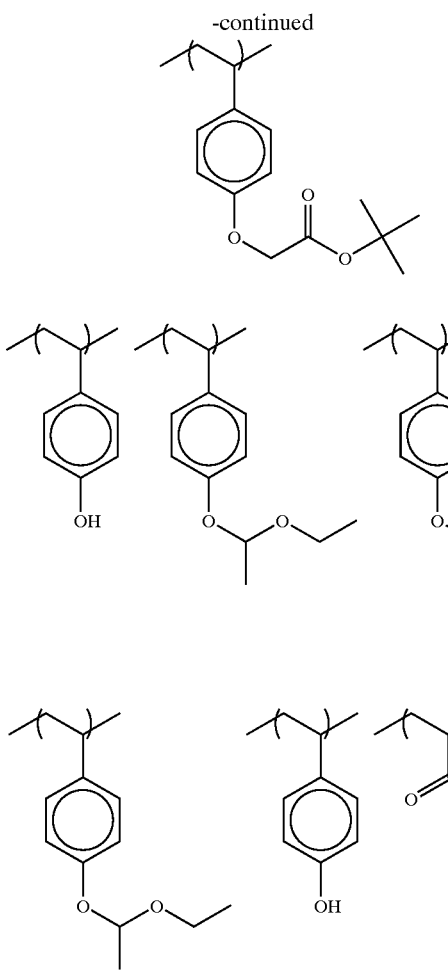
(R-9)
(R-10)
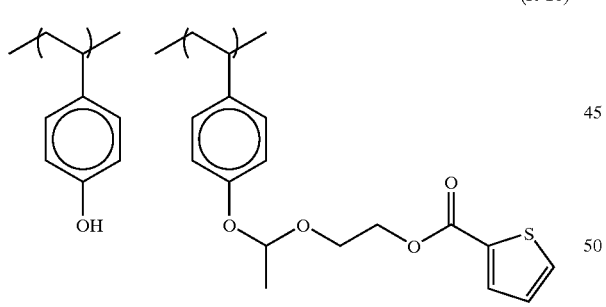
(R-11)
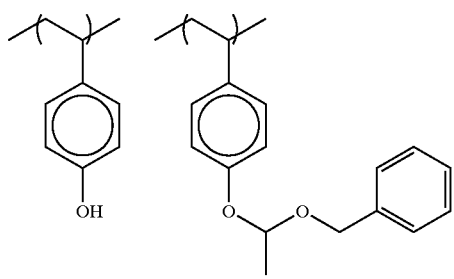
(R-12)
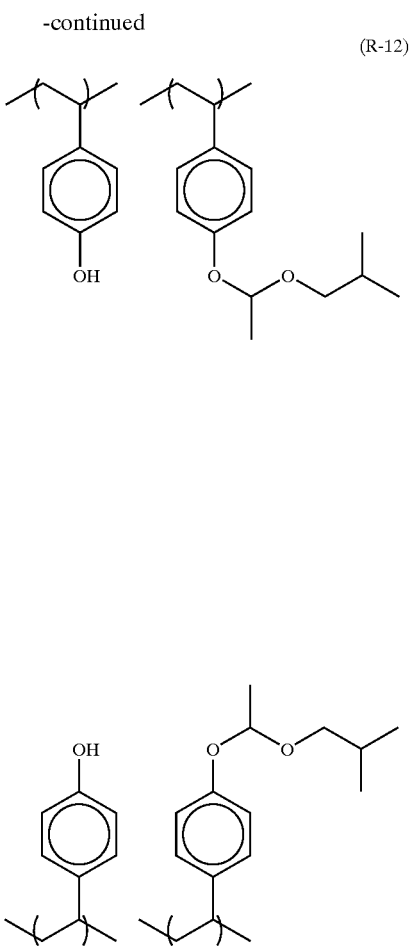
(R-13)
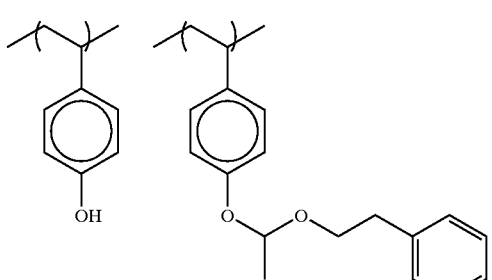
(R-14)
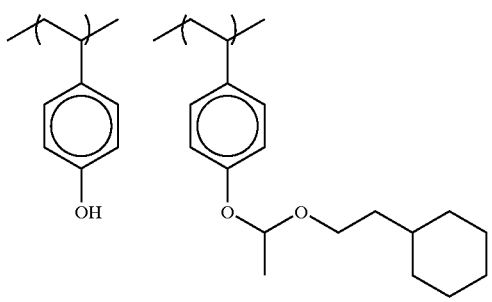

(R-15)
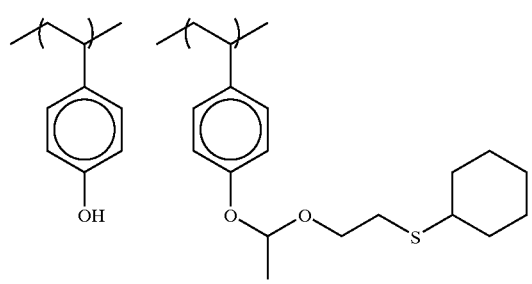

(R-16)
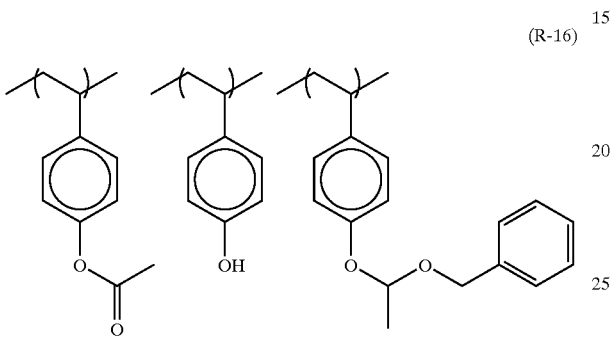

(R-17)
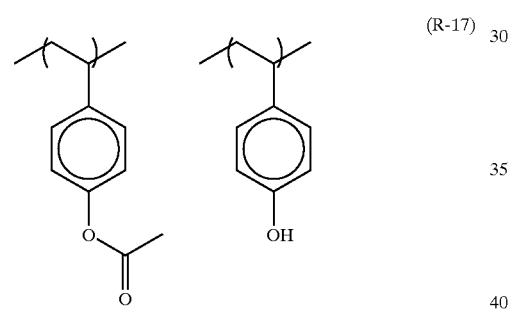

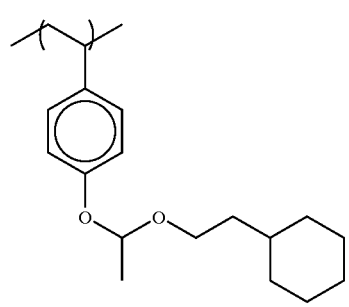

(R-18)
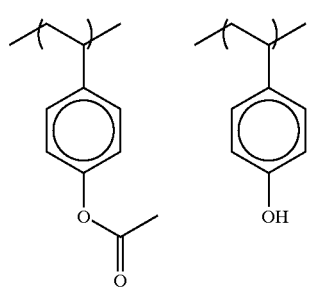

(R-19)
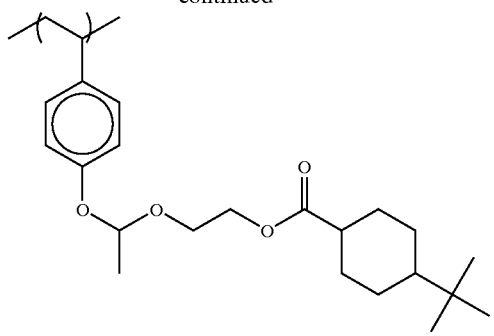

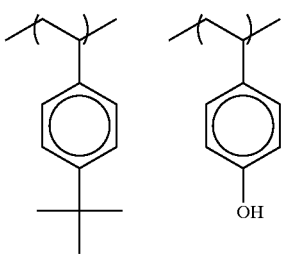

(R-20)
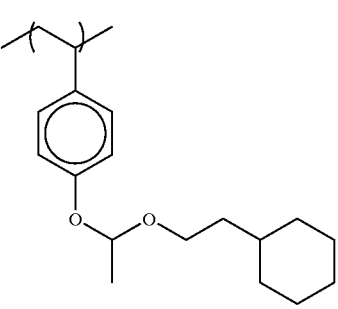

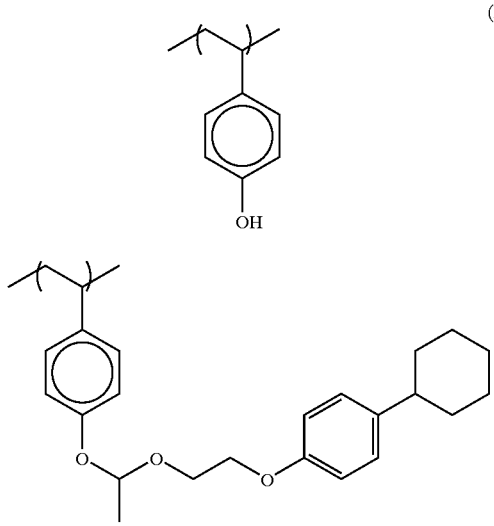

In the examples shown above, tBu represents t-butyl.

The content of acid-dissociable groups in the resin is expressed by means of the number of the acid-dissociable groups in the resin (B) and the number of alkali-soluble groups not protected by an acid-eliminable group (S), i.e., expressed in terms of B/(B+S). The content thereof is preferably from 0.01 to 0.7, more preferably from 0.05 to 0.50, most preferably from 0.05 to 0.40.

In the case where the positive type resist composition of the invention is to be irradiated with ArF excimer laser light, the acid-decomposable resin preferably is a resin which has a monocyclic or polycyclic, aliphatic hydrocarbon structure and which comes to have enhanced solubility in an alkaline developing solution by the action of an acid.

In the case where the positive type resist composition of the invention is to be irradiated with $F_2$ excimer laser light, the acid-decomposable resin preferably is a resin which has one or more fluorine-substituted structures in the main chain and/or side chains of the polymer backbone and which comes to have enhanced solubility in an alkaline developing solution by the action of an acid. More preferred is a fluorinated-group-containing resin which has at least one part selected from perfluoroalkylene groups and perfluoroarylene groups in the main chain of the polymer backbone or which has, incorporated in side chains of the polymer backbone, at least one part selected from perfluoroalkyl groups, perfluoroaryl groups, hexafluoro-2-propanol, and groups formed by protecting the OH group of hexafluoro-2-propanol.

The weight-average molecular weight of the acid-decomposable resin is preferably from 1,000 to 200,000 as measured by GPC and calculated for standard polystyrene. Weight-average molecular weights thereof lower than 1,000 are not so desirable because use of such a resin results in reduced heat resistance and impaired dry etching resistance. In case where the weight-average molecular weight thereof exceeds 200,000, not only developability is impaired but also the composition has an exceedingly increased viscosity, which gives undesirable results such as, e.g., impaired film-forming properties.

In the positive type resist composition of the invention, the amount of the acid-decomposable resin in the whole composition is preferably from 40 to 99.99% by weight, more preferably from 50 to 99.97% by weight, based on all solid components of the resist.

[6] (C) Crosslinking agent Carrying Out an Addition Reaction with Alkali-Soluble Resin by the Action of an Acid The negative type resist composition of the invention contains, in combination with the alkali-soluble resin, a crosslinking agent undergoing an addition reaction with the alkali-soluble resin by the actin of an acid (hereinafter referred to also as "component (c)" or "crosslinking agent"). Known crosslinking agents can be effectively used here.

Preferred are: compounds or resins each having two or more hydroxymethyl, alkoxymethyl, acyloxymethyl, or alkoxymethyl ether groups; and epoxy compounds.

More preferred examples thereof include alkoxymethylated or acyloxymethylated melamine compounds or resins, alkoxymethylated or acyloxymethylated urea compounds or resins, hydroxymethylated or alkoxymethylated phenol compounds or resins, and phenol compounds or resins etherified with an alkoxymethyl.

Specifically, phenol derivatives can be used as the crosslinking agent. Preferred examples thereof include phenol derivatives which have a molecular weight of 1,200 or lower, contain three to five benzene rings in the molecule, and have two or more hydroxymethyl or alkoxymethyl groups bonded to only one of or limited part of the benzene rings or bonded dispersedly to the benzene rings. By using such a phenol derivative, the effects of the invention can be produced more markedly.

The alkoxymethyl groups bonded to the benzene rings preferably are ones having up to 6 carbon atoms. Preferred examples thereof include methoxymethyl group, ethoxymethyl group, n-propoxymethyl group, isopropoxymethyl group, n-butoxymethyl group, isobutoxymethyl group, sec-butoxymethyl group, and t-butoxymethyl group. Also preferred are alkoxy-substituted alkoxy groups such as 2-methoxyethyl group and 2-methoxy-1-propyl group.

Especially preferred of those phenol derivatives are shown below.

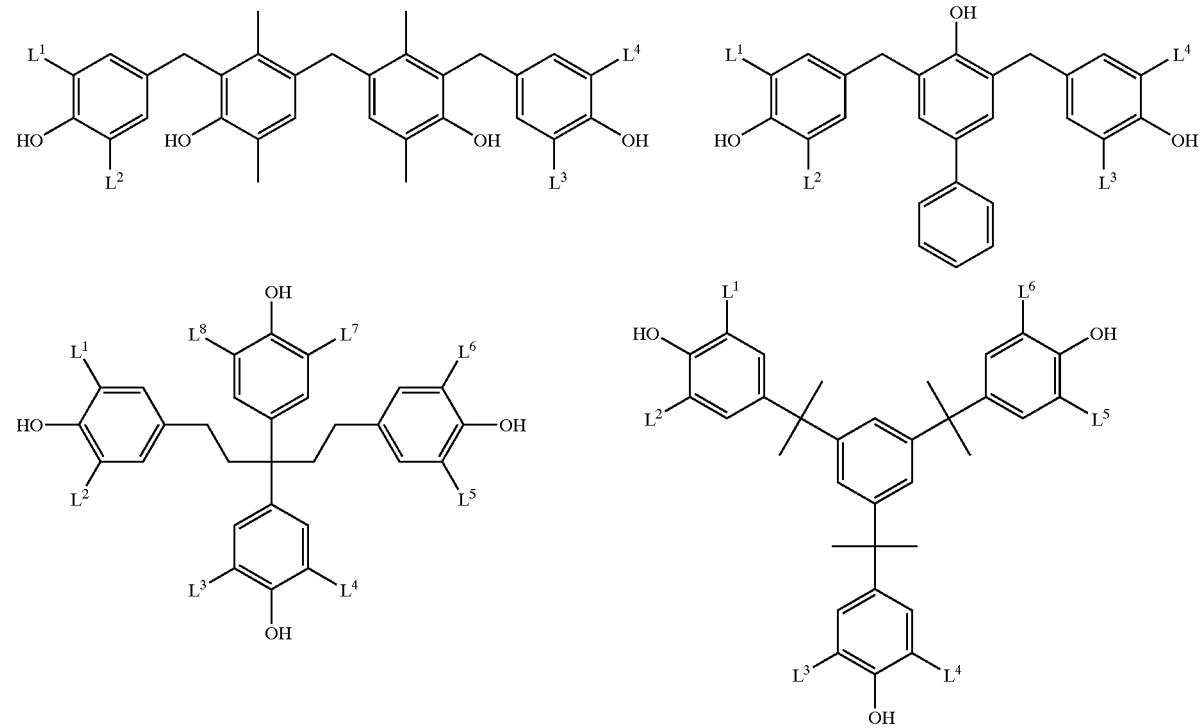

-continued
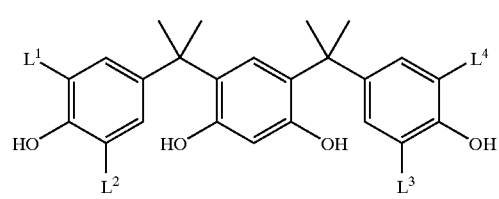
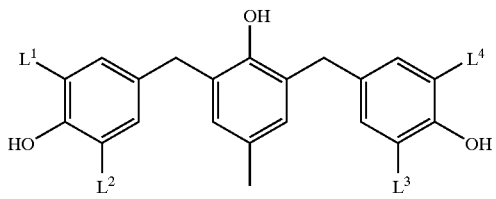
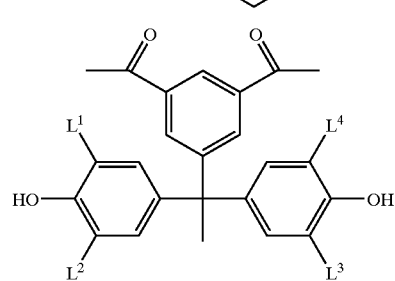
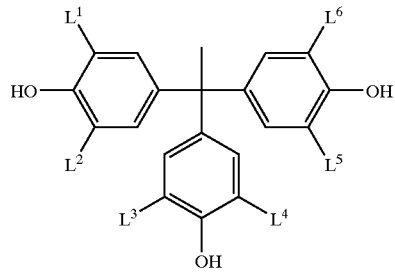
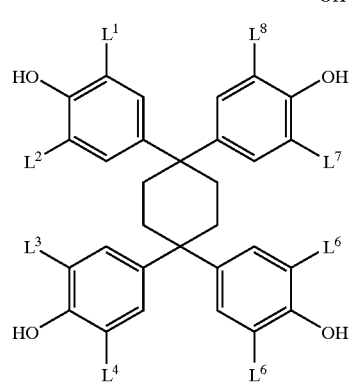
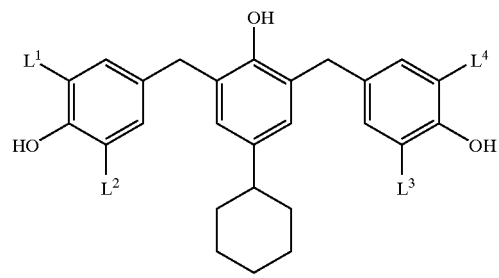
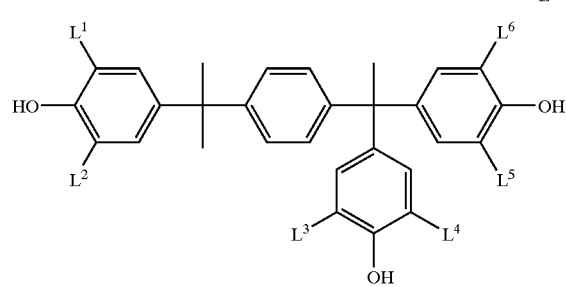
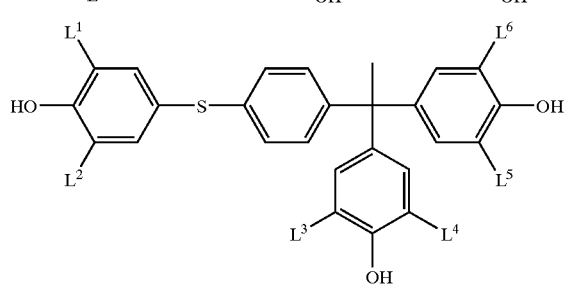
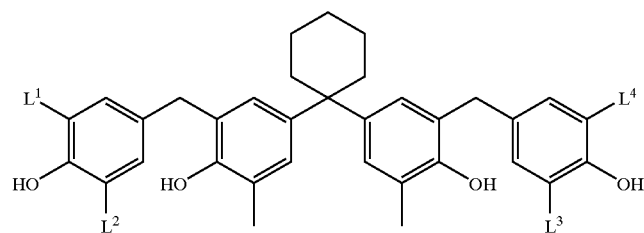
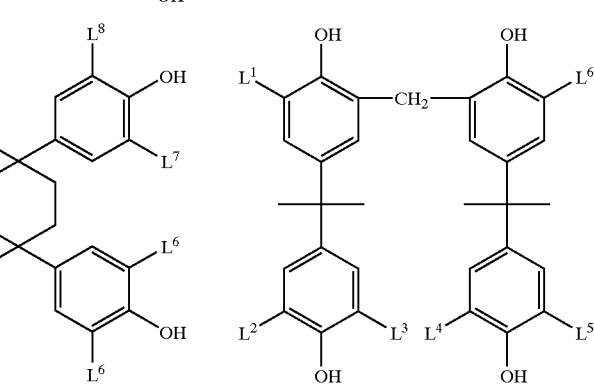
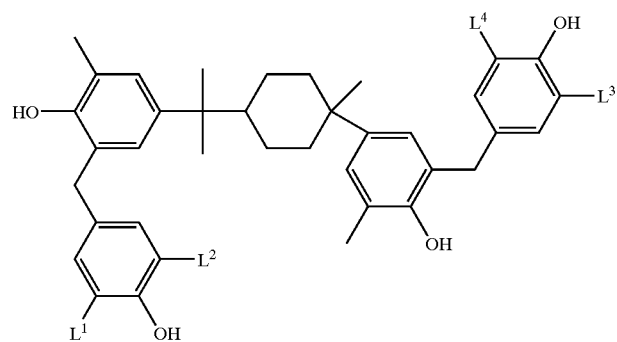
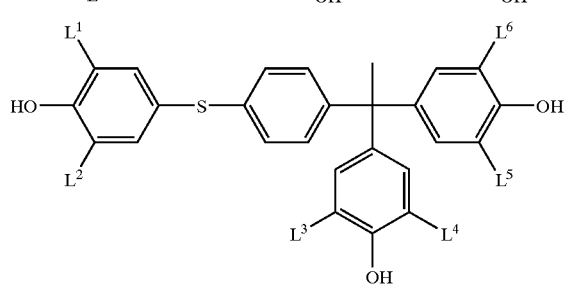

-continued

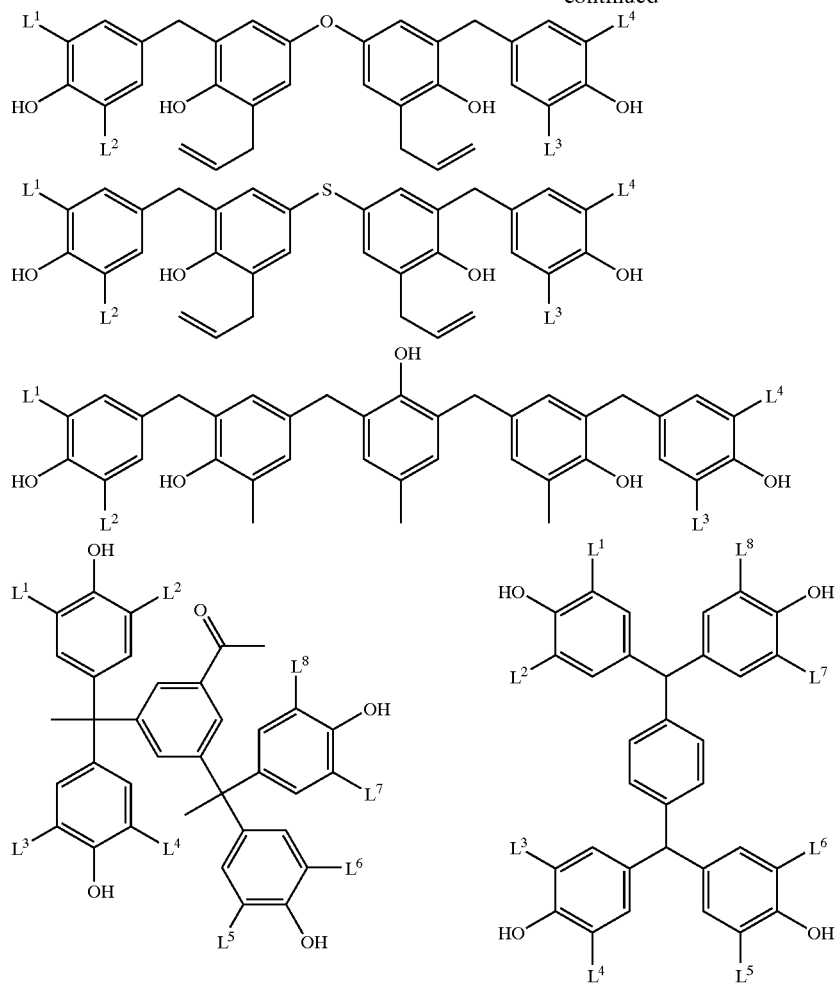

In the formulae, $L^1$ to $L^8$ may be the same or different, and each represent hydroxymethyl, methoxymethyl, or ethoxymethyl.

The phenol derivatives having hydroxymethyl groups can be obtained by reacting the corresponding phenol compounds having no hydroxymethyl group (the compounds represented by the formulae wherein $L^1$ to $L^8$ each are a hydrogen atom) with formaldehyde in the presence of a base catalyst. This reaction preferably is conducted at a temperature of 60° C. or lower in order to prevent resin formation or gelation. Specifically, the target phenol derivatives can be synthesized by the methods described, e.g., in JP-A-6-282067 and JP-A-7-64285.

The phenol derivatives having alkoxymethyl groups can be obtained by reacting the corresponding phenol derivatives having hydroxymethyl groups with an alcohol in the presence of an acid catalyst. This reaction preferably is conducted at a temperature of 100° C. or lower in order to prevent resin formation or gelation. Specifically, the target phenol derivatives can be synthesized by the method described, e.g., in EP 632,003 A1.

The hydroxymethyl- or alkoxymethyl-containing phenol derivatives thus synthesized are preferred from the standpoint of stability during storage. However, the phenol derivatives having alkoxymethyl groups are especially preferred from the standpoint of stability during storage.

Such phenol derivatives, which have two or more hydroxymethyl or alkoxymethyl groups bonded to one of or limited part of the benzene rings or bonded dispersedly to the benzene rings, may be used alone or in combination of two or more thereof.

Besides the phenol derivatives described above, the following compounds (i) and (ii) can be used as the crosslinking agent.

(i) Compounds having N-hydroxymethyl groups, N-alkoxymethyl groups, or N-acyloxymethyl groups (ii) Epoxy compounds The crosslinking agent is used in an amount of generally from 3 to 65% by weight, preferably from 5 to 50% by weight, based on all solid components of the resist composition. In case where the amount of the crosslinking agent added is less than 3% by weight, the retention of film thickness decreases. On the other hand, amounts thereof exceeding 65% by weight are not so desirable because resolution decreases and the resist fluid may have insufficient storage stability.

In the invention, any of the phenol derivatives described above can be used in combination with one or more other crosslinking agents such as, e.g., compounds (i) and (ii) shown above.

Such optional crosslinking agents may be used in such an amount that the proportion by mole of the phenol derivatives to the optional crosslinking agents is generally from 100/0 to 20/80, preferably from 90/10 to 40/60, more preferably from 80/20 to 50/50.

Those crosslinking agents will be described below in detail.

(i) Examples of the compounds having N-hydroxymethyl groups, N-alkoxymethyl groups, or N-acyloxymethyl groups include the monomer and oligomer/melamine/formaldehyde condensates and urea/formaldehyde condensates disclosed in European Patent Publication (hereinafter referred to as "EP-A") No. 0,133,216 and West German Patents 3,634,671 and 3,711,264, the alkoxy-substituted compounds disclosed in EP-A No. 0,212,482, and benzoguanamine/formaldehyde condensates.

Preferred examples thereof include melamine/formaldehyde condensates having at least two free N-hydroxymethyl, N-alkoxymethyl, or N-acyloxymethyl groups. Especially preferred of these are N-alkoxymethyl derivatives.

(ii) Examples of the epoxy compounds include monomeric, dimeric, oligomeric, and polymeric epoxy compounds containing one or more epoxy groups. Specific examples thereof include products of the reaction of bisphenol A with epichlorohydrin and products of the reaction of a low-molecular phenol/formaldehyde resin with epichlorohydrin. Other examples thereof include the epoxy resins in use which are described in U.S. Pat. No. 4,026,705 and British Patent 1,539,192.

[7] Dissolution Inhibitive Compound Increasing the Solubility in Alkaline Developing Solution by the Action of Acid The dissolution inhibitive compound increasing the solubility in an alkaline developing solution by the action of an acid (hereinafter referred to also as "dissolution inhibitive compound") preferably is a compound having a molecular weight of 3,000 or lower and is an alicyclic or aliphatic compound having acid-dissociable groups, such as the cholic acid derivative containing acid-dissociable groups which is described in *Proceeding of SPIE*, 2724, 355(1996), so as not to impair transmission of light of 220 nm or shorter. Examples of the acid-dissociable groups include the same acid-dissociable groups enumerated above with regard to the acid-decomposable resin.

In the case where the resist composition of the invention is to be exposed with a KrF excimer laser or irradiated with electron beams, it is preferred to use a phenol compound in which the phenolic hydroxyl groups have been replaced with acid-dissociable groups. The phenol compound preferably is one comprising from one to nine phenol frameworks. More preferably, it comprises from two or six phenol frameworks.

The molecular weight of the dissolution inhibitive compound in the invention is generally 3,000 or lower, preferably from 300 to 3,000, more preferably from 500 to 2,500.

The amount of the dissolution inhibitive compound to be added is preferably from 3 to 50% by weight, more preferably from 5 to 40% by weight, based on all solid components of the resist composition.

Specific examples of the dissolution inhibitive compound are shown below, but this compound should not be construed as being limited to the following examples.

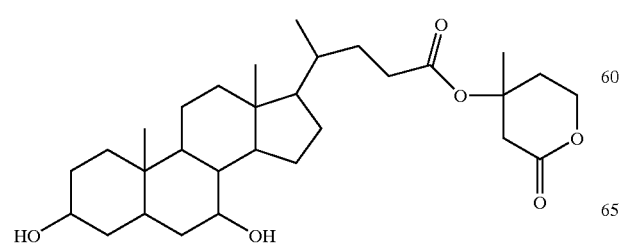

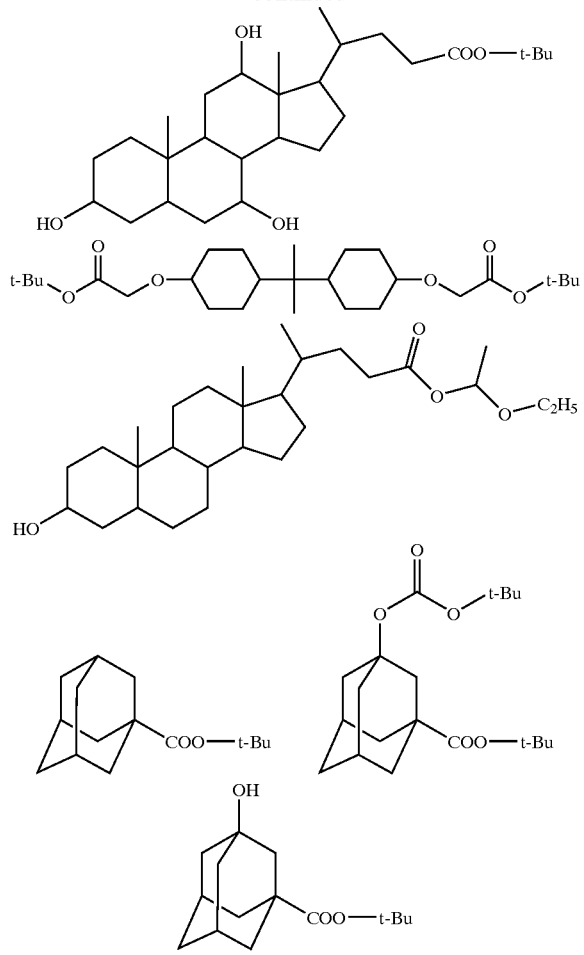

[8] Other Ingredients Usable in Compositions of the Invention

Ingredients such as, e.g., a nitrogen-containing basic compound, dye, surfactant, plasticizer, photodecomposable basic compound, and photo-base generator may be contained in the resist compositions of the invention according to need.

[8-1] (D) Nitrogen-Containing Basic Compound

Preferred nitrogen-containing basic compounds usable in the invention are compounds having higher basicity than phenol.

Examples of preferred chemical environments include structures represented by the following formulae (A) to (E) The structures (A) to (E) each may be part of a ring structure.

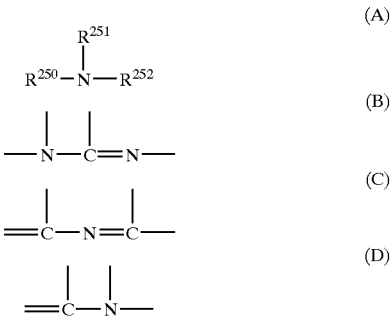

-continued

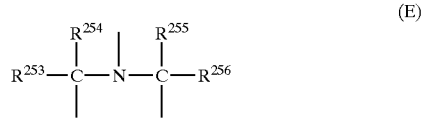

(E)

In the formulae, $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atom, or a substituted or unsubstituted aryl group having 6 to 20 carbon atoms, provided that $R^{251}$ and $R^{252}$ may be bonded to each other to form a ring.

$R^{253}$, $R^{254}$, $R^{255}$, and $R^{256}$ may be the same or different and each represent an alkyl group having 1 to 6 carbon atoms.

More preferred compounds are nitrogen-containing basic compounds having per molecule two or more nitrogen atoms differing in chemical environment. Especially preferred are compounds containing both a substituted or unsubstituted amino group and a cyclic structure containing one or more nitrogen atoms and compounds having an alkylamino group.

Preferred examples thereof include substituted or unsubstituted guanidine, substituted or unsubstituted aminopyridine, substituted or unsubstituted aminoalkylpyridines, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted amino morpholine, and substituted or unsubstituted aminoalkylmorpholines. Preferred substituents are amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano.

Especially preferred examples of these compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the basic compounds should not be construed as being limited to these examples.

Those nitrogen-containing basic compounds may be used alone or in combination of two or more thereof.

The proportion of the acid generators (A1) and (A2) to the nitrogen-containing basic compound in the composition is preferably such that the (acid generators (A1) and (A2))/(nitrogen-containing basic compound) molar ratio is from 2.5 to 300. When this molar ratio is less than 2.5, there are cases where the composition has reduced sensitivity and reduced resolution. When the ratio exceeds 300, there are cases where the resist pattern line width becomes large with time after exposure until heat treatment and resolution also becomes poor. The (acid generators (A1) and (A2))/(nitrogen-containing basic compound) molar ratio is preferably from 5.0 to 200, more preferably from 7.0 to 150.

[8-2] Dye

Suitable dyes include oil-soluble dyes and basic dyes. Examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries, Ltd.), crystal violet (CI 42555), methyl violet (CI 42535), rhodamine B (CI 45170B), malachite green (CI 42000), and methylene blue (CI 52015).

[8-3] Solvent

The compositions of the invention, which are applied to a substrate, are prepared by dissolving the ingredients described above in a solvent therefor. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, and tetrahydrofuran. These solvents may be used alone or as a mixture of two or more thereof.

[8-4] Fluorine-Based and/or Silicon-Based Surfactant

The resist compositions of the invention preferably contain any one of or two or more of fluorine-based and/or silicon-based surfactant (fluorine-based surfactant, silicon-based surfactant and surfactant containing both fluorine and silicon atoms).

When the resist compositions of the invention contain a fluorine-based and/or silicon-based surfactant, they can show satisfactory sensitivity and resolution when irradiated with an exposure light source having a wavelength of 250 nm or shorter, especially 220 nm or shorter, and give a resist pattern having satisfactory adhesion and reduced in development defects.

Examples of those surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511, and 5,824,451. It is also possible to use the following commercial surfactants as they are.

Examples of usable commercial surfactants include fluorine-based and/or silicon-based surfactants such as F-Top EF301 and FE303 (manufactured by New Akita Chemical Company), Fluorad FC430 and 431 (manufactured by Sumitomo 3M Ltd.), Megafac F171, F173, F176, F189, and R08 (manufactured by Dainippon Ink & Chemicals, Inc.), Surflon S-382 and SC101, 102, 103, 104, 105, and 106 (manufactured by Asahi Glass Co., Ltd.), and Troy Sol S-366 (manufactured by Troy Chemical Co., Ltd.). Polysiloxane polymer KP-341 (manufactured by Shin-Etsu Chemical Co., Ltd.) can also be used as a silicone-based surfactant.

Also usable besides the known surfactants shown above is a surfactant comprising a polymer having a fluoroaliphatic group and derived from a fluoroaliphatic compound produced by the telomerization method (also called telomer method) or oligomerization method (also called oligomer method). The fluoroaliphatic compound can be synthesized by the method described in JP-A-2002-90991.

The polymer having a fluoroaliphatic group preferably is a copolymer of a monomer having a fluoroaliphatic group with a poly(oxyalkylene) acrylate and/or a poly(oxyalkylene) methacrylate. This copolymer may be one in which the monomer units are randomly distributed or be a block copolymer. Examples of the poly(oxyalkylene) group include poly(oxyethylene), poly(oxypropylene), and poly(oxybutylene). The poly(oxyalkylene) group may be a unit having, in the same chain, alkylenes having different chain lengths, such as a poly(blocks of oxyethylene, oxypropylene, and oxyethylene) or poly(blocks of oxyethylene and oxypropylene) group. The copolymer of a monomer having a fluoroaliphatic group with a poly(oxyalkylene) acrylate (or methacrylate) is not limited to binary copolymers, and may be a copolymer of three or more monomers which is obtained by copolymerization in which two or more different monomers each having a fluoroaliphatic group, two or more different poly(oxyalkylene) acrylates (or methacrylates), etc. are simultaneously copolymerized.

Examples of commercial surfactants include Megafac F178, F-470, F-473, F-475, F-476, and F-472 (manufactured by Dainippon Ink & Chemicals, Inc.). Examples of the polymer having a fluoroaliphatic group further include a copolymer of an acrylate (or methacrylate) having a $C_6F_{13}$ group with a poly(oxyalkylene) acrylate (or methacrylate), a copolymer of an acrylate (or methacrylate) having a $C_6F_{13}$ group with poly(oxyethylene) acrylate (or methacrylate) and poly(oxypropylene) acrylate (or methacrylate), a copolymer of an acrylate (or methacrylate) having a $C_8F_{17}$ group with a poly(oxyalkylene) acrylate (or methacrylate), and a copolymer of an acrylate (or methacrylate) having a $C_8F_{17}$ group with poly(oxyethylene) acrylate (or methacrylate) and poly(oxypropylene) acrylate (or methacrylate).

The amount of the fluorine-based and/or silicon-based surfactant to be used is preferably from 0.0001 to 2% by weight, more preferably from 0.001 to 1% by weight, based on the total amount of each resist composition (excluding the solvent).

[8-5] Plasticizer

Examples of plasticizers usable in the resist compositions of the invention include compounds shown in JP-A-4-212960, JP-A-8-262720, European Patents 735,422, 416,873, and 439,371, and U.S. Pat. No. 5,846,690. Specific examples thereof include di(2-ethylhexyl) adipate, n-hexyl benzoate, di-n-octyl phthalate, di-n-butyl phthalate, benzyl n-butyl phthalate, and dihydroabietyl phthalate.

[8-6] Photodecomposable Base Compound

The ammonium salts shown in JP-A-7-28247, European Patent 616,258, U.S. Pat. No. 5,525,443, JP-A-9-127700, European Patent 762,207, and U.S. Pat. No. 5,783,354 can be added to the compositions of the invention. Examples of the ammonium salts include tetramethylammonium hydroxide, tetra-n-butylammonium hydroxide, and betaines. Furthermore, the compounds coming to have reduced basicity upon exposure (photobases) described in JP-A-5-232706, JP-A-6-11835, JP-A-6-242606, JP-A-6-266100, JP-A-7-333851, JP-A-7-333844, U.S. Pat. No. 5,663,035, and European Patent 677,788 may be added.

[8-7] Photo-Base Generator

Examples of photo-base generators which can be added to the compositions of the invention include compounds shown in JP-A-4-151156, JP-A-4-162040, JP-A-5-197148, JP-A-5-5995, JP-A-6-194834, JP-A-8-146608, JP-A-10-83079, and European Patent 622,682. Specifically, preferred examples thereof include 2-nitrobenzyl carbamate, 2,5-dinitrobenzylcyclohexyl carbamate, N-cyclohexyl-4-methylphenylsulfonamide, and 1,1-dimethyl-2-phenylethyl N-isopropylcarbamate. These photo-base generators may be added for the purpose of improving resist pattern profiles, etc.

The resist compositions of the invention are applied to a substrate to form a thin film. The thickness of this coating film is preferably from 0.1 to 4.0 μm.

A commercial, inorganic or organic antireflection film can be used in the invention according to need. Furthermore, an antireflection film may be applied on the resist.

As an antireflection film to be formed as a layer underlying the resist can be used either of an inorganic film comprising titanium, titanium dioxide, titanium nitride, chromium oxide, carbon, amorphous silicon, or the like and an organic film comprising a light absorber and a polymeric material. Formation of the former film necessitates an apparatus such as a vacuum deposition apparatus, CVD apparatus, or sputtering apparatus. Examples of the organic antireflection film include: the film described in JP-B-7-69611 which comprises a diphenylamine derivative/formaldehyde-modified melamine resin condensate, an alkali-soluble resin, and a light absorber; the film described in U.S. Pat. No. 5,294,680 which comprises a product of the reaction of a maleic anhydride copolymer with a diamine type light absorber; the film described in JP-A-6-118631 which is formed from a composition comprising a resin binder and a methylolmelamine type thermal crosslinking agent; the antireflection film described in JP-A-6-118656 which comprises an acrylic resin having carboxyl groups, epoxy groups, and light-absorbing groups in the same molecule; the film described in JP-A-8-87115 which is formed from a composition comprising methylolmelamine and a benzophenone type light absorber; and the film described in JP-A-8-179509 which comprises a poly(vinyl alcohol) resin containing a low-molecular light absorber.

As the organic antireflection film can also be used commercial organic antireflection films such as DUV-30 Series and DUV-40 Series, manufactured by Brewer Science Inc., and AR-2, AR-3, and AR-5, manufactured by Cipray.

In the production of precision integrated-circuit elements or in similar processes, the step of resist pattern formation on a resist film can be conducted in the following manner. A resist composition of the invention is applied to a substrate (e.g., a silicon substrate coated with silicon dioxide, glass substrate, or metal substrate) either directly or through the antireflection film formed beforehand on the substrate. The resultant coating is irradiated with an excimer laser light or electron beams or irradiated using an X-ray drawing apparatus, and then subjected to heating, development, rinsing, and drying. Thus, a satisfactory resist pattern can be formed. Suitable as the exposure light source is an apparatus which emits electron beams, X-rays, or EUV ray.

As an alkaline developing solution for the resist compositions of the invention can be used an aqueous solution of an alkali such as an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide, tetraethylammonium hydroxide, or choline, or a cyclic amine, e.g., pyrrole or piperidine. It is also possible to use a developing solution prepared by adding an appropriate amount of an alcohol, e.g., isopropyl alcohol, or a surfactant, e.g., a nonionic one, to an aqueous solution of any of those alkalis.

Preferred of those alkaline developing solutions are aqueous solutions of quaternary ammonium salts. More preferred is an aqueous solution of tetramethylammonium hydroxide or choline.

The alkali concentration in the alkaline developing solution is generally from 0.1 to 20% by weight, preferably from 0.2 to 15% by weight, more preferably from 0.5 to 10% by weight.

The pH of the alkaline developing solution is generally from 10 to 15, preferably from 10.5 to 14.5, more preferably from 11 to 14.

EXAMPLES

The invention will be explained below in greater detail by reference to the following Examples, but the contents of the invention should not be construed as being limited to these Examples.

<Synthesis of Constituent Ingredients>

(1) Acid Generator (A1)

Synthesis Example 1 (Synthesis of Acid Generator (A-2)

To 200 mL of methylene chloride was added 17.6 g (80 mmol) of iodosylbenzene. This mixture was stirred. To the resultant suspension was added dropwise 14 mL (160 mmol) of trifluoromethanesulfonic acid. The resultant mixture was stirred for 3 hours. Furthermore, 6.24 g (80 mmol) of benzene was added dropwise thereto, and this mixture was stirred for 2 hours. The precipitate obtained was taken out by filtration, subsequently washed with ether, and dried. Thus, 1,4-bis[phenyl[(trifluoromethanesulfonyl)oxy]iodo]benzene was obtained.

A suspension of 31.6 g (40 mmol) of the 1,4-bis[phenyl[(trifluoromethanesulfonyl)oxy]iodo]benzene, 360 mg (2 mmol) of copper(II) acetate, and 54.4 mL (330 mmol) of diphenyl sulfide was prepared. This suspension was stirred at 200° C. for 30 minutes and then allowed to cool to room temperature. The solid matter was washed with ether and dried. Thus, an acid generator (A-2) was obtained.

Examples 1 to 23 and Comparative Examples 1 to 7

According to each of the formulations shown in Tables 1 to 4, the alkali-soluble resin (B), acid generator (A1), acid generator (A2), crosslinking agent (C), nitrogen-containing basic compound (D), and surfactant were dissolved in the solvent to prepare a solution. The solution obtained was precision-filtered through a membrane filter having an opening diameter of 0.1 $\mu$m. Thus, negative type resist solutions were obtained.

The negative type resist solutions each were applied to a 6-inch wafer with spin coater Mark 8, manufactured by Tokyo Electron Ltd. The coatings were dried on a hot plate at 110° C. for 90 seconds to obtain resist films having a thickness of 0.3 $\mu$m.

The resist films were irradiated using an electron-beam drawing apparatus (HL750, manufactured by Hitachi Ltd.; accelerating voltage 50 keV). After the irradiation, the resist films were heated on a hot plate at 110° C. for 90 seconds, immersed for 60 seconds in a 2.38% by weight aqueous solution of tetramethylammonium hydroxide (TMAH), subsequently rinsed with water for 30 seconds, and then dried. Each pattern obtained was evaluated for pattern profile, beam shape reproducibility, and resolution by the following methods. The results obtained are shown in Table 5.

<Pattern Profile>

The contour of a section of a 0.15 $\mu$m line pattern obtained with the minimum exposure energy necessary for the resolution of 0.15 $\mu$m (line:space=1:1) was examined with a scanning electron microscope (S-4300, manufactured by Hitachi Ltd.).

<Beam Shape Reproducibility>

In the pattern obtained (line width=0.20 $\mu$m), a part bent at 90° was examined from the wafer front side with the scanning electron microscope to determine the radius of curvature of that part.

<Resolution>

The threshold resolution at the minimum irradiation energy necessary for the resolution of a 0.15-$\mu$m line (line:space=1:1) (necessary for distinct resolution of lines and spaces) was taken as resolution. With respect to each of the patterns in which resolution of a 0.15-$\mu$m line (line:space=1:1) was not attained, the limit of resolution was taken as resolution.

TABLE 1

|  | (B) 0.70 g | (A1) | (A2) | (C) | (D) | Surfactant 0.001 g | Solvent 8.5 g |
|---|---|---|---|---|---|---|---|
| Example 1 | (27) Mw = 7500<br>x/y = 85/15<br>Mw/Mn = 1.7 | A-5<br>0.05 g | A2-1<br>0.01 g | MM-1<br>0.25 g | OE-1<br>0.002 g | W-1 | S-1<br>8.5 g |
| Example 2 | (1) Mw = 11000<br>Mw/Mn = 1.4 | A-5<br>0.03 g | PAG4-7<br>0.02 g | MM-1<br>0.25 g | OE-1<br>0.002 g | W-1 | S-1<br>7.5 g<br>S-2<br>1.5 g |
| Example 3 | (29) Mw = 9200<br>x/y = 80/20<br>Mw/Mn = 2.2 | A-3<br>0.02 g | PAG4-4<br>0.04 g | MM-1<br>0.25 g | OE-1<br>0.002 g | W-1 | S-1<br>8.5 g |
| Example 4 | (2) Mw = 6000<br>Mw/Mn = 1.12 | A-4<br>0.01 g | A2-25<br>0.01 g | MM-2<br>0.20 g | OE-2<br>0.001 g | W-1 | S-1<br>5.0 g<br>S-2<br>3.5 g |
| Example 5 | (93) Mw = 9000<br>x/y = 85/15<br>Mw/Mn = 1.12 | A-5<br>0.01 g | A2-15<br>0.04 g | MM-1<br>0.20 g | OE-3<br>0.002 g | W-1 | S-1<br>8.5 g |
| Example 6 | (94) Mw = 12000<br>x/y = 90/10<br>Mw/Mn = 2.0 | A-3<br>0.04 g | PAG4-5<br>0.01 g | MM-3<br>0.25 g | OE-3<br>0.002 g | W-2 | S-2<br>8.5 g |

TABLE 1-continued

| | (B) 0.70 g | (A1) | (A2) | (C) | (D) | Surfactant 0.001 g | Solvent 8.5 g |
|---|---|---|---|---|---|---|---|
| Example 7 | (96) Mw = 7000 x/y = 90/10 Mw/Mn = 2.2 | A-1 0.05 g | PAG4-4 0.01 g | MM-4 0.30 g | OE-1 0.002 g | W-2 | S-1 7.0 g S-2 1.5 g |
| Example 8 | (15) Mw = 12800 Mw/Mn = 1.8 | A-2 0.07 g | PAG4-4 0.02 g | MM-1 0.30 g | OE-1 0.002 g | W-1 | S-1 7.0 g S-2 1.5 g |
| Example 9 | (1) Mw = 15000 Mw/Mn = 1.4 | A-10 0.02 g | PAG4-7 0.02 g | MM-1 0.25 g | OE-2 0.002 g | — | S-1 7.0 g S-2 1.5 g |
| Example 10 | (2) Mw = 9000 Mw/Mn = 1.6 | A-9 0.04 g | PAG4-4 0.005 g | MM-1 0.25 g | OE-4 0.002 g | W-2 | S-1 7.0 g S-2 1.5 g |

TABLE 2

| | (B) 0.70 g | (A1) | (A2) | (C) | (C) | Surfactant 0.001 g | Solvent 8.5 g |
|---|---|---|---|---|---|---|---|
| Example 11 | (25) Mw = 7800 x/y = 80/20 Mw/Mn = 1.9 | A-13 0.01 g A-4 0.01 g | PAG4-4 0.03 g | CL-1 0.25 g | OE-4 0.002 g | W-1 | S-1 8.5 g |
| Example 12 | (31) Mw = 10500 x/y = 90/10 Mw/Mn = 1.7 | A-19 0.05 g | PAG4-4 0.03 g PAG4-5 0.01 g | MM-1 0.25 g | OE-4 0.003 g | W-1 | S-1 2.0 g S-2 6.5 g |
| Example 13 | (32) Mw = 7500 x/y = 95/5 Mw/Mn = 2.0 | A-19 0.07 g | PAG4-7 0.01 g | CL-1 0.25 g | OE-1 0.003 g | W-1 | S-1 7.0 g S-2 1.5 g |
| Example 14 | (33) Mw = 4500 x/y = 90/10 Mw/Mn = 1.6 | A-1 0.05 g | PAG4-7 0.01 g | CL-1 0.25 g | OE-2 0.002 g | W-2 | S-1 7.0 g S-2 1.5 g |
| Example 15 | (39) Mw = 8000 x/y = 85/15 Mw/Mn = 1.8 | A-15 0.04 g | PAG3-22 0.01 g | MM-4 0.30 g | OE-3 0.002 g | W-2 | S-1 7.0 g S-2 1.5 g |
| Example 16 | (28) Mw = 13500 x/y = 90/10 Mw/Mn = 1.5 | A-4 0.04 g | PAG3-18 0.01 g | MM-4 0.30 g | OE-1 0.002 g | W-2 | S-2 8.5 g |
| Example 17 | (60) Mw = 9500 x/y/z = 90/5/5 Mw/Mn = 2.0 | A-1 0.03 g | PAG4-5 0.02 g | MM-1 0.20 g | OE-3 0.002 g | W-1 | S-1 8.0 g S-2 0.5 g |
| Example 18 | (41) Mw = 6000 x/y = 85/15 Mw/Mn = 1.35 | A-2 0.10 g | PAG4-7 0.01 g | MM-3 0.25 g | OE-1 0.004 g | W-1 | S-1 7.0 g S-2 1.5 g |
| Example 19 | (93) Mw = 9000 x/y = 85/15 Mw/Mn = 1.6 | A-1 0.05 g | PAG4-40 0.02 g | MM-2 0.20 g | OE-2 0.003 g | W-2 | S-1 7.0 g S-2 1.5 g |

TABLE 3

| | (B) 0.70 g | (A1) | (A2) | (C) | (C) | Surfactant 0.001 g | Solvent 8.5 g |
|---|---|---|---|---|---|---|---|
| Example 20 | (93) Mw = 9000 x/y = 85/15 Mw/Mn = 1.6 | A-5 0.04 g | PAG4-5 0.002 g PAG4-38 0.001 g PAG4-39 0.0002 g | MM-2 0.20 g | OE-2 0.003 g | W-2 | S-1 7.0 g S-2 1.5 g |

TABLE 3-continued

|  | (B) 0.70 g | (A1) | (A2) | (C) | (C) | Surfactant 0.001 g | Solvent 8.5 g |
|---|---|---|---|---|---|---|---|
| Example 21 | (97) Mw = 6800 Mw/Mn = 2.2 | A-2 0.005 g | A2-25 0.05 g | MM-1 0.25 g | OE-1 0.002 g | W-2 | S-1 8.0 g S-2 0.5 g |
| Example 22 | (1) Mw = 1000 Mw/Mn = 1.2 | A-2 0.06 g | A2-33 0.005 g | MM-1 0.25 g | — | W-2 | S-1 7.0 g S-2 1.5 g |
| Example 23 | (95) Mw = 6500 x/y = 90/10 Mw/Mn = 1.9 | A-2 0.05 g | A2-1 0.01 g | MM-1 0.25 g | — | W-2 | S-1 7.0 g S-2 1.5 g |

TABLE 4

|  | (B) 0.70 g | (A1) | (A2) | (C) | (C) | Surfactant 0.001 g | Solvent 8.5 g |
|---|---|---|---|---|---|---|---|
| Comparative Example 1 | (29) Mw = 9200 x/y = 80/20 Mw/Mn = 2.2 | — | PAG4-5 0.002 g PAG4-26 0.040 g PAG4-38 0.001 g PAG4-39 0.0002 g | MM-1 0.25 g | OE-1 0.003 g | W-1 | S-1 8.5 g |
| Comparative Example 2 | (1) Mw = 15000 Mw/Mn = 1.4 | — | PAG4-5 0.002 g PAG4-26 0.040 g PAG4-38 0.001 g PAG4-39 0.0002 g | MM-1 0.25 g | — | W-1 | S-1 7.0 g S-2 1.5 g |
| Comparative Example 3 | (2) Mw = 9000 Mw/Mn = 1.6 | — | A2-33 0.040 g A2-25 0.010 g | CL-1 0.25 g | — | W-2 | S-1 7.0 g S-2 1.5 g |
| Comparative Example 4 | (1) Mw = 15000 Mw/Mn = 1.4 | — | A2-33 0.040 g A2-1 0.010 g | MM-1 0.25 g | — | — | S-1 7.0 g S-2 1.5 g |
| Comparative Example 5 | (25) Mw = 7800 x/y = 80/20 Mw/Mn = 1.9 | — | A2-33 0.010 g A2-1 0.040 g | CL-1 0.25 g | OE-4 0.002 g | W-1 | S-1 8.5 g |
| Comparative Example 6 | (95) Mw = 6500 x/y = 90/10 Mw/Mn = 1.9 | — | A2-33 0.040 g A2-1 0.010 g | MM-1 0.25 g | OE-2 0.002 g | W-2 | S-1 7.0 g S-2 1.5 g |
| Comparative Example 7 | (97) Mw = 6800 Mw/Mn = 2.2 | — | PAG4-5 0.002 g PAG4-26 0.040 g | MM-1 0.25 g | — | W-2 | S-1 8.0 g S-2 0.5 g |

The abbreviations in the Tables have the following meanings.

The structures of the crosslinking agents (C) are shown below.

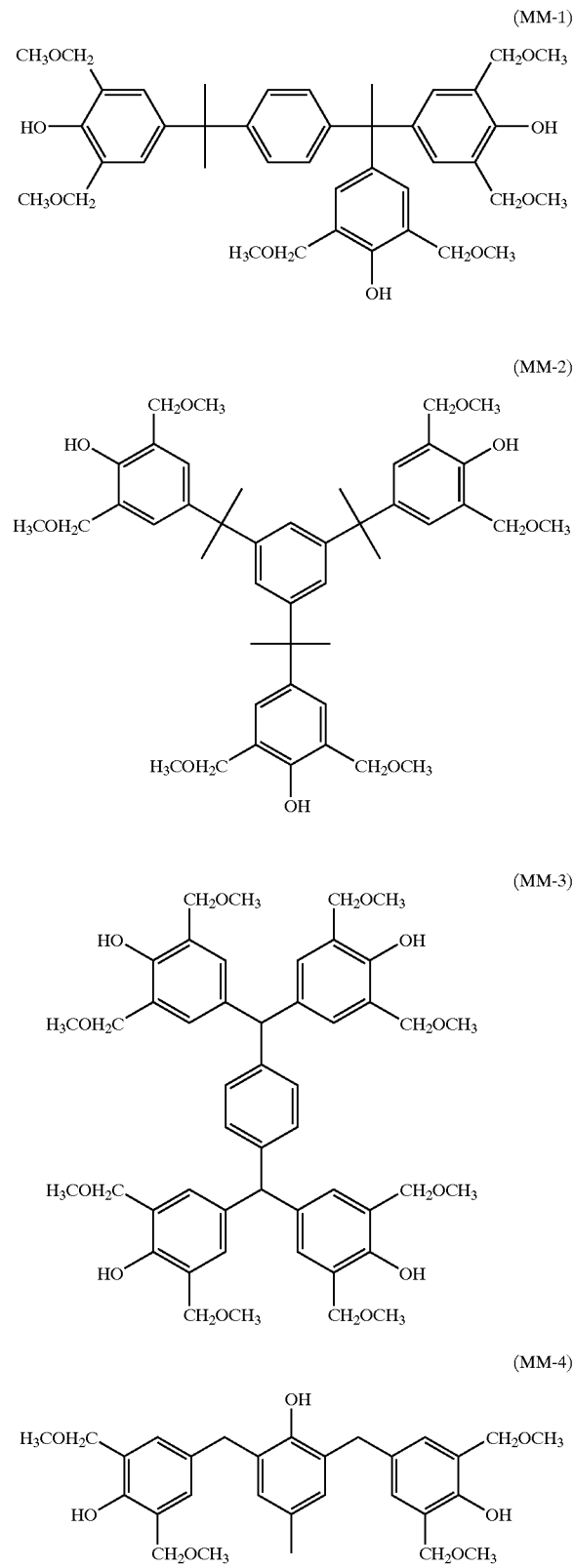

Crosslinking agent

CL-1:

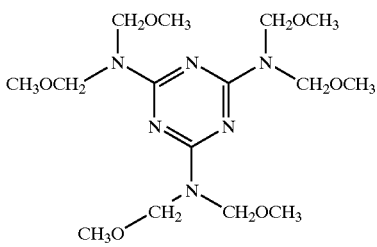

The nitrogen-containing basic compounds (all manufactured by Tokyo Kasei Co., Ltd.) are as follows.
OE-1: 1,5-diazabicyclo[4.3.0]non-5-ene
OE-2: 2,4,5-triphenylimidazole
OE-3: 4-dimethylaminopyridine
OE-4: tri-n-butylamine The surfactants are as follows.
W-1: Megafac F176 (manufactured by Dainippon Ink & Chemicals, Inc.)
W-2: Siloxane polymer KP341 (manufactured by Shin-Etsu Chemical Co., Ltd.)

The solvents are as follows.
S-1: Propylene glycol monomethyl ether acetate
S-2: Propylene glycol monomethyl ether

TABLE 5

| (Line:space = 1:1) Pattern profile | | Beam shape reproducibility ($\mu$m) | Resolution ($\mu$m) |
|---|---|---|---|
| Example 1 | rectangular | 0.06 | 0.085 |
| Example 2 | rectangular | 0.04 | 0.085 |
| Example 3 | rectangular | 0.04 | 0.080 |
| Example 4 | rectangular | 0.07 | 0.075 |
| Example 5 | rectangular | 0.07 | 0.085 |
| Example 6 | rectangular | 0.06 | 0.075 |
| Example 7 | rectangular | 0.09 | 0.080 |
| Example 8 | rectangular | 0.09 | 0.080 |
| Example 9 | rectangular | 0.08 | 0.075 |
| Example 10 | rectangular | 0.09 | 0.080 |
| Example 11 | rectangular | 0.08 | 0.080 |
| Example 12 | rectangular | 0.09 | 0.080 |
| Example 13 | rectangular | 0.09 | 0.075 |
| Example 14 | rectangular | 0.09 | 0.075 |
| Example 15 | rectangular | 0.09 | 0.075 |
| Example 16 | rectangular | 0.06 | 0.075 |
| Example 17 | rectangular | 0.11 | 0.080 |
| Example 18 | rectangular | 0.09 | 0.075 |
| Example 19 | rectangular | 0.09 | 0.075 |
| Example 20 | rectangular | 0.07 | 0.085 |
| Example 21 | rectangular | 0.11 | 0.080 |
| Example 22 | slight round top | 0.11 | 0.095 |
| Example 23 | slight round top | 0.11 | 0.095 |
| Comparative Example 1 | round top | 0.25 | 0.105 |
| Comparative Example 2 | round top + tail | 0.32 | 0.120 |
| Comparative Example 3 | round top + tail | 0.35 | 0.125 |
| Comparative Example 4 | round top + tail | 0.36 | 0.120 |
| Comparative Example 5 | round top | 0.26 | 0.110 |
| Comparative Example 6 | round top | 0.26 | 0.105 |
| Comparative Example 7 | round top + tail | 0.34 | 0.105 |

Table 5 shows that the negative type resist compositions of the invention were excellent in pattern profile, beam shape reproducibility, and resolution.

Examples 24 to 37 and Comparative Examples 8 to 13

According to each of the formulations shown in Tables 6 to 8, the acid-decomposable resin (E), acid generator (A1), acid generator (A2), nitrogen-containing basic compound (D), and surfactant were dissolved in the solvent to prepare a solution. The solution obtained was precision-filtered through a membrane filter having an opening diameter of 0.1 μm. Thus, positive type resist solutions were obtained.

The positive type resist solutions obtained were used to form resist films in the same manner as in Example 1. The resist films were evaluated for pattern profile, beam shape reproducibility, and resolution. The results obtained are shown in Table 9.

TABLE 6

|  | (E) 0.70 g | (A1) | (A2) | (D) | Surfactant 0.001 g | Solvent 8.5 g |
|---|---|---|---|---|---|---|
| Example 24 | R-23 Mw = 8000<br>x/y/z = 10/70/20<br>Mw/Mn = 1.21 | A-1<br>0.05 g | PAG4-4<br>0.01 g | OE-1<br>0.002 g | W-1 | S-1 8.5 g |
| Example 25 | R-24 Mw = 9000<br>x/y/z = 70/25/5<br>Mw/Mn = 1.51 | A-5<br>0.05 g | PAG4-7<br>0.02 g | OE-1<br>0.002 g | W-1 | S-1 7.5 g<br>S-2 1.5 g |
| Example 26 | R-17 Mw = 8000<br>x/y/z = 10/70/20<br>Mw/Mn = 2.05 | A-5<br>0.03 g | A2-1<br>0.04 g | OE-1<br>0.002 g | W-1 | S-1 8.5 g |
| Example 27 | R-13 Mw = 6000<br>x/y = 75/25<br>Mw/Mn = 1.10 | A-3<br>0.02 g | A2-25<br>0.01 g | OE-4<br>0.001 g | W-1 | S-1 5.0 g<br>S-2 3.5 g |
| Example 28 | R-2 Mw = 9000<br>x/y = 75/25<br>Mw/Mn = 1.23 | A-4<br>0.01 g | A2-15<br>0.04 g | OE-3<br>0.002 g | — | S-1 8.5 g |
| Example 29 | R-8 Mw = 12000<br>x/y/z = 70/20/10<br>Mw/Mn = 1.13 | A-5<br>0.01 g | PAG4-5<br>0.01 g | OE-3<br>0.001 g | W-2 | S-2 8.5 g |
| Example 30 | R-20 Mw = 7000<br>x/y = 85/15<br>Mw/Mn = 2.2 | A-3<br>0.04 g | PAG4-4<br>0.01 g | OE-1<br>0.002 g | W-2 | S-1 7.0 g<br>S-2 1.5 g |
| Example 31 | R-21 Mw = 7000<br>x/y = 75/25<br>Mw/Mn = 1.13 | A-1<br>0.05 g | PAG4-4<br>0.02 g | OE-1<br>0.002 g | W-2 | S-1 7.0 g<br>S-2 1.5 g |
| Example 32 | R-22 Mw = 4000<br>x/y = 70/30<br>Mw/Mn = 2.50 | A-2<br>0.07 g | PAG3-22<br>0.01 g | OE-2<br>0.003 g | W-1 | S-1 8.5 g |
| Example 33 | R-14 Mw = 5000<br>x/y = 75/25<br>Mw/Mn = 1.15 | A-10<br>0.02 g | PAG3-18<br>0.01 g | OE-1<br>0.001 g | W-2 | S-1 8.5 g |

TABLE 7

|  | (E) 0.70 g | (A1) | (A2) | (D) | Surfactant 0.001 g | Solvent 8.5 g |
|---|---|---|---|---|---|---|
| Example 34 | R-14 Mw = 2500<br>x/y = 59/41<br>Mw/Mn = 1.15 | A-9<br>0.04 g | PAG4-4<br>0.03 g | OE-1<br>0.002 g | W-2 | S-1 8.5 g |
| Example 35 | R-17 Mw = 5000<br>x/y/z = 10/70/20<br>Mw/Mn = 1.25 | A-13<br>0.01 g<br>A-4<br>0.01 g | PAG4-4<br>0.03 g<br>PAG4-5<br>0.01 g | OE-1<br>0.002 g | W-1 | S-1 8.5 g |
| Example 36 | R-14 Mw = 11000<br>x/y = 91/9<br>Mw/Mn = 1.30 | A-19<br>0.05 g | PAG4-7<br>0.01 g | OE-1<br>0.002 g | W-2 | S-1 8.5 g |
| Example 37 | R-22 Mw = 8000<br>x/y = 86/14<br>Mw/Mn = 2.1 | A-5<br>0.04 g | PAG4-5<br>0.002 g<br>PAG4-38<br>0.001 g<br>PAG4-39<br>0.0002 g | — | W-1 | S-1 8.5 g |

TABLE 8

| | (E) 0.70 g | (A1) | (A2) | (D) | Surfactant 0.001 g | Solvent 8.5 g |
|---|---|---|---|---|---|---|
| Comparative Example 8 | R-23 Mw = 8000 x/y/z = 10/70/20 Mw/Mn = 1.21 | — | PAG4-5 0.002 g PAG4-26 0.040 g PAG4-38 0.001 g PAG4-39 0.0002 g | OE-1 0.002 g | W-1 | S-1 8.5 g |
| Comparative Example 9 | R-22 Mw = 8000 x/y = 86/14 Mw/Mn = 2.1 | — | PAG4-5 0.002 g PAG4-26 0.040 g PAG4-38 0.001 g PAG4-39 0.0002 g | — | W-1 | S-1 8.5 g |
| Comparative Example 10 | R-22 Mw = 8000 x/y = 86/14 Mw/Mn = 2.1 | — | A2-33 0.040 g A2-25 0.010 g | OE-1 0.002 g | W-2 | S-1 8.5 g |
| Comparative Example 11 | R-23 Mw = 8000 x/y/z = 10/70/20 Mw/Mn = 1.21 | — | A2-33 0.040 g A2-1 0.010 g | — | W-1 | S-1 8.5 g |
| Comparative Example 12 | R-23 Mw = 8000 x/y/z = 10/70/20 Mw/Mn = 1.21 | — | A2-33 0.010 g A2-1 0.040 g | OE-1 0.002 g | W-1 | S-1 8.5 g |
| Comparative Example 13 | R-23 Mw = 8000 x/y/z = 10/70/20 Mw/Mn = 1.21 | — | PAG4-5 0.002 g PAG4-26 0.040 g | — | W-1 | S-1 8.5 g |

TABLE 9

| | (Line:space = 1:1) Pattern profile | Beam type reproductibility ($\mu$m) | Resolution ($\mu$m) |
|---|---|---|---|
| Example 24 | rectangular | 0.08 | 0.080 |
| Example 25 | rectangular | 0.04 | 0.085 |
| Example 26 | rectangular | 0.07 | 0.075 |
| Example 27 | slight reversed taper | 0.07 | 0.070 |
| Example 28 | slight reversed taper | 0.08 | 0.070 |
| Example 29 | rectangular | 0.08 | 0.085 |
| Example 30 | rectangular | 0.05 | 0.080 |
| Example 31 | rectangular | 0.08 | 0.075 |
| Example 32 | slight reversed taper | 0.09 | 0.070 |
| Example 33 | rectangular | 0.11 | 0.070 |
| Example 34 | rectangular | 0.08 | 0.075 |
| Example 35 | slight reversed taper | 0.09 | 0.070 |
| Example 36 | slight reversed taper | 0.09 | 0.070 |
| Example 37 | slight tail | 0.06 | 0.095 |
| Comparative Example 8 | reversed taper | 0.26 | 0.095 |
| Comparative Example 9 | reversed taper + tail | 0.35 | 0.120 |
| Comparative Example 10 | reversed taper | 0.25 | 0.095 |
| Comparative Example 11 | reversed taper + tail | 0.36 | 0.120 |
| Comparative Example 12 | reversed taper | 0.26 | 0.095 |
| Comparative Example 13 | reversed taper + tail | 0.27 | 0.125 |

Table 9 shows that the positive type resist compositions of the invention were excellent in pattern profile, beam shape reproducibility, and resolution.

In the Examples given above, electron beams were used as an exposure light. However, the resist compositions of the invention are expected to produce the same effects when irradiated with EUV ray.

The invention can provide resist compositions which are excellent in pattern profile, beam shape reproducibility, and resolution when used for pattern formation through irradiation with actinic rays or a radiation, in particular, electron beams, X-rays, or EUV ray.

What is claimed is:

1. A negative type resist composition comprising:
   (A1) a compound generating a sulfonic acid upon irradiation with actinic rays or a radiation and having a partial structure represented by the following formula (1) and a counter anion,
   (A2) a compound generating a sulfonic acid upon irradiation with actinic rays or a radiation and having a partial structure represented by the following formula (I), (II), or (III) and a counter anion,
   (B) an alkali-soluble resin, and
   (C) a crosslinking agent capable of carrying out an addition reaction with the alkali-soluble resin which is the component (B) by the action of an acid,
   wherein the counter anion in the component (A1) differs from the counter anion in the component (A2):

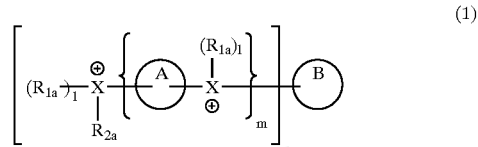
(1)

wherein X represents a sulfur atom or an iodine atom, provided that the X's may be the same or different, $R_{1a}$ and $R_{2a}$ each independently represents an alkyl group or an aryl group, provided that when two or more $R_{1a}$'s are present, they may be the same or different, that when two or more $R_{2a}$'s are present, they may be the same or different, $R_{1a}$ and $R_{2a}$, $R_{1a}$ and A, $R_{1a}$ and B, $R_{2a}$ and A, or $R_{2a}$ and B may be bonded to each other to form a ring, A and B each independently represents a hydrocarbon structure connecting $X^+$'s, provided that at least one pair of $X^+$'s connected by A or B has a structure in which the X's connected are present in the same conjugated system, and that when two or more A's are present, they may be the same or different, l represents 0 or 1, provided that when X is a sulfur atom, l represents 1, and that when X is an iodine atom, l represents 0, m represents an integer of 0 to 10 and n represents an integer of 1 to 6, provided that when m is 0, n represents an integer of 2 or larger:

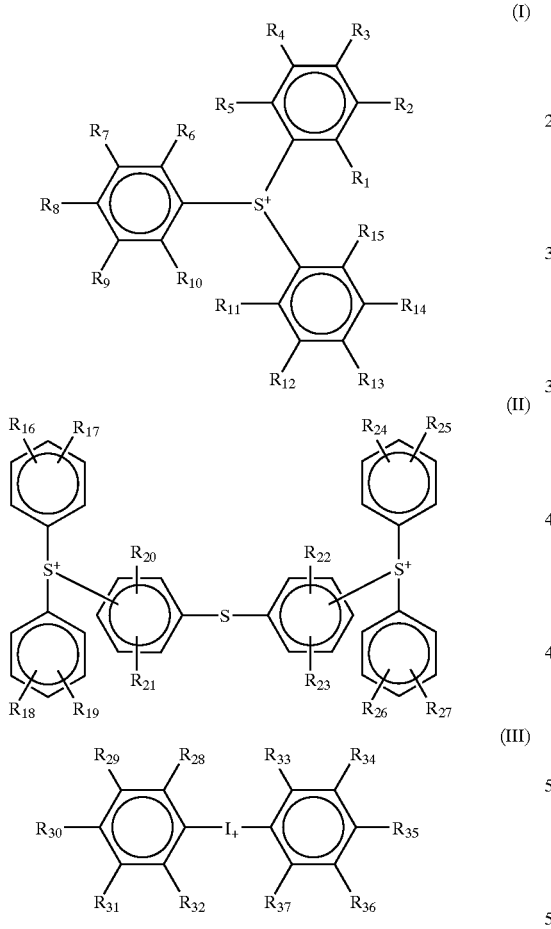

wherein $R_1$ to $R_{37}$ each independently represents a hydrogen atom, an alkyl group, an alkoxy group, a hydroxyl group, a halogen atom, or an —S—$R_{38}$ group, wherein $R_{38}$ represents an alkyl group or an aryl group, provided that two or more of $R_1$ to $R_{15}$, two or more of $R_{16}$ to $R_{27}$, or two or more of $R_{28}$ to $R_{37}$ may be bonded to each other to form a ring containing one or more members selected from a single bond, a carbon atom, an oxygen atom, a sulfur atom, and a nitrogen atom.

2. The composition according to claim 1, further comprising (D) a nitrogen-containing basic compound.

3. The composition according to claim 1, wherein the counter anion in the component (A1) has a benzene ring.

4. The composition according to claim 1, wherein the counter anion in the component (A2) has a fluorine atom.

5. The composition according to claim 1, wherein the hydrocarbon structure connecting $X^+$'s which is represented by A or B preferably is a hydrocarbon structure having 4 to 16 carbon atoms and having conjugated bonds comprising single bonds and double or triple bonds.

6. The composition according to claim 5, wherein the hydrocarbon structure has an oxygen atom or sulfur atom.

7. The composition according to claim 1, wherein the molar proportion of the component (A1) to the component (A2), (A1)/(A2), is from 98/2 to 1/99.

8. The composition according to claim 1, further comprising a fluorine-based and/or silicon-based surfactant.

9. The composition according to claim 1, wherein the actinic rays or radiation is electron beams, X-rays, or EUV ray.

10. A method for forming a pattern, which comprises forming a resist film comprising the composition described in claim 1, exposing the resist film upon irradiation with the actinic rays or a radiation, and subsequently developing the resist film.

11. A positive type resist composition comprising:
(A1) a compound generating a sulfonic acid upon irradiation with actinic rays or a radiation and having a partial structure represented by the following formula (1) and a counter anion,
(A2) a compound generating a sulfonic acid upon irradiation with actinic rays or a radiation and having a partial structure represented by the following formula (I), (II), or (III) and a counter anion, and
(E) a resin increasing the solubility in an alkaline developing solution by the action of an acid,
wherein the counter anion in the component (A1) differs from the counter anion in the component (A2):

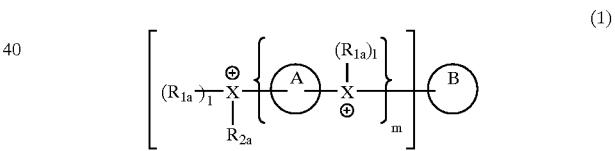

wherein X represents a sulfur atom or an iodine atom, provided that the X's may be the same or different, $R_{1a}$ and $R_{2a}$ each independently represents an alkyl group or an aryl group, provided that when two or more $R_{1a}$'s are present, they may be the same or different, that when two or more $R_{2a}$'s are present, they may be the same or different, $R_{1a}$ and $R_{2a}$, $R_{1a}$ and A, $R_{1a}$ and B, $R_{2a}$ and A, or $R_{2a}$ and B may be bonded to each other to form a ring, A and B each independently represents a hydrocarbon structure connecting $X^+$'s, provided that at least one pair of $X^+$'s connected by A or B has a structure in which the X's connected are present in the same conjugated system, and that when two or more A's are present, they may be the same or different, l represents 0 or 1, provided that when X is a sulfur atom, l represents 1, and that when X is an iodine atom, l represents 0, m represents an integer of 0 to 10 and n represents an integer of 1 to 6, provided that when m is 0, n represents an integer of 2 or larger:

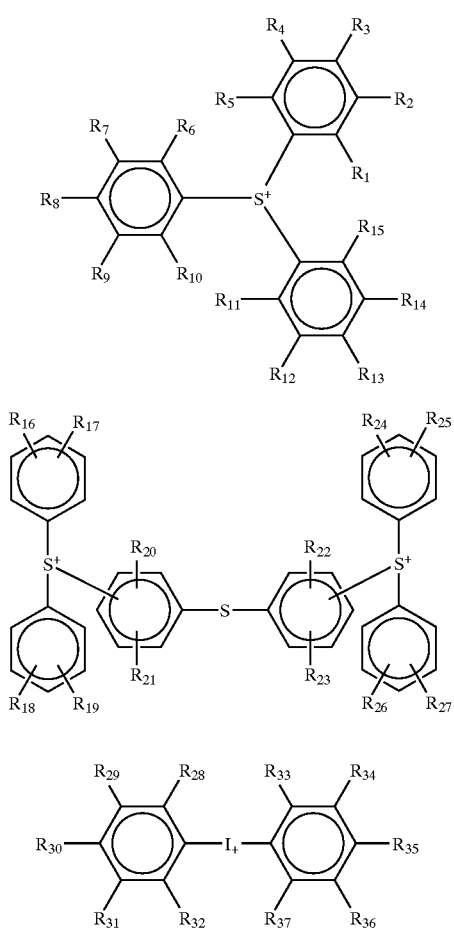

(I)
(II)
(III)

wherein $R_1$ to $R_{37}$ each independently represents a hydrogen atom, an alkyl group, an alkoxy group, a hydroxyl group, a halogen atom, or an —S—$R_{38}$ group, wherein $R_{38}$ represents an alkyl group or an aryl group, provided that two or more of $R_1$ to $R_{15}$, two or more of $R_{16}$ to $R_{27}$, or two or more of $R_{28}$ to $R_{37}$ may be bonded to each other to form a ring containing one or more members selected from a single bond, a carbon atom, an oxygen atom, a sulfur atom, and a nitrogen atom.

12. The composition according to claim 11, further comprising a nitrogen-containing basic compound.

13. The composition according to claim 11, wherein the counter anion in the component (A1) has a benzene ring.

14. The composition according to claim 11, wherein the counter anion in the component (A2) has a fluorine atom.

15. The composition according to claim 11, wherein the hydrocarbon structure connecting $X^+$'s which is represented by A or B preferably is a hydrocarbon structure having 4 to 16 carbon atoms and having conjugated bonds comprising single bonds and double or triple bonds.

16. The composition according to claim 15, wherein the hydrocarbon structure has an oxygen atom or sulfur atom.

17. The composition according to claim 11, wherein the molar proportion of the component (A1) to the component (A2), (A1)/(A2), is from 98/2 to 1/99.

18. The composition according to claim 11, further comprising a fluorine-based and/or silicon-based surfactant.

19. The composition according to claim 11, wherein the actinic rays or radiation is electron beams, X-rays, or EUV ray.

20. A method for forming a pattern, which comprises forming a resist film comprising the composition described in claim 11, exposing the resist film upon irradiation with the actinic rays or a radiation, and subsequently developing the resist film.

* * * * *